US008319166B2

(12) United States Patent
Kawahito

(10) Patent No.: US 8,319,166 B2
(45) Date of Patent: Nov. 27, 2012

(54) SOLID-STATE IMAGE PICK-UP DEVICE AND PIXEL SIGNAL READOUT METHOD HAVING DUAL POTENTIAL WELL, DUAL TRANSFER GATE ELECTRODE AND DUAL FLOATING-DIFFUSION REGION FOR SEPARATELY TRANSFERRING AND STORING CHARGES RESPECTIVELY

(75) Inventor: Shoji Kawahito, Hamamatsu (JP)

(73) Assignee: National University Corporation Shizuoka University (JP)

(*) Notice: Subject to any disclaimer, the term of this patent is extended or adjusted under 35 U.S.C. 154(b) by 538 days.

(21) Appl. No.: 12/161,300

(22) PCT Filed: Jan. 18, 2007

(86) PCT No.: PCT/JP2007/050698
§ 371 (c)(1),
(2), (4) Date: Apr. 8, 2010

(87) PCT Pub. No.: WO2007/083704
PCT Pub. Date: Jul. 26, 2007

(65) Prior Publication Data
US 2010/0187401 A1 Jul. 29, 2010

(30) Foreign Application Priority Data
Jan. 18, 2006 (JP) .............................. P2006-010128

(51) Int. Cl.
H01L 27/00 (2006.01)
(52) U.S. Cl. .................. 250/208.1; 250/214 R
(58) Field of Classification Search ............... 250/208.1, 250/214 R; 257/290–294, 440
See application file for complete search history.

(56) References Cited

U.S. PATENT DOCUMENTS
4,331,889 A * 5/1982 Parrish .......................... 327/515
(Continued)

FOREIGN PATENT DOCUMENTS
JP 1-102971 4/1989
(Continued)

OTHER PUBLICATIONS
Japanese Office Action issued Oct. 5, 2010 in connection with corresponding Japanese Patent Application No. P2007-554948.
(Continued)

Primary Examiner — Que T Le
(74) Attorney, Agent, or Firm — Ostrolenk Faber LLP

(57) ABSTRACT

A solid-state image pick-up device and a method of reading out a pixel signal thereof are provided, and the solid-state image pick-up device provides a large dynamic range without an increase in the area of a pixel. Plural pixels are arranged therein. Each pixel includes a first potential well PW1 for storing charges generated by light; a charge-distributing-potential barrier CDB adjacent to the first potential well PW1; a second potential well PW2 opposite to the first potential well PW1 with respect to the charge-distributing-potential barrier, the second potential well PW2 storing charges generated by light of an identical intensity, the charges stored in the second potential well PW2 being less than the charges stored in the first potential well PW1; first and second transfer gate electrodes 31 and 32 for transferring the charges stored in the first and second potential wells PW1 and PW2, respectively; and first and second floating-diffusion regions 26 and 27 for separately storing the charges transferred by the first and second transfer gate electrodes 31 and 32, respectively.

24 Claims, 31 Drawing Sheets

U.S. PATENT DOCUMENTS

2006/0192938 A1    8/2006  Kawahito

FOREIGN PATENT DOCUMENTS

| JP | 2-94665 | 4/1990 |
|---|---|---|
| JP | 4-117281 | 4/1992 |
| JP | 8-256293 | 10/1996 |
| JP | H8-256293 | 10/1996 |
| JP | H9-46596 | 2/1997 |
| JP | 9-181976 | 7/1997 |
| JP | 2004-56048 | 2/2004 |
| JP | 2004-056048 | 2/2004 |
| JP | 2004-294420 | 10/2004 |
| JP | 2004-335802 | 11/2004 |
| JP | 2004-335803 | 11/2004 |
| JP | 2004-363666 | 12/2004 |
| JP | 2005-12007 | 1/2005 |
| JP | 2005-012007 | 1/2005 |
| JP | 2005-86082 | 3/2005 |
| JP | 2005-159067 | 6/2005 |
| JP | 2005-164363 | 6/2005 |
| JP | 2006-217410 | 8/2006 |

OTHER PUBLICATIONS

Japanese Office Action issued Jun. 22, 2010 in connection with corresponding Japanese Application No. P2007-554948.

International Search Report, Feb. 20, 2007.

"A 100 dB dynamic range CMOS image sensor using a lateral overflow integration capacitor", Shigetoshi Sugawa et al., Dig. Tech Papers, ISSCC, 2005, p. 352-353.

International Preliminary Report on Patentability issued Sep. 18, 2008.

* cited by examiner

SOLID-STATE IMAGE PICK-UP DEVICE AND PIXEL SIGNAL READOUT METHOD HAVING DUAL POTENTIAL WELL, DUAL TRANSFER GATE ELECTRODE AND DUAL FLOATING-DIFFUSION REGION FOR SEPARATELY TRANSFERRING AND STORING CHARGES RESPECTIVELY

CROSS-REFERENCE TO RELATED APPLICATION

The present application is a 35 U.S.C. §371 national phase conversion of PCT/JP2007/050698 filed Jan. 18, 2007 and claims priority of JP2006-010128 filed Jan. 18, 2008, both incorporated herein in their entirety.

TECHNICAL FIELD

The present invention relates to a solid-state image pick-up device having a large dynamic range and a method of reading out a pixel signal thereof.

BACKGROUND ART

One of related arts to the present invention is Patent Document 1, which proposes a method of enlarging a dynamic range of an output signal in response to the quantity of incident light in the array of pixels each including high-sensitive and low-sensitive photoelectric conversion elements. In this method, these photoelectric conversion elements are exposed through a single microlens to light to read out signals from these elements and to combine them.

Nonpatent Document 1 also proposes a method of enlarging a dynamic range using a photodiode, which has a capacitor for storing charges overflowing therefrom, by combining signals from charges stored in the capacitor.

Furthermore, Patent Document 2 proposes a method of storing a part of electric charges overflowing over a potential barrier. Patent Document 3 also describes a solid-state image pick-up device. In the solid-state image pick-up device, a light signal from an image pick-up area is converted using first and second photosensitive pixels to signal charges. These signal charges are read out into a vertical CCD and is transferred thereby, and then the transferred charges are further transferred using a horizontal CCD. The sensitivity characteristics of the first and second photosensitive pixels are different from each other. The signal charges of the first and second photosensitive pixels are read out at the same time.

Furthermore, there are many other methods which enlarge the dynamic range of the output signal in response to the quantity of incident light. A representative method among them combines plural signals generated in different exposure times. Since generating these signals in the two exposure times needs different processing in different timing, thereby distorting a moving object in an image from the signals.

[Patent Document 1] Japanese Unexamined Patent Application Publication No. 2004-335803
[Patent Document 2] Japanese Unexamined Patent Application Publication No. 2005-86082
[Patent Document 3] Japanese Unexamined Patent Application Publication No. 3-117281
[Nonpatent Document 1] Shigetoshi Sugawa et al., "A 100 dB dynamic range CMOS image sensor using a lateral overflow integration capacitor", Dig. Tech. Papers, ISSCC, 2005, p. 352-353

DISCLOSURE OF THE INVENTION

Problems to be Solved by the Invention

Since the method described in Patent Document 1 needs a isolation area of a given width between the two photoelectric conversion elements, a light receiving area of the high-sensitive photoelectric conversion element is made relatively small as compared to that of the low-sensitive photoelectric conversion element. In addition, since charges generated from incident light always flow into a floating-diffusion region in signal readout, a reset level is changed in receiving a large amount of light to cause black inversion readily.

The method described in Nonpatent Document 1 uses a high capacitance for storing overflowing charges through the floating-diffusion region to read out them. Since the overflowing charges pass through the floating-diffusion region, they are affected by a dark current or reset noise. In addition, since the charges generated from incident light always flow into the floating-diffusion region in the signal read out as in Patent Document 1. When receiving a large amount of light, the reset level is changed to cause black inversion readily.

In the method described in Patent Document 2, variation in the potential barrier for discarding charges and the potential barrier for storing overflowing charges leads to low image quality.

In the method described in Patent Document 3, two photodiodes receive light beams incident on different positions through two microlenses, respectively, which causes a problem of spatial displacement of the above photodiodes that generate two signals.

It is an object of the present invention to provide a solid-state image pick-up device capable of increasing an enlargement factor of a dynamic range of an output signal to the quantity of incident light without increase in the area of a pixel, and a method of reading a pixel signal therefrom.

Means for Solving the Problem

In order to achieve the above-described object, one first aspect of the present invention is a solid-state image pick-up device in which a plurality of pixels are arranged, each pixel comprise: (a) a first potential well for storing charges generated by light; (b) a charge-distributing-potential barrier adjacent to the first potential well; (c) a second potential well for storing charges generated by light of an intensity equal to that of the light generating the charges stored in the first potential well, quantity of the charges stored in the second potential well being less than those stored in the first potential well, the charge-distributing-potential barrier being provided between the second potential well and the first potential well; (d) first and second transfer gate electrodes for separately transferring the charges stored in the first and second potential wells at different timings, respectively; and (e) first and second floating-diffusion regions for separately storing the charges transferred by the first and second transfer gate electrodes, respectively.

In the present invention, the pixel may further include a photodiode, and the photodiode generates charges in response to light. The charges in the first and second potential well are generated by the photodiode. In the present invention, this photodiode may also include the charge-distributing-potential barrier. In the present invention, pixel signals generated by charges stored in the second floating-diffusion region are read out multiple times in one frame period.

In the present invention, pixel signals generated by charges stored in the first and second floating-diffusion regions are read out at different readout timings.

In the present invention, the charge-distributing-potential barrier is provided by a potential distribution in a first surface-embedded region embedded in an upper part of a semiconductor region of a first conductivity type, and the first surface-embedded region has a second conductivity type different from the first conductivity type. The first potential well is provided by a potential distribution in a second surface-embedded region of the second conductivity type, the second surface-embedded region is adjacent to the first surface-embedded region, the second surface-embedded region is embedded in the upper part of the semiconductor region of the first conductivity type, and the second surface-embedded region has a higher impurity density than the first surface-embedded region. The second potential well is provided by a potential distribution in a third surface-embedded region of the second conductivity type, the third surface-embedded region is adjacent to the first surface-embedded region. The first surface-embedded region is provided between the third surface-embedded region and the second surface-embedded region, the third surface-embedded region is embedded in the upper part of the semiconductor region of the first conductivity type, and the third surface-embedded region has a higher impurity density than the first surface-embedded region.

The present invention may further include a light-shielding layer, and the light-shielding layer introduces incident light to only the first surface-embedded region. Charges from the first surface-embedded region to the third surface-embedded region passes through a first flow-in path having a first cross-sectional area, and charges from the first surface-embedded region to the second surface-embedded region passes through a second flow-in path having a second cross-sectional area. The first cross-sectional area is made smaller than the second cross-sectional area such that quantity of charges stored in the second potential well is smaller than that in the first potential well.

In addition, the present invention may further comprises a light-shielding layer, and the light-shielding layer prevents light from being incident on the third surface-embedded region, and the light-shielding layer introduces incident light to the first and second surface-embedded regions. The light-shielding layer defines quantity of the incident light such that the quantity of charges stored in the second potential well is made smaller than that in the first potential well.

In addition, the present invention may further include a first charge flow-in control gate. The first charge flow-in control gate electrostatically controls a potential of the charge-distributing-potential barrier to the second potential well through a gate-insulating layer, and a voltage applied to the first charge flow-in control gate is controlled such that quantity of charges stored in the second potential well is smaller than that in the first potential well. The present invention may further comprise a second charge flow-in control gate for electrostatically controlling a potential of the charge-distributing-potential barrier to the first potential well through the gate-insulating layer.

In the present invention, a potential of the charge-distributing-potential barrier to the second potential well is controlled such that charges flow into the second potential well multiple times in one frame period.

The present invention may further include a light-shielding layer which introduces light to only the first surface-embedded region, and a first charge flow-in control gate for electrostatically controlling a potential of the charge-distributing-potential barrier to the second potential well through the gate-insulating layer. Charges from the first surface-embedded region to the second surface-embedded region passes through a first flow-in path having a first cross-sectional area, and charges from the first surface-embedded region to the third surface-embedded region passes through a second flow-in path having a second cross-sectional area. The first cross-sectional area is made smaller than the second cross-sectional area such that quantity of charges stored in the second potential well is smaller than that in the first potential well.

In the present invention, the first potential well is provided by a potential distribution in the first surface-embedded region of the second conductivity type embedded in an upper part of the semiconductor region of the first conductivity type. The second potential well is provided by a potential distribution in the second surface-embedded region of the second conductivity type, the second surface-embedded region is embedded in the upper part of the semiconductor region of the first conductivity type, and the second surface-embedded region is away from the first surface-embedded region. The charge-distributing-potential barrier is provided by a potential distribution in the upper part of the semiconductor region of the first conductivity type between the first and second surface-embedded regions. The device may further comprises a light-shielding layer, and the light-shielding layer has an opening provided such that a first quantity of light incident on the first surface-embedded region is larger than a second quantity of light on the second surface-embedded region. A difference between the first and second quantities is adjusted such that quantity of charges stored in the second potential well is smaller than that in the first potential well.

In the present invention, the first potential well is provided by a potential distribution in the first surface-embedded region of the second conductivity type embedded in an upper part of the semiconductor region of the first conductivity type. The second potential well is defined by a potential distribution in the second surface-embedded region of the second conductivity type, and the second surface-embedded region is in contact with the upper part of the first surface-embedded region and is embedded in the upper part of the semiconductor region of the first conductivity type. The charge-distributing-potential barrier is provided by a potential distribution in a connection region between the first and second surface-embedded regions in the upper part of the semiconductor region of the first conductivity type. The device further comprises a light-shielding layer, and the light-shielding layer introduces light to only the first surface-embedded region. Charges overflow from the first surface-embedded region to the second surface-embedded region to flow into the second potential well, and the overflowing charges are stored in the second potential well.

In the present invention, the plural pixels are arranged in a two-dimensional matrix to form a pixel array. The device further comprises a column processing circuit provided around the pixel array. The column processing circuit further includes a single comparator, the single comparator is provided for each column of the matrix, and the comparator selectively reads charges stored in either the first or second floating-diffusion region.

In the present invention, the plural pixels is arranged in a two-dimensional matrix, and the two-dimensional matrix includes upper and lower pixel rows adjacent to each other vertically. The first floating-diffusion regions of the upper and lower pixel rows are common electrically, and the second floating-diffusion regions of the upper and lower pixel rows are common electrically.

In the present invention, the plural pixels is arranged in a two-dimensional matrix and the two-dimensional matrix includes left and right pixel columns adjacent to each other horizontally, and the first floating-diffusion region of the right pixel column and the second floating-diffusion region of the left pixel column are common electrically.

Another aspect in accordance with the present invention is a method for reading a pixel signal from a solid-state image pick-up device. A readout method reads out a pixel signal in a solid-state image pick-up device including a column processing circuit in each row of a matrix around a pixel array in which pixels are arranged in a two-dimensional matrix and which is described in the first aspect of the present invention. The readout method separately sample-holds charges stored in first and second floating-diffusion regions through the column processing circuit and combines pixel signals generated by these charges at the exterior of the column processing circuit. In the present invention, only pixel signals generated by charges stored in the second floating-diffusion region are read out multiple times in one frame period preferably. Furthermore, in the present invention, pixel signals generated by charges stored in the second floating-diffusion region are read out multiple times for different storing times in one frame period preferably. Also, in the present invention, pixel signals generated by charges stored in the first and second floating-diffusion regions are read out at different readout timings preferably. In addition, in the present invention, a potential at the shoulder of a charge-distributing-potential barrier on the second potential well is preferably controlled so that charges can flow into the second potential well multiple times in one frame period.

Still another aspect in accordance with the present invention is a readout method. The method reads out a pixel signal of a solid-state image pick-up device including a column processing circuit in each row of a matrix around a pixel array in which pixels are arranged in a two-dimensional matrix and which is described in the first aspect of the present invention. The readout method selects either charges stored in a first or second floating-diffusion region using the column processing circuit, and then generates pixel signals from these charges to outputs them to the exterior of the column processing circuit.

Advantages

The present invention can provide a solid-state image pick-up device capable of increasing an enlargement factor of a dynamic range of an output signal to the quantity of incident light without increase in the area of a pixel, and a method of reading a pixel signal therefrom.

BRIEF DESCRIPTION OF THE DRAWINGS

The above-described object and other objects, features, and advantages of the present invention will be more easily understood from the following detailed descriptions about preferred embodiments of the present invention with reference to the accompanying drawings.

DESCRIPTION OF REFERENCE NUMERALS

Figure 1:
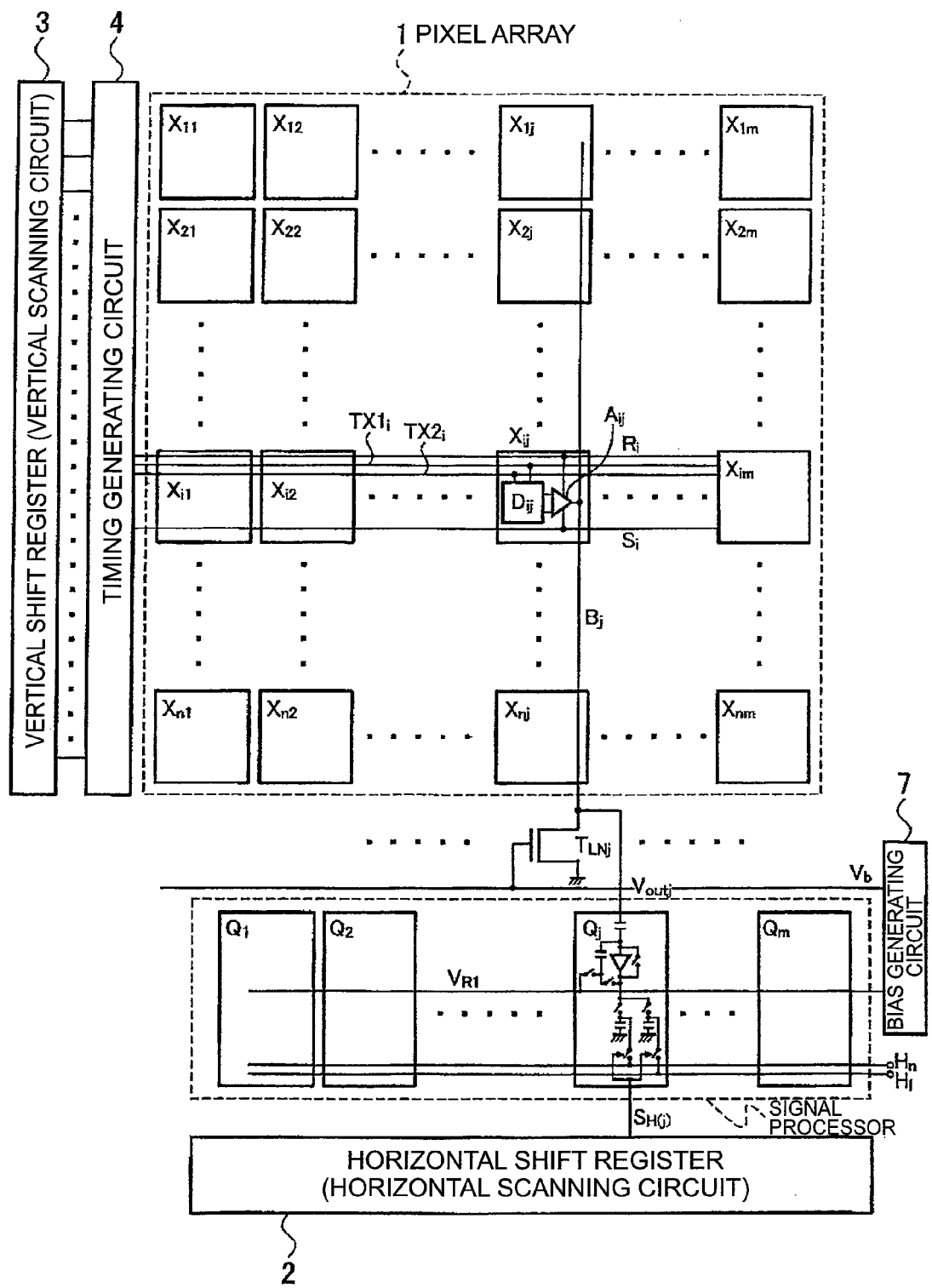
FIG. 1 is a schematic plan view illustrating a layout on a semiconductor chip for a solid-state image pick-up device (two-dimensional solid-state image pick-up device) in accordance with a first embodiment of the present invention.

CDB: charge-distributing-potential barrier
PW1: first potential well
PW2: second potential well
$X_{11}$ to $X_{1m}$, $X_{21}$ to $X_{2m}$, ..., $X_{n1}$ to $X_{nm}$: pixel
$A_{11}$ to $A_{1m}$, $A_{21}$ to $A_{2m}$, ..., $A_{n1}$ to $A_{nm}$: voltage readout buffer amplifier
AD: charge-storage diode
AD1: first charge-storage diode
AD2: second charge-storage diode
$B_j$: vertical signal line
$C_1$: input capacitor
$C_2$: integral capacitor
$C_3$: sample-hold capacitor for low-sensitivity signal, replacement-type common sample-hold capacitor, sample-hold capacitor for high-sensitivity signal
$D_{11}$ to $D_{1m}$, $D_{21}$ to $D_{2m}$, ..., $D_{n1}$ to $D_{nm}$: detecting circuits
$H_a$: horizontal analog output line
$H_d$: horizontal one-bit digital output line
$H_h$: horizontal analog output line for high-sensitivity signal
$H_l$: horizontal analog output line for low-sensitivity signal
PD: photodiode
PD/AD: photodiode or charge-storage diode
$Q_1, Q_2, ..., Q_j, ..., Q_m$: column processing circuits
$S_1$ to $S_7$: switches
$T_{Aij}$: signal readout transistor (amplifier transistor)
$T_{Aij1}$: first signal readout transistor (amplifier transistor)
$T_{Aij2}$: second signal readout transistor (amplifier transistor)
$T_{LNj}$: constant-current transistor
$T_{LNj1}$: first constant-current transistor
$T_{LNj2}$: second constant-current transistor
$T_{Rij}$: reset transistor
$T_{Rij1}$: first reset transistor
$T_{Rij2}$: second reset transistor
$T_{Sij}$: switching transistor
$T_{Sij1}$: first switching transistor
$T_{Sij2}$: second switching transistor
1: pixel array
2: horizontal scanning circuit (horizontal shift register)
3: vertical scanning circuit (vertical shift register)
4: timing generating circuit
5: signal processor
7: bias generating circuit
13, 15, 17, 18, and 23: second n-type surface-embedded region
14, 16, and 22: first n-type surface-embedded region
19, 25, and 29: p-type pinning layer
20: semiconductor layer
21: semiconductor substrate
24, 28: third n-type surface-embedded region
26: first floating-diffusion region
27: second floating-diffusion region
31: first charge-transfer part (first transfer gate electrode)
32: second charge-transfer part (second transfer gate electrode)
33: insulating interlayer
34: light-shielding layer
35: contact plug
36: contact plug
37: charge flow-in control gate (low-sensitivity charge flow-in control gate)
38: high-sensitivity charge flow-in control gate
91: noise-canceling amplifier
92: comparator
93: first AND gate
94: second AND gate

BEST MODE FOR CARRYING OUT THE INVENTION

The present invention can be readily understood by the following detailed descriptions with reference to the exemplary accompanying drawings. Furthermore, first to seventh embodiments of the present invention will be described with reference to the accompanying drawings. In the following drawings, identical or like parts are designated with identical or like reference symbols, if possible. It should be noted that, for example, the relationship between thicknesses and plan dimensions, and the ratios of the thicknesses of layers in the schematic drawings are different from those of actual devices. Therefore, values of the thicknesses and dimensions should be determined in consideration of the following description. Certainly, the drawings also include relationships and ratios of dimensions different from each other.

In addition, the following first to seventh embodiments merely show exemplary devices and methods in accordance with the present invention, and the present invention should not be limited to the specific materials, shapes, structures, and layouts of the components below. The embodiments of the present invention can be variously modified in the scope according to the appended claims.

In the first to seventh embodiments are described below through p-type and n-type is used as a first conductivity type and a second conductivity type. However, it will be readily understood that n-type and p-type is used as the first conductivity type and the second conductivity type by use of the voltage application with the electrical polarity reversal.

First Embodiment

Figure 2:
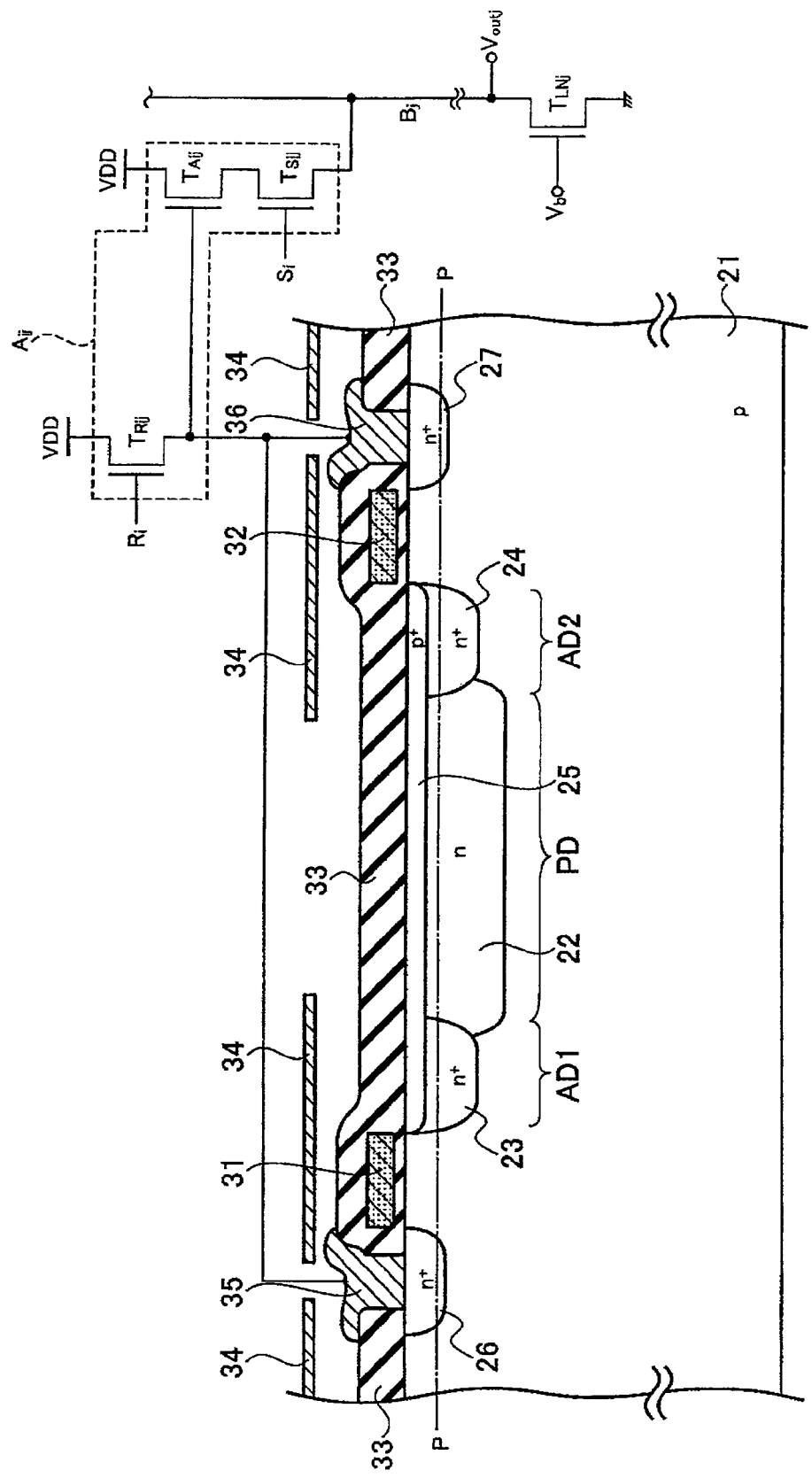
FIG. 2 is a schematic cross-sectional view (taken along the line A-A in FIG. 3) illustrating the structure of a pixel of the solid-state image pick-up device in accordance with the first embodiment of the present invention.

In a solid-state image pick-up device (two-dimensional image sensor) in accordance with the first embodiment of the present invention, as shown in FIG. 1, a pixel array 1 and peripheral circuits (2, 3, 4, 5) are integrated with each other in a single semiconductor chip. In the pixel array 1, a number of pixels $X_{ij}$ (i=1 to m; j=1 to n; where m and n are integers) are arranged in a two-dimensional matrix to form a rectangular image pick-up region. A vertical shift register (vertical scanning circuit) 3 is provided on the left side of the pixel array 1, and a timing generating circuit 4 is located between the vertical shift register 3 and the pixel array 1. A horizontal shift register (horizontal scanning circuit) 2 is provided on the lower side of the pixel array 1, and a bias generating circuit 7 is provided on the lower right side of the pixel array 1. FIG. 1 shows the internal structure of, for example, the specific pixel $X_{ij}$ located in the i-th row and the j-th column, and, like the pixel $X_{ij}$, the remaining pixels $X_{11}$ to $X_{1m}$, $X_{21}$ to $X_{2m}$, ..., $X_{i1}$ to $X_{im}$, ..., $X_{n1}$ to $X_{nm}$ also include detecting circuits, $D_{11}$ to $D_{1m}$, $D_{21}$ to $D_{2m}$, ..., $D_{i1}$ to $D_{im}$, ..., $D_{n1}$ to $D_{nm}$, and voltage readout buffer amplifiers, $A_{11}$ to $A_{1m}$, $A_{21}$ to $A_{2m}$, ..., $A_{i1}$ to $A_{im}$, ..., $A_{n1}$ to $A_{nm}$, respectively. As shown in FIG. 2, each detecting circuit $D_{ij}$ (i=1 to m; j=1 to n; where m and n are integers) includes a semiconductor photoelectric conversion element (photodiode) PD, a first charge-storage diode AD1, a second charge-storage diode AD2, a first charge-transfer part (first transfer gate electrode) 31, and a second charge-transfer part (second transfer gate electrode) 32 which is provided in the upper portion of a semiconductor substrate (a semiconductor region of a first conductivity type) 21.

By use of the timing generating circuit 4, the vertical shift register (vertical scanning circuit) 3 for driving the timing generating circuit 4, and the horizontal shift register (horizontal scanning circuit) 2, a pixel $X_{ij}$ of the pixel array 1 is sequentially selected to perform the read-out of a pixel signal and the operation of an electronic shutter therein. Accordingly, the solid-state image pick-up device in accordance with the first embodiment of the present invention sequentially selects each of pixel rows, $X_{11}$ to $X_{1m}$, $X_{21}$ to $X_{2m}$, ..., $X_{i1}$ to $X_{im}$, ..., $X_{n1}$ to $X_{nm}$, in the pixel array 1 in the vertical direction to read a pixel signal from each of the pixel rows, $X_{11}$ to $X_{1m}$, $X_{21}$ to $X_{2m}$, ..., $X_{i1}$ to $X_{im}$, ..., $X_{n1}$ to $X_{nm}$, by use of a vertical signal line provided in each of pixel columns, $X_{11}$ to $X_{n1}$, $X_{12}$ to $X_{n2}$, ..., $X_{1j}$ to $X_{nj}$, ..., $X_{1m}$ to $X_{nm}$.

The read sequence of a signal from each of the pixels $X_{11}$ to $X_{1m}$, $X_{21}$ to $X_{2m}$, ..., $X_{i1}$ to $X_{im}$, ..., $X_{n1}$ to $X_{nm}$ is generally similar to that in an ordinary CMOS image sensor. On the lower side (output side) of the pixel array 1, a plurality of column processing circuits $Q_1$, $Q_2$, ..., $Q_j$, ..., $Q_m$ are arranged corresponding to the pixel columns, $X_{11}$ to $X_{n1}$, $X_{12}$ to $X_{n2}$, ..., $X_{1j}$ to $X_{nj}$, ..., $X_{1m}$ to $X_{nm}$, respectively, to form a signal processor 5. Pixel signals are read from the pixel column, $X_{11}$ to $X_{n1}$ in the pixel array 1 through the vertical signal lines, and are supplied to the column processing circuit $Q_1$ of the signal processor 5 in series to eliminate noise inherent in pixels from the respective signals. Similarly, pixel signals of the pixel column, $X_{12}$ to $X_{n2}$, are supplied to the column processing circuit $Q_2$ from the signal processor 5 in series to eliminate noise inherent in pixels therefrom, ... and, pixel signals from the pixel column, $X_{1j}$ to $X_{nj}$, are supplied to the column processing circuit $Q_j$ of the signal processor 5 in series to eliminate noise inherent in pixels therefrom. Pixel signals from the pixel column, $X_{1m}$ to $X_{nm}$, are also supplied to the column processing circuit $Q_m$ of the signal processor 5 in series to eliminate noise inherent in pixels therefrom. Accordingly, each unit pixel $X_{ij}$ of the pixel array 1 has a variation of characteristics inherent in, for example, MOS transistors therein. Therefore, when pixel signals are read from the unit pixels $X_{ij}$ to form image signals without the modification of the pixel signals, variations inherent to the pixels $X_{ij}$ affect the image signals to cause noise in an image from the image signals.

Figure 3:
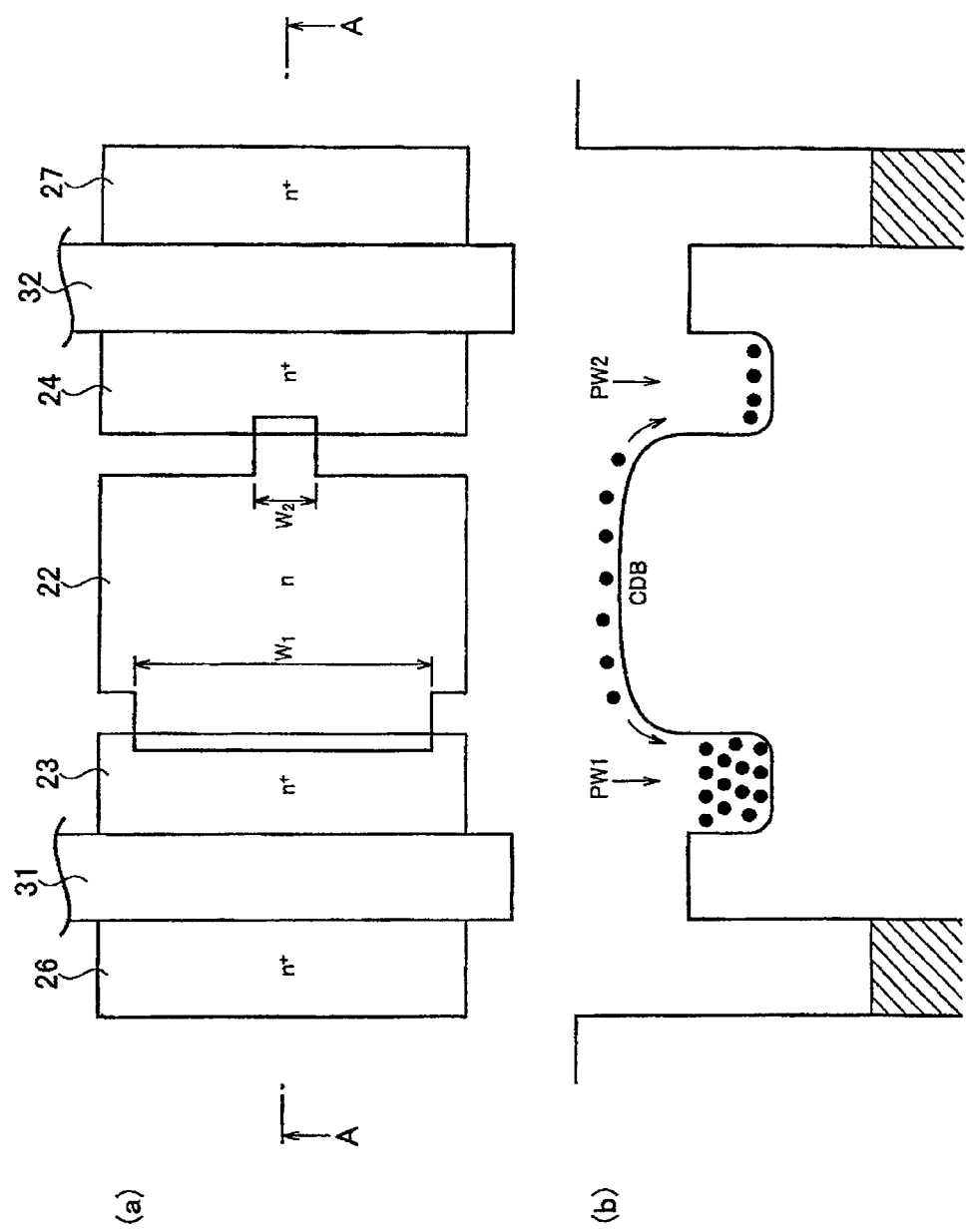
FIG. 3 illustrates the structure of a pixel of the solid-state image pick-up device in accordance with the first embodiment of the present invention.

FIG. 2 and Part (a) of FIG. 3 are schematic views showing the structure of one of the pixels $X_{ij}$ in the pixel array 1 of the solid-state image pick-up device in accordance with the first embodiment of the present invention. Part (a) of FIG. 3 is a schematic plan view illustrating the structure of a pixel of the solid-state image pick-up device in accordance with the first embodiment of the present invention. As shown in the middle of FIG. 2, the photodiode PD includes the p-type semiconductor substrate (the semiconductor region of the first conductivity type) 21 which works as an anode region, and a first n-type surface-embedded region 22 which works as a cathode region provided in the upper region of the p-type semiconductor substrate (the semiconductor region of the first conductivity type) 21. A p-type pinning layer 25 is provided in the upper region of the first n-type surface-embedded region 22. Since the p-type semiconductor substrate (the semiconductor region of the first conductivity type) 21 included in the photodiode PD functions as a charge-generating region, its impurity density is preferably between about $6 \times 10^{11}$ and about $2 \times 10^{15}$ cm$^{-3}$. Meanwhile, a silicon epitaxial layer of an impurity density between about $6 \times 10^{11}$ and about $2 \times 10^{15}$ cm$^{-3}$ may be grown on a silicon substrate of an impurity density between about $4 \times 10^{17}$ and about $1 \times 10^{21}$ cm$^{-3}$ to form a structure, and instead of the p-type semiconductor substrate 21, this structure can be used as the semiconductor region of the first conductivity type which functions as the charge-generating region. From an industrial point of view, it is preferable that a silicon epitaxial layer of an impurity density between about $6 \times 10^{13}$ and about $1.5 \times 10^{15}$ cm$^{-3}$ be formed on a available silicon substrate having an impurity density between about $8 \times 10^{17}$ and about $1 \times 10^{20}$ cm$^{-3}$ to form the semiconductor region of the first conductivity type. The first n-type surface-embedded region 22 is made of an n-type semiconductor region having a relatively low impurity density between about $2 \times 10^{15}$ and about $6 \times 10^{17}$ cm$^{-3}$. More preferably, in the first n-type surface-embedded region 22, its impurity density may be between about $5 \times 10^{16}$ and about $5 \times 10^{17}$ cm$^{-3}$, typically, for example, about $4 \times 10^{16}$ cm$^{-3}$, and its thickness may be between about 0.1 µm and about 3 µm, preferably between about 0.2 and about 0.5 µm. The p-type pinning layer 25 may have a relatively high impurity density between about $3 \times 10^{17}$ and $1.5 \times 10^{20}$ cm$^{-3}$, and a thickness between about 20 nm and about 1.0 µm, preferably between about 50 nm and about 300 nm.

Furthermore, as shown in FIG. 2 and Part (a) of FIG. 3, the first and second charge-storage diodes AD1 and AD2 are connected on the left and right sides of the photodiode PD, respectively (However, the arrangements in FIG. 2 and Part (a) of FIG. 3 are shown as an example. For example, it will be readily understood that another pixel topology can be used as follows: the first and second charge-storage diodes AD1 and AD2 are conversely disposed on the right and left sides of the photodiode PD, respectively). The first charge-storage diode AD1 includes a second n-type surface-embedded region 23 in contact with the left portion of the first n-type surface-embedded region 22 in the photodiode PD, and the p-type semiconductor substrate (the semiconductor region of the first conductivity type) 21 has a part provided for an anode region below the second n-type surface-embedded region 23. The second charge-storage diode AD2 includes a third n-type surface-embedded region 24 in contact with the right portion of the first n-type surface-embedded region 22 in the photodiode PD, and the p-type semiconductor substrate (the semiconductor region of the first conductivity type) 21 has a part provided for an anode region below the third n-type surface-embedded region 24. The second and third n-type surface-embedded regions 23 and 24 preferably have a higher impurity density than the first n-type surface-embedded region 22. For example, these regions 23 and 24 preferably have a relatively high density of an n-type impurity between about $5 \times 10^{16}$ and about $1 \times 10^{19}$ cm$^{-3}$. Above the second and third n-type surface-embedded regions 23 and 24, the p-type pinning layer 25 extends from the upper region of the photodiode PD to the right and left. The p-type pinning layer 25 suppresses generation of carriers in the surface during dark time, and is preferably used as a layer which reduces dark current. Therefore, in applications in which the dark current is not of interest in use, the p-type pinning layer 25 may be omitted from the structure of the pixels.

In the solid-state image pick-up device in accordance with the first embodiment of the present invention, as shown in Part (a) of FIG. 3, the area of a junction between the first and third n-type surface-embedded regions 22 and 24 is smaller than that of a junction between the first and second n-type surface-embedded regions 22 and 23. Part (a) of FIG. 3 is a plan view illustrating the first n-type surface-embedded region 22 having a shape of a polygon (dodecagon) having projection. The first n-type surface-embedded region 22 has a right projection of the width $W_2$ in the crossover of two-dimensional patterns of the first and third n-type surface-embedded regions 22 and 24, whereas the first n-type surface-embedded region 22 has a left projection of the width $W_1$ in the crossover of two-dimensional patterns of the first and second n-type surface-embedded regions 22 and 23, and the width $W_2$ is narrower than the width $W_1$. Accordingly, in the plan view of Part (a) of FIG. 3, charges flow from the photodiode PD into the second charge-storage diode AD2 through a boundary region having the width $W_2$, which is narrower than the width $W_1$ of a boundary region through which charges flow from the photodiode PD into the first charge-storage diode AD1.

Part (b) of FIG. 3 is a potential diagram in the cross section, taken along a P-P plane indicated by a chain line in FIG. 2, showing a first floating-diffusion region 26, the second n-type surface-embedded regions 23, the first n-type surface-embedded region 22, the third n-type surface-embedded regions 24 and a second floating-diffusion region 27. Charged particles (electrons) are indicated with filled circles. The middle of a potential distribution in Part (b) of FIG. 3 denotes the conduction band edge of the first n-type surface-embedded region 22, which works as a charge-distributing-potential barrier CDB. A first potential well PW1 provided by the first charge-storage diode AD1 resides on the left, and a potential well of the first floating-diffusion region 26 indicated by hatching sloping upward to the right resides on the left of the first potential well PW1. A rectangular potential barrier between the first potential well PW1 and the potential well of the first floating-diffusion region 26 shows a potential distribution of conduction band edge of the p-type semiconductor substrate (the semiconductor region of the first conductivity type) 21 just below the first transfer gate electrode 31. Similarly, a second potential well PW2 provided by the second charge-storage diode AD2 resides on the right of the potential distribution (charge-distributing-potential barrier) CDB of conduction band edge of the first n-type surface-embedded region 22. Furthermore, a potential well of the second floating-diffusion region 27 indicated by hatching sloping upward to the right resides on the right of the second potential well PW2. A rectangular potential barrier between the second potential well PW2 and the potential well of the second floating-diffusion region 27 shows a potential distribution of conduction band edge of the p-type semiconductor substrate (the semiconductor region of the first conductivity type) 21 just below the second transfer gate electrode 32.

In a pixel of the pixel array 1, the photodiode PD generates charges in response to light. The first and second potential wells PW1 and PW2 store charges generated by the photodiode PD. The charges stored in the first and second potential wells PW1 and PW2 are supplied from the common photodiode PD, and charges from this single photodiode PD are distributed into two well. Therefore, signals having two kinds of sensitivity are unlikely to cause spatial displacement. The photodiode PD also includes the charge-distributing-potential barrier CDB.

The structure of the plan view shown in Part (a) of FIG. 3 can enlarge the dynamic range of the solid-state image pick-up device in light intensity because charges (electrons) stored in the second charge-storage diode AD2 is fewer than those stored in the first charge-storage diode AD1 in receiving the single light of an intensity. Accordingly, as shown in the potential diagram of Part (b) of FIG. 3, the solid-state image pick-up device in accordance with the first embodiment of the present invention distributes photoelectrons generated in the single photodiode PD to the left-sided first and right-sided second potential wells PW1 and PW2 by a certain ratio (distribution ratio).

Figure 4:
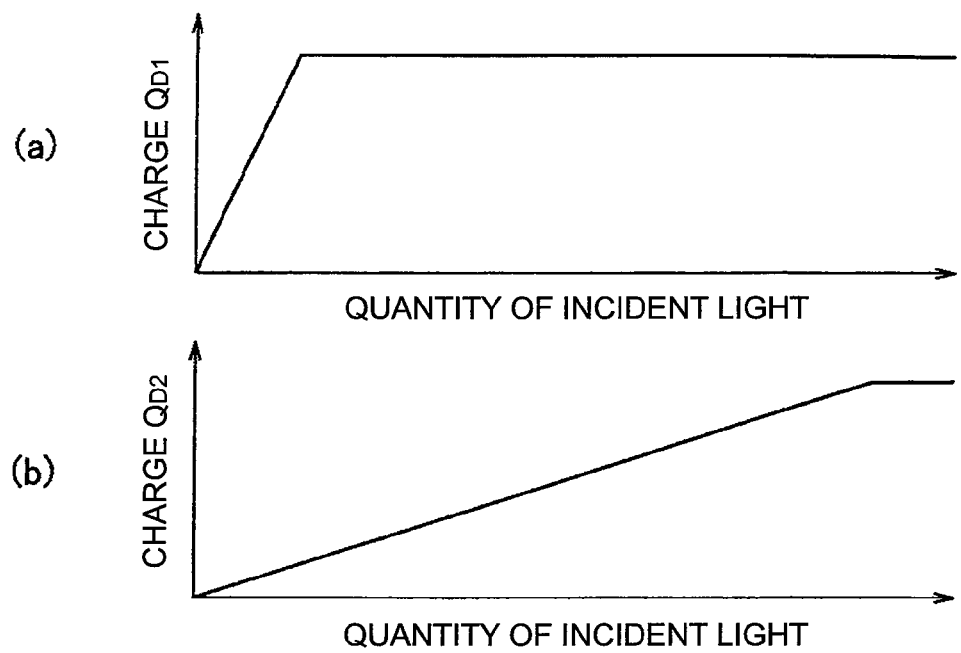
FIG. 4 shows sensitivity characteristics of the first and second charge-storage diodes in the solid-state image pick-up device in accordance with the first embodiment of the present invention.

Parts (a) and (b) of FIG. 4 show sensitivity characteristics of the first and second charge-storage diodes, respectively, in the solid-state image pick-up device in accordance with the first embodiment of the present invention. According to a pixel $X_{ij}$ having the structure shown as an example in the plan view of Part (a) of FIG. 3, of the solid-state image pick-up device in accordance with the first embodiment, as shown in FIG. 4, the sensitivity for charges stored in the second charge-storage diode AD2 is lower those that in the first charge-storage diode AD1. Accordingly, Part (a) of FIG. 4 reveals that a signal (quantity of stored electric charge) $Q_{D1}$ of the first charge-storage diode AD1 is saturated by a relatively low quantity of incident light, whereas Part (b) of FIG. 4 reveals that a signal (quantity of stored electric charge) $Q_{D2}$ by the second charge-storage diode AD2 is not saturated by a relatively high quantity of incident light and is increased linearly in response to the charges stored thereto. Therefore, the signals of the first and second charge-storage diodes AD1 and AD2 are combined into the output of the pixel $X_{ij}$ to enlarge a dynamic range of the solid-state image pick-up device in the quantity of incident light. Accordingly, signals of the first and second charge-storage diodes AD1 and AD2 are used as signals for high- and low-sensitivity, respectively, which can enlarge the dynamic range in the quantity of incident light.

Returning to FIG. 2 and Part (a) of FIG. 3 which show the pixel $X_{ij}$ of the solid-state image pick-up device in accordance with the first embodiment, the first transfer gate electrode 31 and the first floating-diffusion region 26 are provided in the left of the second n-type surface-embedded regions 23, and the first floating-diffusion region 26 stores charges transferred by the first transfer gate electrode 31. Similarly, the second transfer gate electrode 32 and the second floating-diffusion region 27 are provided in the right of the third n-type surface-embedded regions 24, and the second floating-diffusion region 27 stores charges transferred by the second transfer gate electrode 32. An insulating interlayer 33 is formed on the first and second transfer gate electrodes 31 and 32. Contact plugs 35 and 36 are embedded in contact holes and are in contact with the first and second floating-diffusion regions 26 and 27, respectively, provided in the insulating interlayer 33.

The first floating-diffusion region 26 is connected to a source electrode of a reset transistor $T_{Rij}$ in the voltage reading buffer amplifier $A_{ij}$ through the contact plug 35. Although not shown in FIG. 2, the reset transistor $T_{Rij}$ in the voltage reading buffer amplifier $A_{ij}$ may include a first reset source electrode of the first floating-diffusion region 26, a first reset gate electrode in the left of the first reset source electrode, and a first reset drain region connected to the first floating-diffusion region (first reset source electrode) 26 through the first reset gate electrode in FIG. 2; and include a second reset source electrode of the second floating-diffusion region 27, a second reset gate electrode in the right of the second reset source electrode, and a second reset drain region connected to the second floating-diffusion region (second reset source electrode) 27 through the second reset gate electrode in FIG. 2. In the above configuration, a MOS transistor which functions as a first reset transistor $T_{Rij}$ includes the first floating-diffusion region (first reset source electrode) 26, the first reset gate electrode, and the first reset drain region; and a MOS transistor which functions as a second reset transistor $T_{Rij}$ includes the second floating-diffusion region (second reset source electrode) 27, the second reset gate electrode, and the second reset drain region. However, FIG. 2 shows an equivalent circuit diagram of the single reset transistor $T_{Rij}$. Certainly, a single transistor may be used as a symbol for the reset transistor $T_{Rij}$, which is connected to the first and second floating-diffusion regions 26 and 27 by conductive lines on the surface. A reset signal $R_i$ of High (H) level ($R_i$="1") is applied to the reset gate electrode of the reset transistor $T_{Rij}$ to discharge charges stored in the first and second floating-diffusion regions 26 and 27, thereby placing the first and second floating-diffusion regions 26 and 27 in condition for reset.

As shown in FIG. 2, the first and second floating-diffusion regions 26 and 27 are connected through the contact plugs 35 and 36 to a gate electrode of a signal readout transistor (amplifier transistor) $T_{Aij}$ in the voltage reading buffer amplifier $A_{ij}$ by conductive lines on the surface, respectively. A drain electrode of the signal readout transistor (amplifier transistor) $T_{Aij}$ is connected to a power supply $V_{DD}$, and a source electrode thereof is connected to a drain electrode of a switching transistor $T_{Sij}$ for selecting a pixel. The source electrode of the switching transistor $T_{Sij}$ is connected to the vertical signal line $B_j$ in the j-th column. A vertical selection signal $S_i$ on a horizontal line in the i-th row, which is driven by the vertical shift register (vertical scanning circuit) 3 from the timing generating circuit 4, is applied to a gate electrode of the switching transistor $T_{Sij}$.

For example, as shown in FIG. 1, the vertical signal line $B_j$ in the j-th column of the pixel array 1 is connected to a constant-current transistor $T_{LNj}$ working as a common load. For example, a source follower circuit includes the voltage reading buffer amplifier $A_{ij}$ and the constant-current transistor $T_{LNj}$ in the i-th row and the j-th column. Furthermore, the column processing circuit $Q_j$ reads an output signal $V_{outj}$ from the source follower circuit. Although not shown in the drawing, vertical signal lines, $B_1, B_2, \ldots, B_{j-1}, B_{j+1}, \ldots, B_m$ in other columns are similarly connected to constant-current transistors, $T_{LN1}, T_{LN2}, \ldots, T_{LNj-1}, T_{LNj+1}, \ldots, T_{LNm}$ working as common loads, respectively, to form source follower circuits. Furthermore, output signals, $V_{out1}, V_{out2}, \ldots, V_{outj-1}, V_{outj+1}, \ldots, V_{outm}$, from the source follower circuits are read out by column processing circuits, $Q_1, Q_2, \ldots, Q_{j-1}, Q_{j+1}, \ldots, Q_m$, respectively.

In the operation of the vertical signal line $B_j$ shown in FIG. 2, the vertical selection signal $S_i$ in the i-th row is set to High level ($S_i$="1") and is applied to the gate electrode of the switching transistor $T_{Sij}$, provided for selecting a pixel of the voltage reading buffer amplifier $A_{ij}$, to turn on the switching transistor $T_{Sij}$, while a constant voltage Vb from a bias generating circuit 7 is applied to a gate electrode of the constant-current transistor $T_{LNj}$, so that charges (signals of the first and second charge-storage diodes AD1 and AD2) stored in the first and second floating-diffusion regions 26 and 27 are amplified by the signal readout transistor (amplifier transistor) $T_{Aij}$, and the amplified signal is read as the output signal $V_{outj}$ of the source follower circuit to provide an external device outside the pixel array 1.

As shown in FIG. 2, a light-shielding layer 34 has an opening, and the opening is provided selectively so that photoelectric charges are generated in the p-type semiconductor substrate (the semiconductor region of the first conductivity type) 21 below the first n-type surface-embedded region 22 of the photodiode PD. FIG. 2 shows the insulating interlayer 33 which is the lowermost layer. However, the light-shielding layer 34 may be formed by a thin metal layer of, for example, aluminum (Al) provided above any of insulating interlayers of a multi-layered wiring structure, not shown in the drawing.

<Column Processing Circuit>

Figure 5:
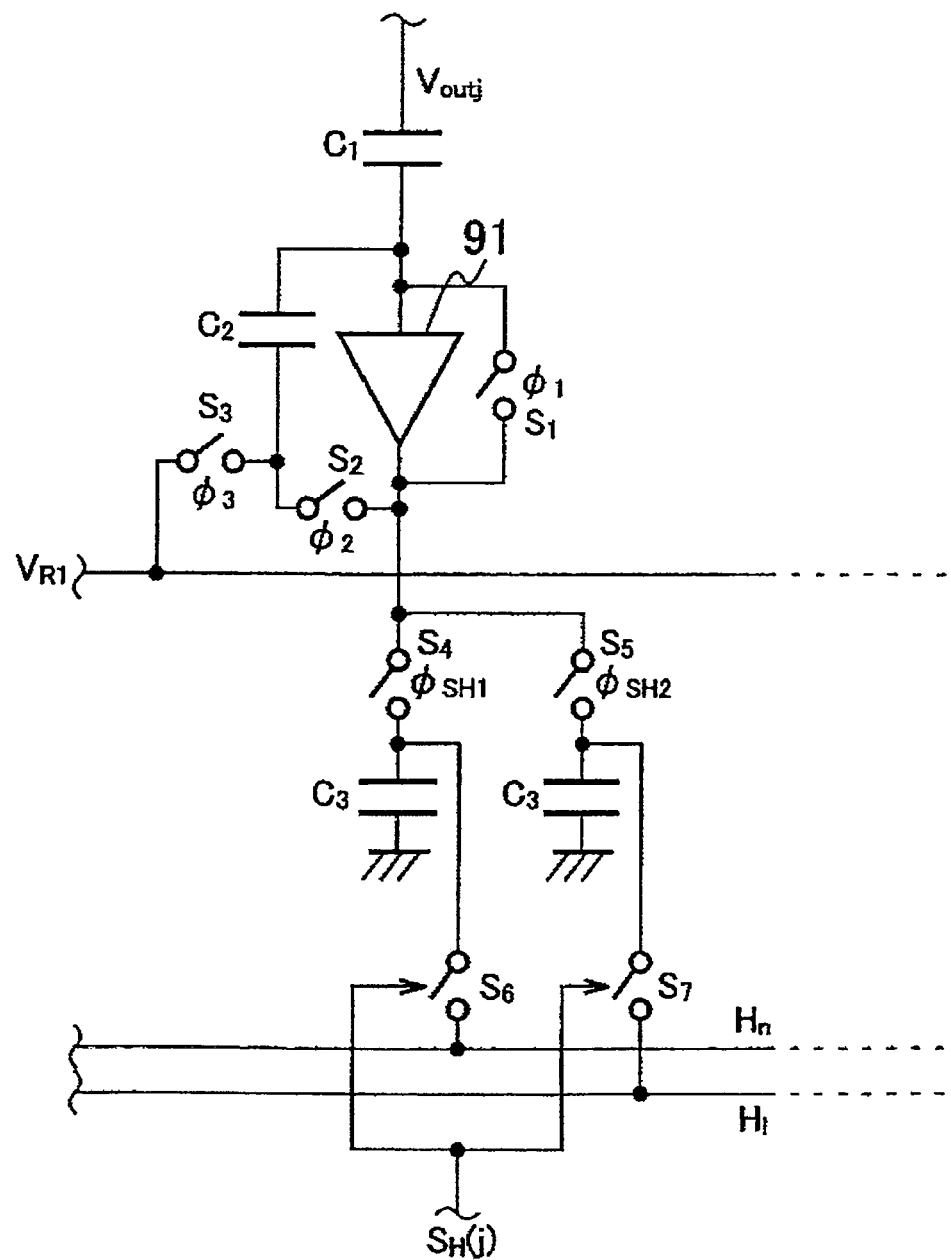
FIG. 5 is a schematic circuit diagram illustrating a column processing circuit in the j-th column of the solid-state image pick-up device in accordance with the first embodiment of the present invention.

FIG. 5 shows a noise canceling circuit, and the noise canceling circuit reads a pixel signal of the pixel column, $X_{1j}$ to $X_{nj}$, in the j-th column of the pixel array 1 shown in FIG. 1, through the vertical signal line $B_j$ of the j-th column and the constant-current transistor $T_{LNj}$ of a common load for the vertical signal line $B_j$. This noise canceling circuit includes an input capacitor $C_1$ having one electrode connected through the vertical signal line $B_j$ to the output $V_{outj}$ of the source follower circuit having the constant-current transistor $T_{LNj}$, an integral capacitor $C_2$ having one electrode connected to the other electrode of the input capacitor $C_1$, and a noise-canceling amplifier 91 having an input terminal connected to the other electrode of the input capacitor $C_1$. The other electrode of the integral capacitor $C_2$ is connected to a reference voltage line $V_{R1}$ through a switch $S_3$. The noise-canceling amplifier 91 is connected in parallel to a switch $S_1$ for the short-circuiting of the input terminal and an output terminal of the noise-canceling amplifier 91.

A switch $S_2$ is connected to between the input terminal of the noise-canceling amplifier 91 and the other electrode of the integral capacitor $C_2$.

The output terminal of the noise-canceling amplifier 91 is connected to plural branches. One of the plural branches (left-sided branch in FIG. 5) is connected through a switch $S_4$ to one electrode of a sample-hold capacitor $C_3$ for receiving a high-sensitivity signal. The other branch (left-sided branch in FIG. 5) is connected through a switch $S_5$ to one electrode of a sample-hold capacitor $C_3$ for receiving a low-sensitivity signal. The other electrodes of the sample-hold capacitor $C_3$ for high-sensitivity signals and sample-hold capacitor $C_3$ for low-sensitivity signals are grounded.

The one electrode of the sample-hold capacitor $C_3$ for the high-sensitivity signals is further connected to a horizontal analog output line $H_h$ for the high-sensitivity signal through switch $S_6$, and the one electrode of the sample-hold capacitor $C_3$ for the low-sensitivity signals is further connected to a horizontal analog output line $H_l$ for the low-sensitivity signals through switch $S_7$. A horizontal selection signal SH(j) is applied to the switches $S_6$ and $S_7$ from the horizontal shift register (horizontal scanning circuit) 2.

Figure 6:
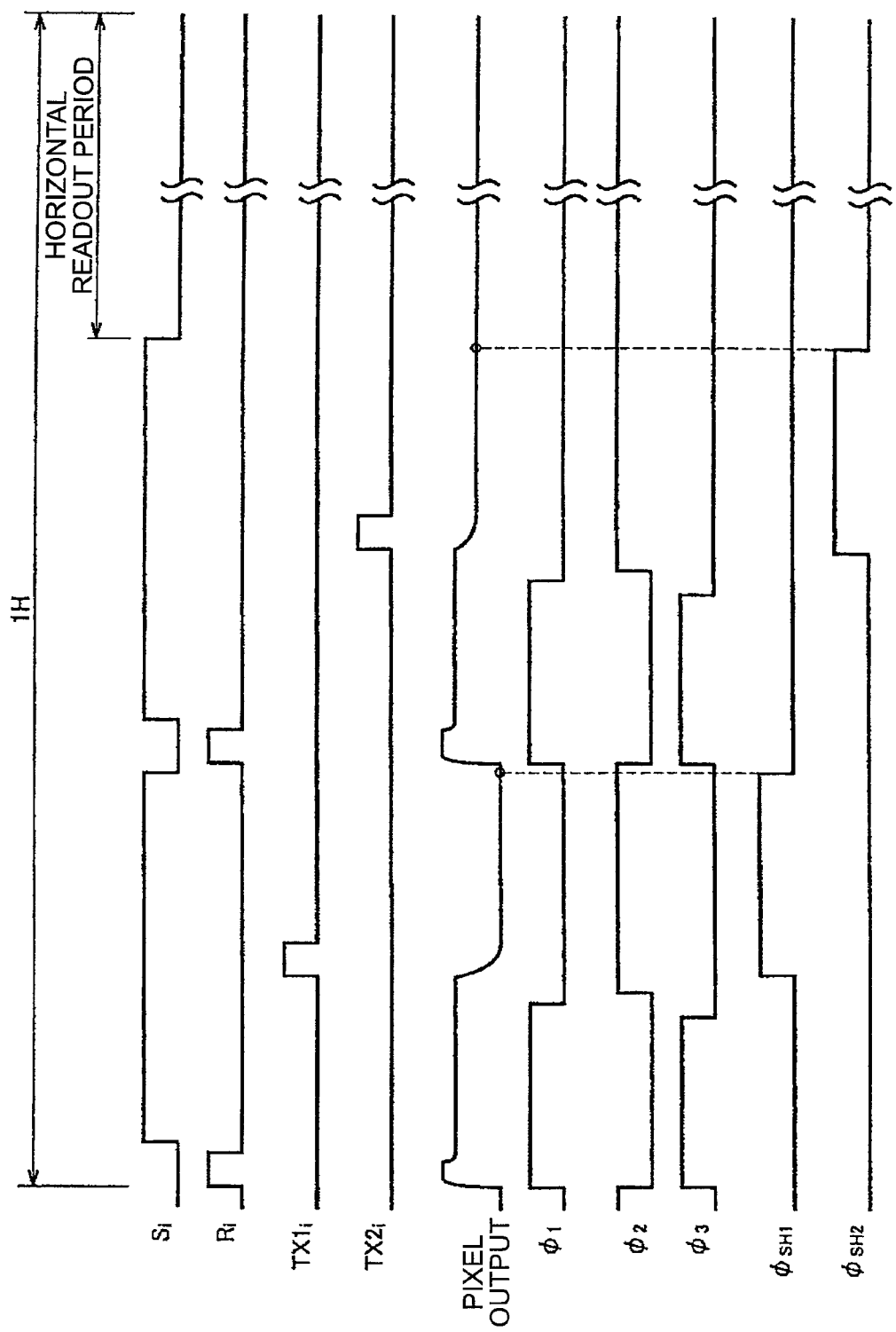
FIG. 6 is a timing diagram illustrating the operation of the column processing circuit shown in FIG. 5.

With reference to a timing diagram in FIG. 6, the operation of the column processing circuit $Q_j$ shown in FIG. 5 will be described. FIG. 6 illustrates temporal changes in the following signals: the vertical selection signal $S_i$ which is a control signal for the pixel row consisting of $X_{i1}$ to $X_{im}$ in the i-th row; the reset signal $R_i$; a first transfer signal $TX1_i$, a second transfer signal $TX2_i$; an output signal of a pixel $X_{ij}$ in the i-th row and the j-th column; a control signal $\phi_1$ for controlling the switch $S_1$; a control signal $\phi_2$ for controlling the switch $S_2$; a control signal $\phi_3$ for controlling the switch $S_3$; a first sample-hold signal $\phi_{SH1}$ for controlling the switch $S_4$; and a second sample-hold signal $\phi_{SH2}$ for controlling the switch $S_5$, and the waveforms of these signals are in series from the top.

(a) First, the reset signal $R_i$ in the i-th row is set to a High (H) level ($R_i$="1") to reset the voltage of the first and second floating-diffusion regions 26 and 27 in the pixel $X_{ij}$. Next, the switch $S_1$ is turned on (closed), the switch $S_2$ is turned off (opened), and the switch $S_3$ is turned on ($\phi_1$="1", $\phi_2$="0", $\phi_3$="1"). Furthermore, the vertical selection signal $S_i$ in the i-th row is set to a High level ($S_i$="1") so that the input capacitor $C_1$ in FIG. 5 samples a voltage level with a reset state of the first and second floating-diffusion regions 26 and 27 in the pixel $X_{ij}$ through the vertical signal line $B_j$.

(b) Thereafter, the switch $S_1$ is turned off, the switch $S_2$ is turned on, and the switch $S_3$ is turned off to place the noise-canceling amplifier 91 in FIG. 5 in condition for an amplification mode ($\phi_1$="0", $\phi_2$="1", $\phi_3$="0"). Next, the first transfer signal $TX1_i$ is applied to the first transfer gate electrode 31 to transfer signal electrons from the second n-type surface-embedded regions 23 of the first charge-storage diode AD1 to the first floating-diffusion region 26. This changes the voltage of the first floating-diffusion region 26, so that both fixed pattern noise and reset noise in the pixel $X_{ij}$ are eliminated from the high-sensitivity signal to produce the eliminated version of the high-sensitivity signal in the output of the noise-canceling amplifier 91. By turning on the switch $S_4$ and thereafter turning off it again, the output signal of the noise-canceling amplifier 91 is stored in the sample-hold capacitor $C_3$ for receiving a high-sensitivity signal ($\phi_{SH1}$="1", thereafter $\phi_{SH1}$="0"), so that the high-sensitivity signal is stored in the sample-hold capacitor $C_3$ shown in the lower left side of FIG. 5.

(c) Again, the reset signal $R_i$ in the i-th row is set to a High (H) level ($R_i$="1") to reset voltages of the first and second floating-diffusion regions 26 and 27 in the pixel $X_{ij}$. Next, the switch $S_1$ is turned on (closed), the switch $S_2$ is turned off (opened), and the switch $S_3$ is turned on ($\phi_1$="1", $\phi_2$="0", $\phi_3$="1"). Further, the vertical selection signal $S_i$ in the i-th row is set to a High level ($S_i$="1"), so that the input capacitor $C_1$ in FIG. 5 samples a voltage level with a reset state of the first and second floating-diffusion regions 26 and 27 in the pixel $X_{ij}$ to through the vertical signal line $B_j$.

(d) Thereafter, the switch $S_1$ is turned off, the switch $S_2$ is turned on, and the switch $S_3$ is turned off to place the noise-canceling amplifier 91 in FIG. 5 in condition for the amplification mode ($\phi_1$="0", $\phi_2$="1", $\phi_3$="0"). Next, the second transfer signal $TX2_i$ is applied to the second transfer gate electrode 32 to transfer signal electrons from the third n-type surface-embedded regions 24 to the second floating-diffusion region 27. This changes the voltage of the second floating-diffusion region 27, so that both fixed pattern noise and reset noise in the pixel $X_{ij}$ are eliminated from the low-sensitivity signal to produce the eliminated version of the low-sensitivity signal in the output of the noise-canceling amplifier 91. By turning on the switch $S_5$ and thereafter turning off it again, the output of the noise-canceling amplifier 91 is stored in the sample-hold capacitor $C_3$ for a low-sensitivity signal shown in the lower right side of FIG. 5 ($\phi_{SH2}$="1", thereafter $\phi_{SH2}$="0").

(e) During a horizontal readout period, the switches $S_6$ and $S_7$ are turned on to read out the high-sensitivity signal and low-sensitivity signal stored in the sample-hold capacitor $C_3$ for high-sensitivity signals and the sample-hold capacitor $C_3$ for low-sensitivity signals, respectively. In the application of the horizontal selection signal SH(j) in the j-th column, the charges stored in the sample-hold capacitors $C_3$ for high- and low-sensitivity signals flow into the horizontal analog output lines $H_h$ and $H_l$ for high- and low-sensitivity signals, and the reading operation is performed.

Meanwhile, the column processing circuit $Q_j$ shown in FIG. 5 and the readout method illustrated in the timing diagram of FIG. 6 are not so different from column processing circuits and readout methods for general MOS type solid-state image pick-up devices in outline of their basic behavior. In addition, the circuit structure is not limited to the present embodiment.

<First Variation of Column Processing Circuit>

In the solid-state image pick-up device in accordance with a first variation of the first embodiment of the present invention, the modified solid-state image pick-up device includes the pixel array 1 having a number of pixels $X_{ij}$ (i=1 to m; j=1 to n; where m and n are integers) arranged in a two-dimensional matrix, on the left side of which the vertical shift register (vertical scanning circuit) 3 is provided. The timing generating circuit 4 is located between the pixel array 1 and the vertical shift register, the bias generating circuit 7 is located on the lower right side; and the horizontal shift register (horizontal scanning circuit) 2 is located on the lower side. The above arrangement and the structure of the pixels $X_{ij}$ are similar to the solid-state image pick-up device in accordance with the first embodiment (see FIG. 1).

Although not shown in any drawing, the solid-state image pick-up device in accordance with the first variation of the first embodiment differs from the solid-state image pick-up device in accordance with the first embodiment in that the column processing circuits $Q_{jh}$ and $Q_{jl}$ for high- and low-sensitivity signals are provided on the upper and lower sides of the pixel array 1, respectively.

Accordingly, the solid-state image pick-up device in accordance with the first variation of the first embodiment can separately read out the high- and low-sensitivity signals through two of the column processing circuits $Q_{jh}$ and $Q_{jl}$ for high- and low-sensitivity signals, respectively.

In addition, one example of a circuit layout on a semiconductor chip is explained with following example: the first horizontal shift register (horizontal scanning circuit) for the column processing circuits $Q_{jh}$ for high-sensitivity signals and the second horizontal shift register (horizontal scanning circuit) for the column processing circuits $Q_{jl}$ for low-sensitivity signals may be separated from each other. Certainly, such layouts on the semiconductor chips include various options.

<Second Variation of Column Processing Circuit>

Referring to FIG. 1 used for the description of the device in accordance with the first embodiment, a solid-state image pick-up device in accordance with a second variation of the first embodiment of the present invention includes the pixel array 1 having a number of pixels $X_{ij}$ (i=1 to m; j=1 to n; where m and n are integers), and these pixels $X_{ij}$ are arranged in a two-dimensional matrix. The vertical shift register (vertical scanning circuit) 3 is located on the left side of the pixel array 1. The timing generating circuit 4 is located between the vertical shift register (vertical scanning circuit) 3 and the pixel array 1; the bias generating circuit 7 is located on the lower right side. On the lower side of the pixel array 1, the horizontal shift register (horizontal scanning circuit) 2 and the signal processor 5 are located, and the signal processor 5 includes the plurality of column processing circuits $Q_1, Q_2, \ldots, Q_1, \ldots, Q_m$. However, the structure of column processing circuits $Q_1, Q_2, \ldots, Q_j, \ldots, Q_m$ differ from the solid-state image pick-up device in accordance with the first embodiment in that this modified solid-state image pick-up device is provided with a noise-canceling circuit as shown in FIG. 7.

Accordingly, the solid-state image pick-up device in accordance with the first embodiment uses the horizontal analog output lines $H_h$ and $H_l$ for high- and low-sensitivity signals in order to read both the high- and low-sensitivity signals from the first and second charge-storage diodes AD1 and AD2. The readout signals are combined with each other using the external device outside the signal processor 5 to obtain the wide dynamic range. In contrast to the first embodiment, as shown in FIG. 7, the solid-state image pick-up device in accordance with the second variation of the first embodiment includes each of the column processing circuits $Q_1, Q_2, \ldots, Q_j, \ldots, Q_m$ having a comparator 92 for performing the comparison of the amplitude of the high-sensitivity signal in each column of the pixel array 1. When the output of the comparator 92 in each column indicates that the amplitude of the high-sensitivity signal is equal to or more than a reference value, the low-sensitivity signal is supplied as a readout signal to the external device in place of the high-sensitivity signal, so that the solid-state image pick-up device uses a single sample-hold capacitor for each column and a single horizontal analog output line.

Figure 7:
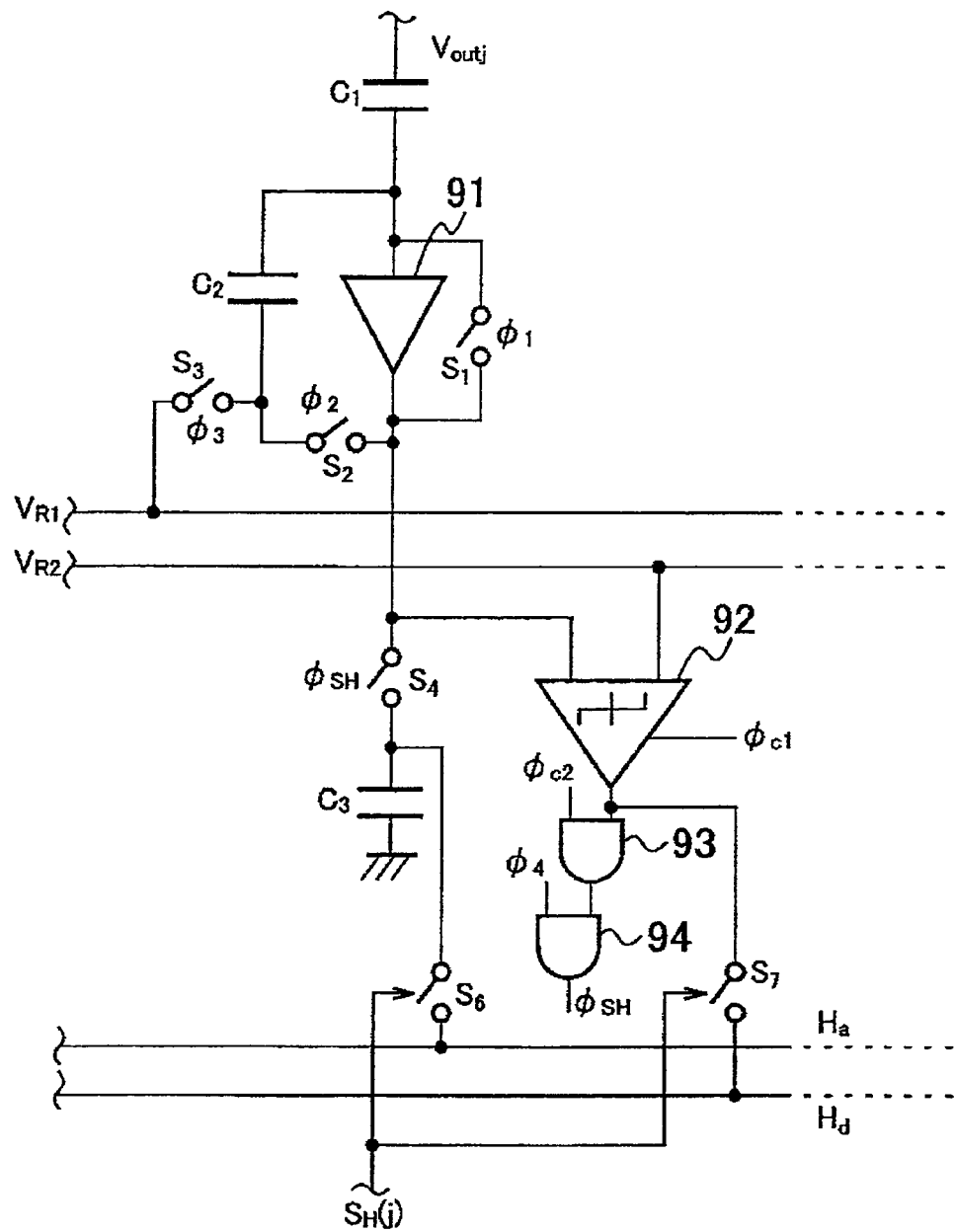
FIG. 7 is a schematic circuit diagram illustrating the column processing circuit in the j-th column of the solid-state image pick-up device in accordance with a second modified example of the first embodiment of the present invention.

FIG. 7 shows a noise canceling circuit of the column processing circuit $Q_j$ in the j-th column, and signals from the pixels, $X_{1j}$ to $X_{nj}$, in the j-th column of the pixel array 1 shown in FIG. 1 is read out through the vertical signal line $B_j$. For this operation, the following elements are provided: the input capacitor $C_1$ having one electrode connected to the vertical signal line $B_j$ in the j-th column; the integral capacitor $C_2$ having one electrode connected to the other electrode of the input capacitor $C_1$; and the noise-canceling amplifier 91 having the input terminal connected to the other electrode of the input capacitor $C_1$. The other electrode of the integral capacitor $C_2$ is connected to a first reference voltage line $V_{R1}$ through a switch $S_3$. The noise-canceling amplifier 91 is connected in parallel to the switch $S_1$ for the short-circuiting of the input terminal and the output terminal of the noise-canceling amplifier 91. The switch $S_2$ is connected to between the input terminal of the noise-canceling amplifier 91 and the other electrode of the integral capacitor $C_2$.

The output terminal of the noise-canceling amplifier 91 is connected to plural branches. One of the branches is one electrode of a replacement-type common sample-hold capacitor $C_3$ through the switch $S_4$. The other branch is a first input terminal of the comparator 92. A second input terminal of the comparator 92 is connected to a second reference voltage line $V_{R2}$ which supplies a reference voltage $V_{R2}$. The comparator 92 compares the output of the noise-canceling amplifier 91 with the reference voltage $V_{R2}$. An output terminal of the comparator 92 is connected to a second input terminal of a first AND gate 93. A control signal $\phi_{c2}$ is supplied to a first input terminal of the first AND gate 93. The output terminal of the first AND gate 93 is connected to a second input terminal of a second AND gate 94. A control signal $\phi_4$ is inputted to a first input terminal of the second AND gate 94. An output of the second AND gate 94 supplies the sample-hold signal $\phi_{SH}$ for the switch $S_4$ of the sample-hold circuit.

One electrode of the replacement-type common sample-hold capacitor $C_3$ is connected to a horizontal analog output line $H_a$ through a switch $S_6$. On the other hand, the output terminal of the comparator 92 is connected to a horizontal one-bit digital output line $H_d$ through a switch $S_7$. The horizontal selection signal SH(j) is applied to the switches $S_6$ and $S_7$ by the horizontal shift register (horizontal scanning circuit) 2.

The solid-state image pick-up device in accordance with the second variation of the first embodiment uses a column processing circuit $Q_1, Q_2, \ldots, Q_j, \ldots,$ and $Q_m$ shown in FIG. 7 to decrease the number of the output signal lines and the area of peripheral circuits, such as the readout circuit, of the present device.

The structure of each pixel $X_{ij}$ of the solid-state image pick-up device in accordance with the second variation of the first embodiment, like that in accordance with of the first embodiment, includes the photodiode PD, the first and second charge-storage diodes AD1 and AD2, and the first and second transfer gate electrodes 31 and provided above the p-type semiconductor substrate (the semiconductor region of the first conductivity type) 21 (see FIG. 2).

Figure 8:
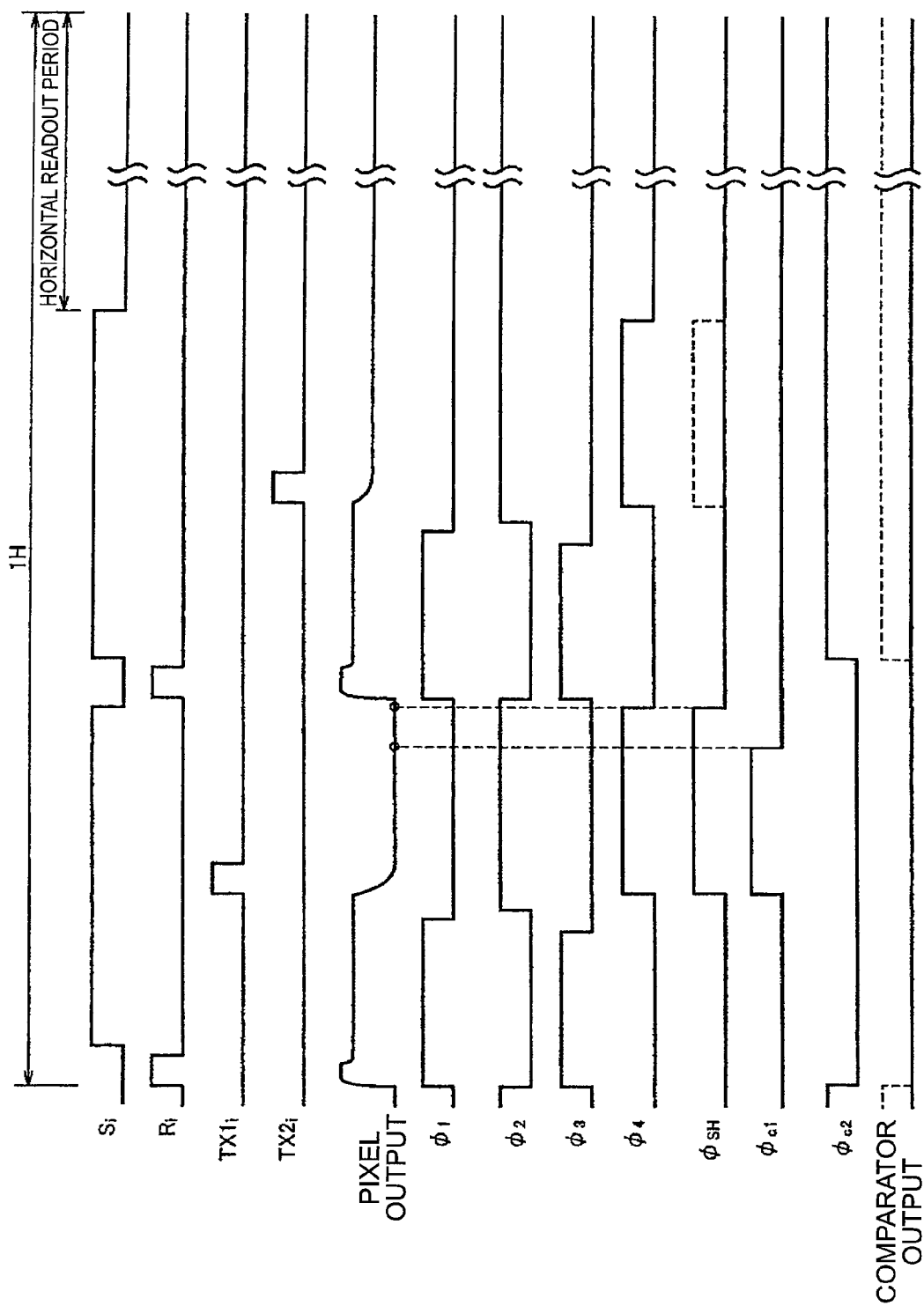
FIG. 8 is a timing diagram illustrating the operation of the column processing circuit shown in FIG. 7.

With reference to a timing diagram in FIG. 8, the operation of the column processing circuit $Q_j$ of the solid-state image pick-up device in accordance with the second variation of the first embodiment shown in FIG. 7 will be described below. FIG. 8 illustrates temporal changes in the following signals: the vertical selection signal $S_i$ which is a control signal for the pixel row, $X_{i1}$ to $X_{im}$, in the i-th row; the reset signal the first transfer signal $TX1_i$; the second transfer signal $TX2_i$; the output signal of a pixel $X_{ij}$ in the i-th row and the j-th column; the control signal $\phi_i$ for controlling the switch $S_1$, the control signal $\phi_2$ for controlling the switch $S_2$; the control signal $\phi_3$ for controlling the switch $S_3$; a control signal $\phi_4$ for controlling the second AND gate 94; the sample-hold signal $\phi_{SH}$ for controlling the switch $S_4$; a control signal $\phi_{c1}$ for the comparator 92; a control signal $\phi_{c2}$ for the first AND gate 93; and the output signal of the comparator 92, which are arranged in series from the top.

(a) First, the reset signal $R_i$ in the i-th row is set to a High (H) level to reset the potential of the first and second floating-diffusion regions 26 and 27 in a pixel $X_{ij}$. Next, the switch $S_1$ is turned on, the switch $S_2$ is turned off, and the switch $S_3$ is turned on. Further, the vertical selection signal $S_i$ in the i-th row is set to a High level, so that the input capacitor $C_1$ in FIG. 7 samples a voltage level with a reset state of the first and second floating-diffusion regions 26 and 27 in the pixel $X_{ij}$ through the vertical signal line $B_j$.

(b) Thereafter, the switch $S_1$ is turned off, the switch $S_2$ is turned on, and the switch $S_3$ is turned off to place the noise-canceling amplifier 91 in FIG. 7 in an amplification mode. Next, the first transfer signal $TX1_i$ is applied to the first transfer gate electrode 31 to transfer signal electrons from the second n-type surface-embedded regions 23 of the first charge-storage diode AD1 to the first floating-diffusion region 26. This changes the voltage of the first floating-diffusion region 26, so that both fixed pattern noise and reset noise in the pixel $X_{ij}$ are cancelled from the high-sensitivity signal to produce the cancelled eliminated version of the high-sensitivity signal in the output of the noise-canceling amplifier 91. The switch $S_4$ is turned on, and thereafter turned off again to store the output signal of the noise-canceling amplifier 91 in the replacement-type common sample-hold capacitor $C_3$, so that the high-sensitivity signal is stored in the replacement-type common sample-hold capacitor $C_3$.

(c) Again, the reset signal $R_i$ in the i-th row is set to a High (H) level to reset the voltage of the first and second floating-diffusion regions 26 and 27 in a pixel $X_{ij}$. Next, the switch $S_1$ is turned on, the switch $S_2$ is turned off, and the switch $S_3$ is turned on. Further, the vertical selection signal $S_i$ in the i-th row is set to a High level, so that the input capacitor $C_1$ in FIG. 7 samples a voltage level with a reset state of the first and second floating-diffusion regions 26 and 27 in the pixel $X_{ij}$ through the vertical signal line $B_j$.

(d) Thereafter, the switch $S_1$ is turned off, the switch $S_2$ is turned on, and the switch $S_3$ is turned off to place the noise-canceling amplifier 91 in FIG. 7 to the amplification mode. Next, the second transfer signal $TX2_i$ is applied to the second transfer gate electrode 32 to transfer signal electrons from the third n-type surface-embedded regions 24 to the second floating-diffusion region 27. This changes the voltage of the second floating-diffusion region 27, so that both fixed pattern noise and reset noise in the pixel $X_{ij}$ are cancelled from the low-sensitivity signal to produce the cancelled version of the low-sensitivity signal in the output of the noise-canceling amplifier 91.

(e) At this timing, the output of the noise-canceling amplifier 91 is supplied to the first input terminal of the comparator 92 in response to the switch $S_4$ being turned off. Since the second reference voltage line $V_{R2}$ supplies the reference voltage $V_{R2}$ to the second input terminal of the comparator 92, the comparator 92 compares the output of the noise-canceling amplifier 91 with the reference voltage $V_{R2}$. The output of the comparator 92 is supplied to the second input terminal of the first AND gate 93. Since the control signal $\phi_{c2}$ is supplied to the first input terminal of the first AND gate 93, the first AND gate 93 performs an AND operation of the output of the comparator 92 and the control signal $\phi_{c2}$. The output of the first AND gate 93 is supplied to the second input terminal of the second AND gate 94. Since the control signal $\phi_4$ is supplied to the first input terminal of the second AND gate 94, the second AND gate 94 performs an AND operation of the output of the first AND gate 93 and the control signal $\phi_4$. The output of the second AND gate 94 is used as the sample-hold signal $\phi_{SH}$ for the switch $S_4$ of the sample-hold circuit. As shown in FIG. 8, if the output of the comparator 92 is "1" while the control signals $\phi_{c2}$ and $\phi_4$ are "1", the sample-hold signal $\phi_{SH}$ in the output of the first AND gate 93 is turned to "1", as indicated by a dashed line, to turn on the switch $S_4$, so that the signal from the charges in the second charge-storage diode AD2 is stored in the replacement-type common sample-hold capacitor $C_3$.

(f) During a horizontal readout period, the horizontal selection signal SH(j) in the j-th column is applied to turn on the switch $S_6$ and read either the high- or low-sensitivity signal stored in the replacement-type common sample-hold capacitor $C_3$ through the horizontal analog output lines $H_a$. At the same time, the horizontal selection signal SH(j) in the j-th column turns on the switch $S_7$ to read an output code of the comparator 92 through the horizontal one-bit digital output line $H_d$ to an external device. The output code of the comparator 92 is needed in order to determine whether the outputted analog signal is from the first charge-storage diode AD1 or the second charge-storage diode AD2 (high- or low-sensitivity signal). This output code is read through the horizontal one-bit digital output line $H_d$ to an external device, and thereafter is used to combine the image with a wide dynamic range in an external circuit.

<Readout Method>

Next, with reference to timing diagrams in FIGS. 9 to 16 and the structure of the pixel $X_{ij}$ shown in FIG. 2 and Part (a) of FIG. 3, the overall timing to read the high- and low-sensitivity signals from all the pixels $X_{11}$ to $X_{1m}$, $X_{21}$ to $X_{2m}$, ..., $X_{i1}$ to $X_{im}$, ..., $X_{n1}$ to $X_{nm}$ is illustrated.

FIGS. 9 to 16 are timing diagrams illustrating that the high-sensitivity signal (H) from the first and second charge-storage diode AD1 and the low-sensitivity signal (L) from the first and second charge-storage diode AD2 are read out based on a rolling shutter operation of a MOS type solid-state image pick-up device. Each horizontal axis in FIGS. 9 to 16 indicates a time scale. In order to facilitate the understanding of explanation, the number of the pixels "n" in the vertical direction of the solid-state image pick-up device is, for example, five (n=5). However, the number of the pixels "n" in the vertical direction may be changed to any number obviously. In addition, although the explanation, such as a vertical blanking period and/or an invalid pixel-readout period, is omitted, these periods can be provided to the appropriate portions as needed.

In the timing diagrams of FIGS. 9 to 16, "H" and "L" indicate the timing of storing/readout for high- and low-sensitivity signals, respectively. A white box indicates a storing period. A box with a hatching sloping upward to the right indicates a readout period in one horizontal cycle period.

Meanwhile, the high- and low-sensitivity signals shown in the timing diagram of FIGS. 9 to 16 are read during the same horizontal readout cycle period (1H) by the circuits and detailed timing described above with reference to FIGS. 5 and 6.

(First Readout Method)

Figure 9:
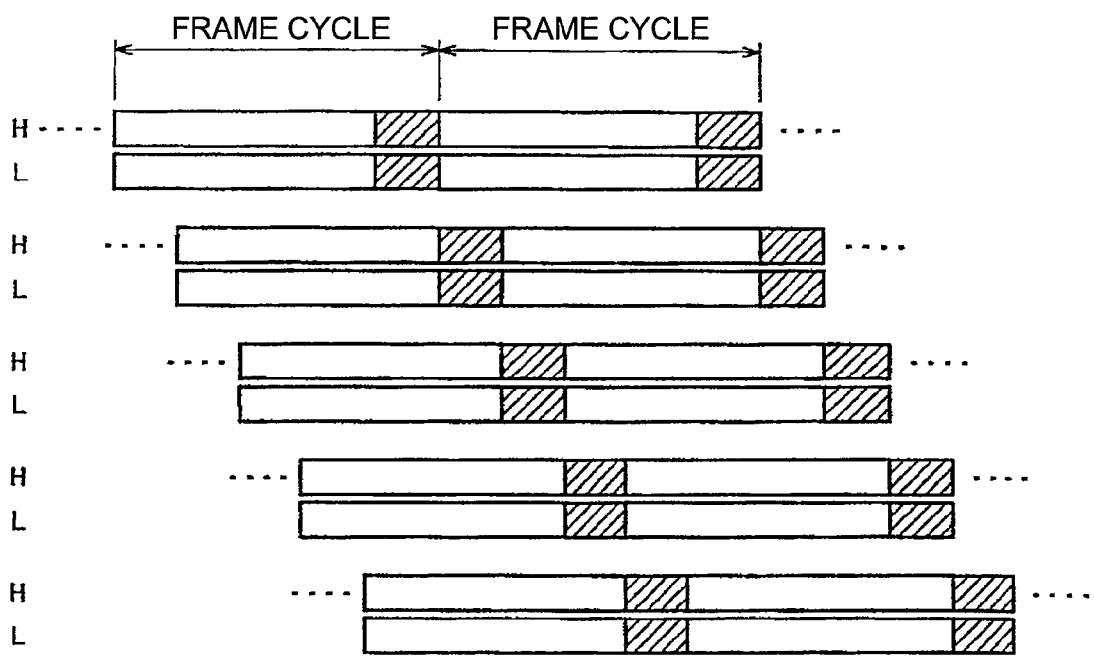
FIG. 9 is a timing diagram illustrating a readout method (first readout method) for the solid-state image pick-up device in accordance with the first embodiment of the present invention.

FIG. 9 shows each timing of the storing period (storing time) and the readout period from a pixel in the first (i-th) row to a pixel in the fifth ((i+4)th) row in series when the high- and low-sensitivity signals are read during the same horizontal readout cycle period (1H).

(Second Readout Method)

Figure 10:
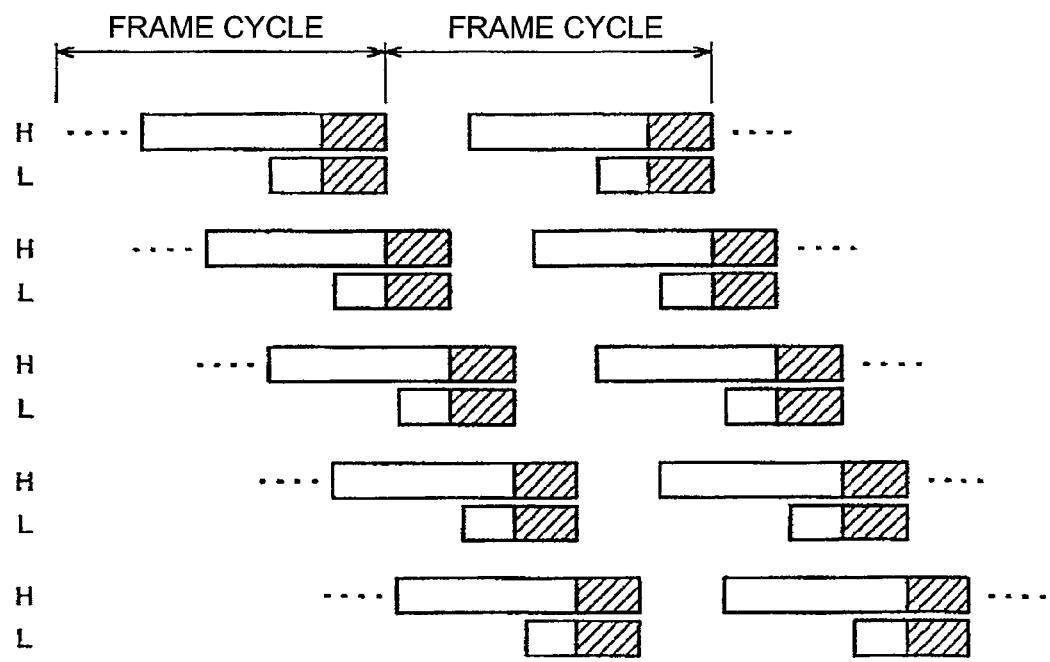
FIG. 10 is a timing diagram illustrating a readout method (second readout method) for the solid-state image pick-up device in accordance with the first embodiment of the present invention.

As shown in FIG. 10, since the sensitivity of the solid-state image pick-up device can be adjusted by use of the storing time for signals, an electronic shutter can be performed by shortening the storing time for each of the high- and low-sensitivity signals. The electronic shutter can be provided by control of the operation of the reset transistor $T_{Rij}$ in the voltage reading buffer amplifier $A_{ij}$ shown in FIG. 2. Accordingly, the reset signal $R_i$ having a high voltage is applied to the reset gate electrode of the reset transistor $T_{Rij}$ to keep the gate of the reset transistor $T_{Rij}$ opened. At this timing, the first transfer signal $TX1_i$ is applied to the first transfer gate electrode 31, and the second transfer signal $TX2_i$ is applied to the second transfer gate electrode 32 to discharge the charges stored in the second and third n-type surface-embedded regions 23 and 24. This may adjust a period for the reset of the second and third n-type surface-embedded regions 23 and 24.

FIG. 2 and Part (a) of FIG. 3 show the structure of the pixel $X_{ij}$ as an approach in which the ratio of the widths of the flow-in paths for photoelectric current changes the ratio of the sensitivity of a signal from the first charge-storage diode AD1 to that from the second charge-storage diode AD2. However, the structure of the pixel $X_{ij}$ shown in FIG. 2 and Part (a) of FIG. 3 is not enough to extremely increase the ratio of the high-sensitivity signal to the low-sensitivity signal merely by the above approach. Therefore, as shown in FIG. 10, the reset transistor $T_{Rij}$ can be used for the electronic shutter to further changes the ratio of the sensitivity by the ratio of the storing time, thereby further enlarging the dynamic range.

(Third Readout Method)

Since the storing time for the high-sensitivity signal is different from that for the low-sensitivity signal in the timing diagram of FIG. 10, the two signals lose their simultaneity to easily cause the distortion for a fast moving object. This problem is therefore dissolved by a readout method shown in the timing diagram of FIG. 11.

Figure 11:
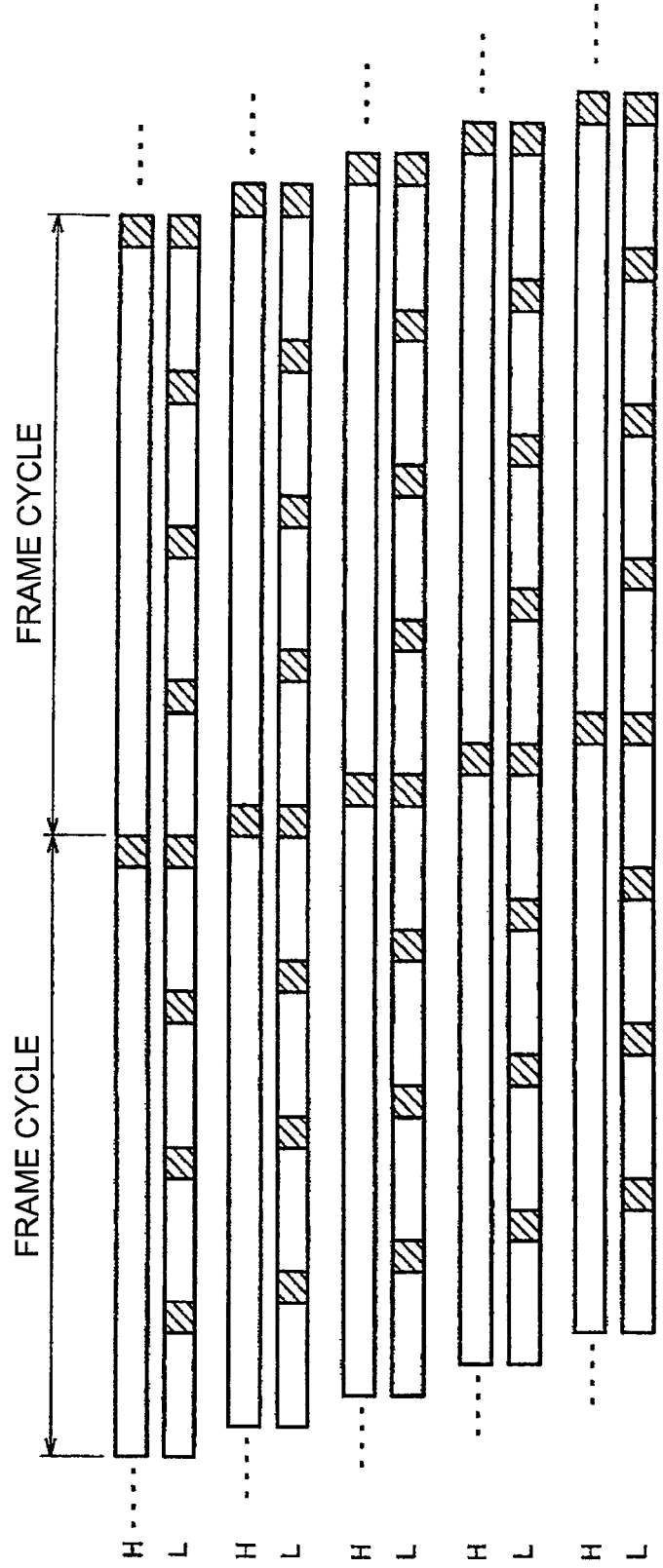
FIG. 11 is a timing diagram illustrating a readout method (third readout method) for the solid-state image pick-up device in accordance with the first embodiment of the present invention.

The timing diagram of FIG. 11 shows a readout method of reducing the readout time for reading signals from all the pixels $X_{11}$ to $X_{1m}$, $X_{21}$ to $X_{2m}$, ..., $X_{i1}$ to $X_{im}$, ..., $X_{n1}$ to $X_{nm}$ of the solid-state image pick-up device to make the operation fast. Accordingly, the timing diagram of FIG. 11 shows the readout method in which the reading time can be reduced four times as fast as that shown in the timing diagram of FIG. 9. Accordingly, the timing diagram of FIG. 11 shows the readout method in which only the low-sensitivity signal can be read multiple times within one frame period after the storing of charges in a short period. FIG. 11 shows the timing diagram for the four reading operations as an example. The short-time stored signals stored for the short time are read out multiple times, and after A-D conversion of the multiple signals, the signals in a digital region are summed up.

The timing diagram of FIG. 11 shows the readout method in which unit storing time for the low-sensitivity signal is shortened to increase the ratio of the sensitivity of the low-sensitivity signal to the high-sensitivity signal. Further, after reading signals multiple times, the combination of these signals can be performed in an external circuit to improve the signal-to-noise ratio of the low-sensitivity signal. Furthermore, the timing diagram of FIG. 11 shows the readout method of summing up the signals by addition to generate the summed value, which is equivalent to those stored over the whole frame period. Therefore, the high- and low-sensitivity signals keep their simultaneity.

(Fourth Readout Method)

Figure 12:
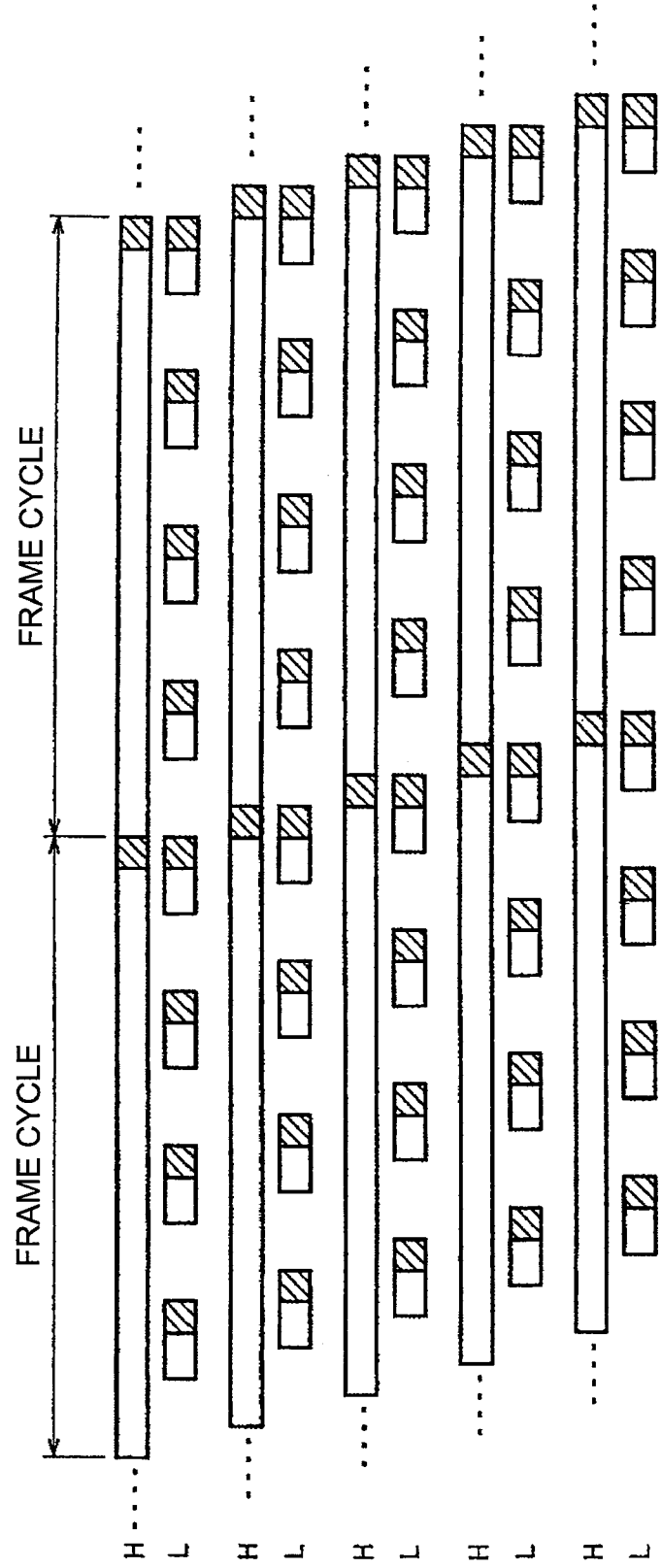
FIG. 12 is a timing diagram illustrating a readout method (fourth readout method) for the solid-state image pick-up device in accordance with the first embodiment of the present invention.

The timing diagram of FIG. 12 shows a readout method, which is based on the readout method shown in FIG. 11 and can increase the ratio of the sensitivity of the two signals by use of the short-time storing operation that uses the electronic shutter to read the low-sensitivity signal. In this timing diagram, compared with the readout method shown in the timing diagram of FIG. 11, the high- and low-sensitivity signals do not perfectly keep their simultaneity. However, the low-sensitivity signal is averaged for one frame period by adding the four signals to improve the simultaneity compared with the timing diagram of FIG. 11.

(Fifth Readout Method)

Figure 13:
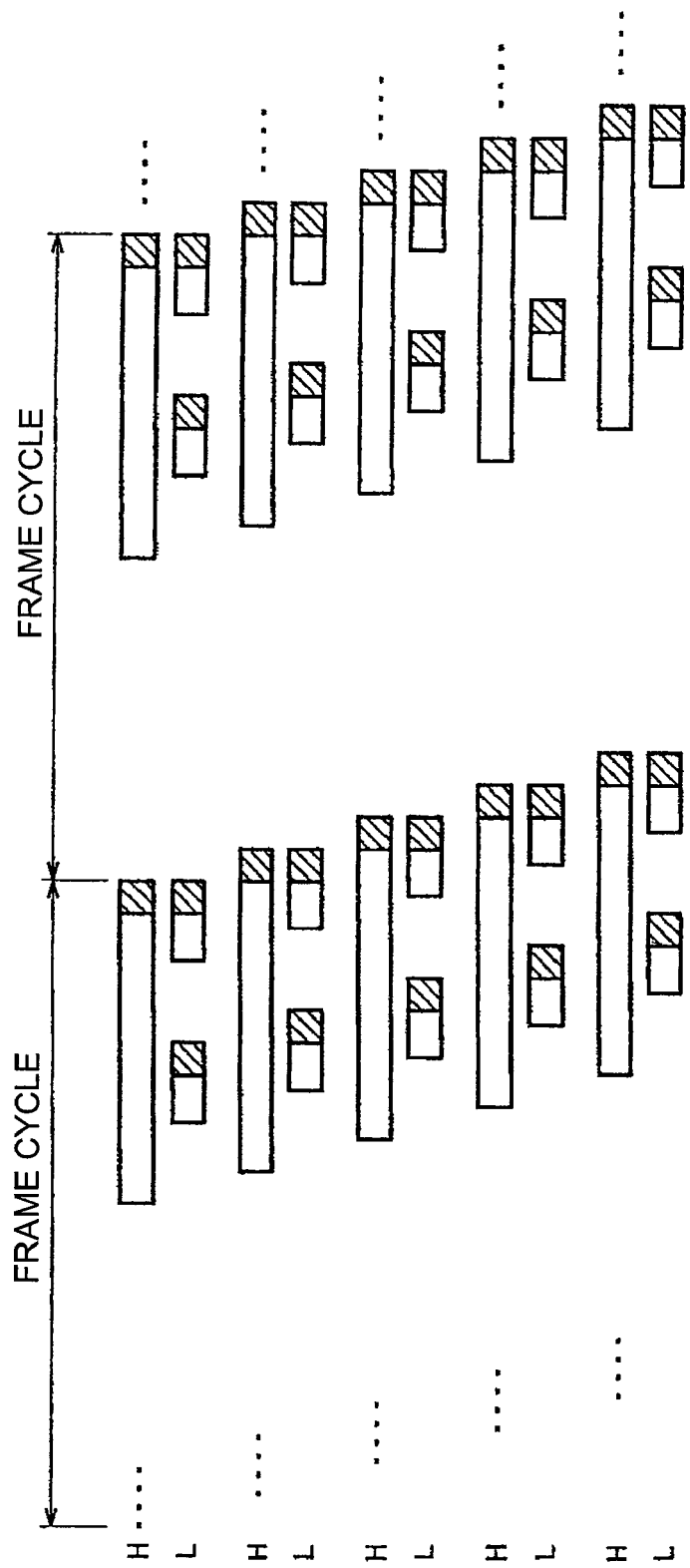
FIG. 13 is a timing diagram illustrating a readout method (fifth readout method) for the solid-state image pick-up device in accordance with the first embodiment of the present invention.

The timing diagram of FIG. 13 shows a readout method, which is based on the readout method that includes a reset operation to shorten the storing time for the low-sensitivity signal in multiple reading operations of the low-sensitivity signal in one frame cycle shown in the timing diagram of FIG. 12, and which also includes the readout timing when the storing time for the high-sensitivity signal is also shortened by the electronic shutter operation. As described above, when the storing time for the high-sensitivity signal is shortened, the low-sensitivity signal may be stored and read out only for the almost same period as the storing/readout time of the low-sensitivity signal. The timing diagram of FIG. 13 shows the readout method in which the unit storing time for the low-sensitivity signal is shortened and only the last two low-sensitivity signals are read.

(Sixth Readout Method)

Figure 14:
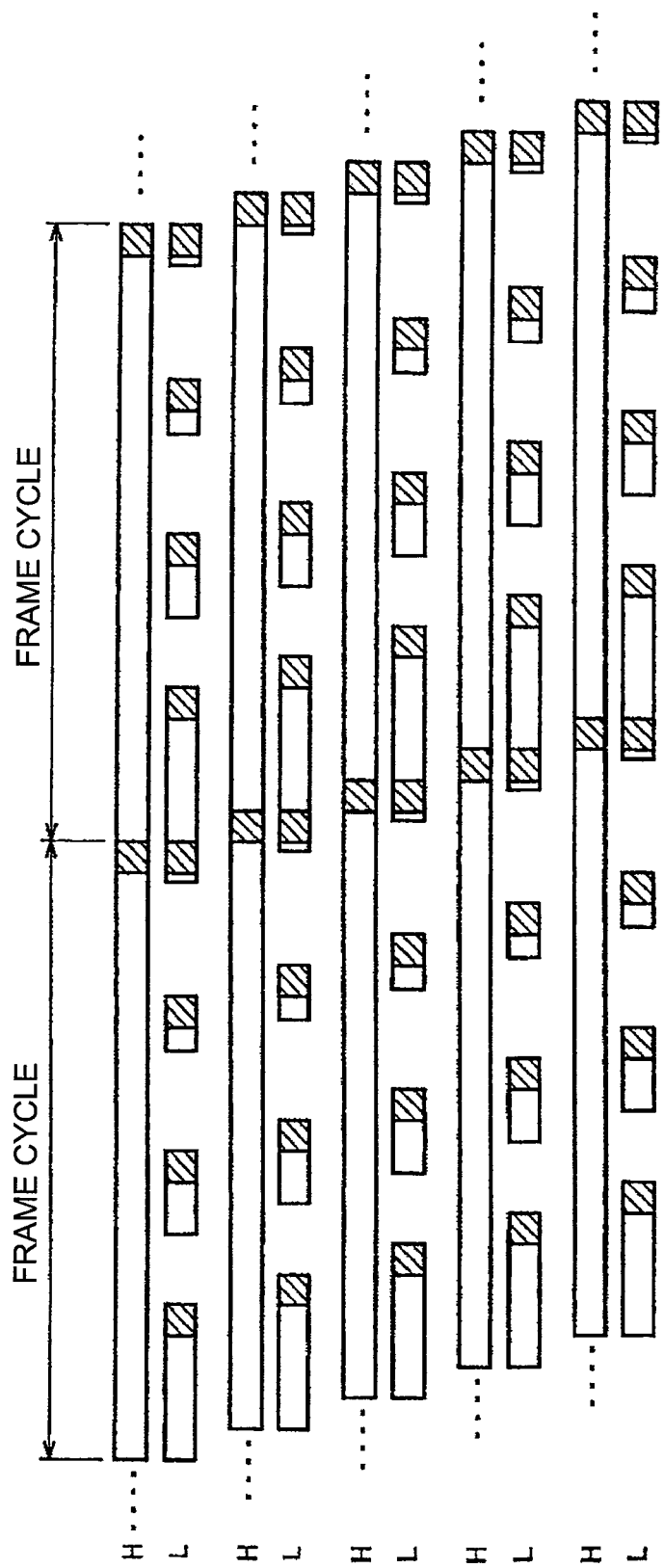
FIG. 14 is a timing diagram illustrating a readout method (sixth readout method) for the solid-state image pick-up device in accordance with the first embodiment of the present invention.

The timing diagram of FIG. 14 shows a readout method in which, in multiple readings of the low-sensitivity signal in one frame period, signals are read out in different storing times. For example, when the dynamic range is enlarged about one thousand times as compared with an image formed by signals through only one storing time, an image is combined with these signals having only two sensitivities to obtain the enlargement, and some regions in the image exhibit extremely low signal-to-noise ratios. This problem can be prevented by a combination of the signals created in the different storing times, or the signals having the different sensitivities. In the timing diagram of FIG. 14, signals in the long storing time are read out first in the reading of the low-sensitivity signals. However, any read-out order may be selected.

(Seventh Readout Method)

Figure 15:
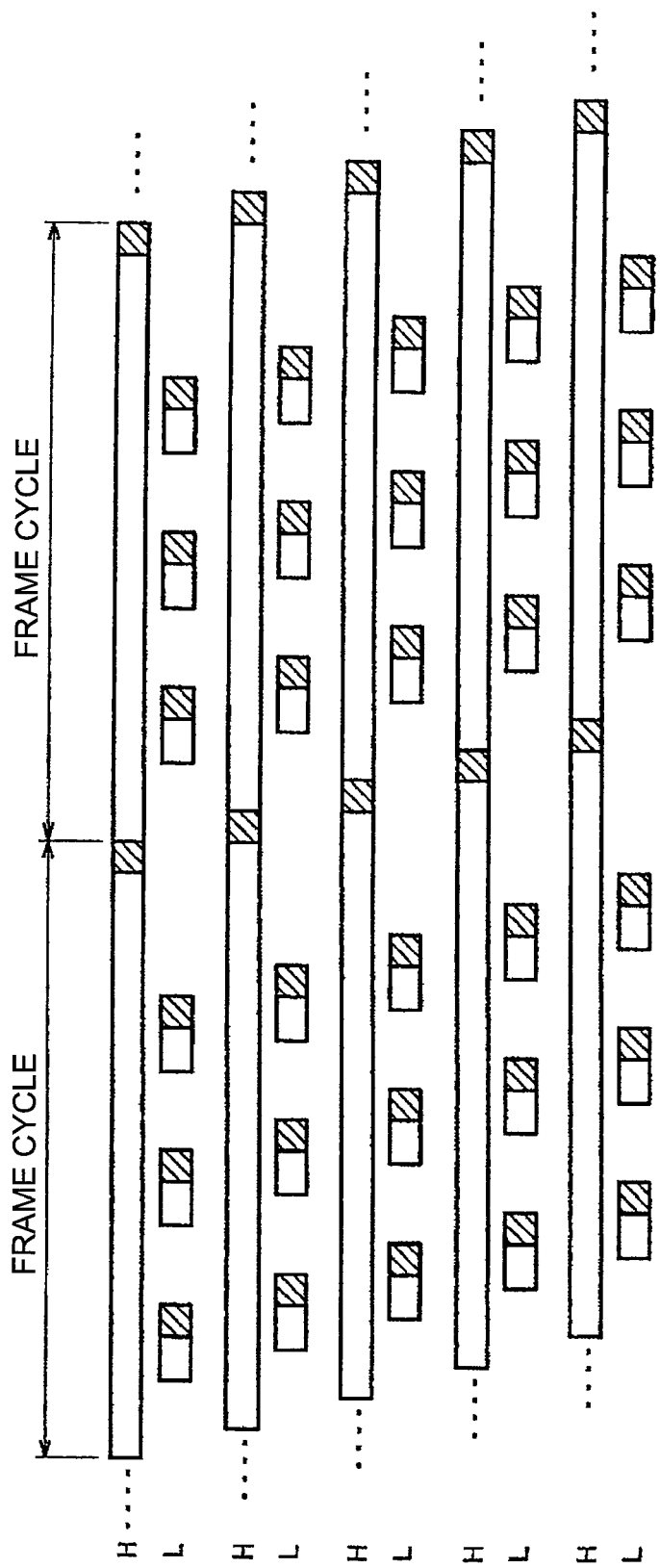
FIG. 15 is a timing diagram illustrating a readout method (seventh readout method) for the solid-state image pick-up device in accordance with the first embodiment of the present invention.

The timing diagram of FIG. 15 shows a readout method in the readout timing in which readout of the high- and low-sensitivity signals in the same horizontal readout cycle period is avoided, and this readout method differs in the readout method that includes a reset operation to shorten the storing time for the low-sensitivity signal when the low-sensitivity signal is read out multiple times for one frame cycle shown in the timing diagram of FIG. 12.

The timing diagram of FIG. 15 shows the readout method that does not read out the low-sensitivity signal in the timing for reading out the high-sensitivity signal and does read out either the high- or low-sensitivity signal in one horizontal cycle period, so that the readout signal is supplied through the single output of the solid-state image pick-up device to an external device. Compared with those of FIGS. 5 and 7, the readout circuit can also be simplified, so that a readout circuit in a general MOS type solid-state image pick-up device can be used for the readout circuit. At this readout method, the charges are transferred from the photodiode PD by operation of the first and second transfer signals $TX1_i$ and $TX2_i$ applied to the first and second transfer gate electrodes 31 and 32, to read the high- and low-sensitivity signals, respectively.

(Eighth Readout Method)

Figure 16:
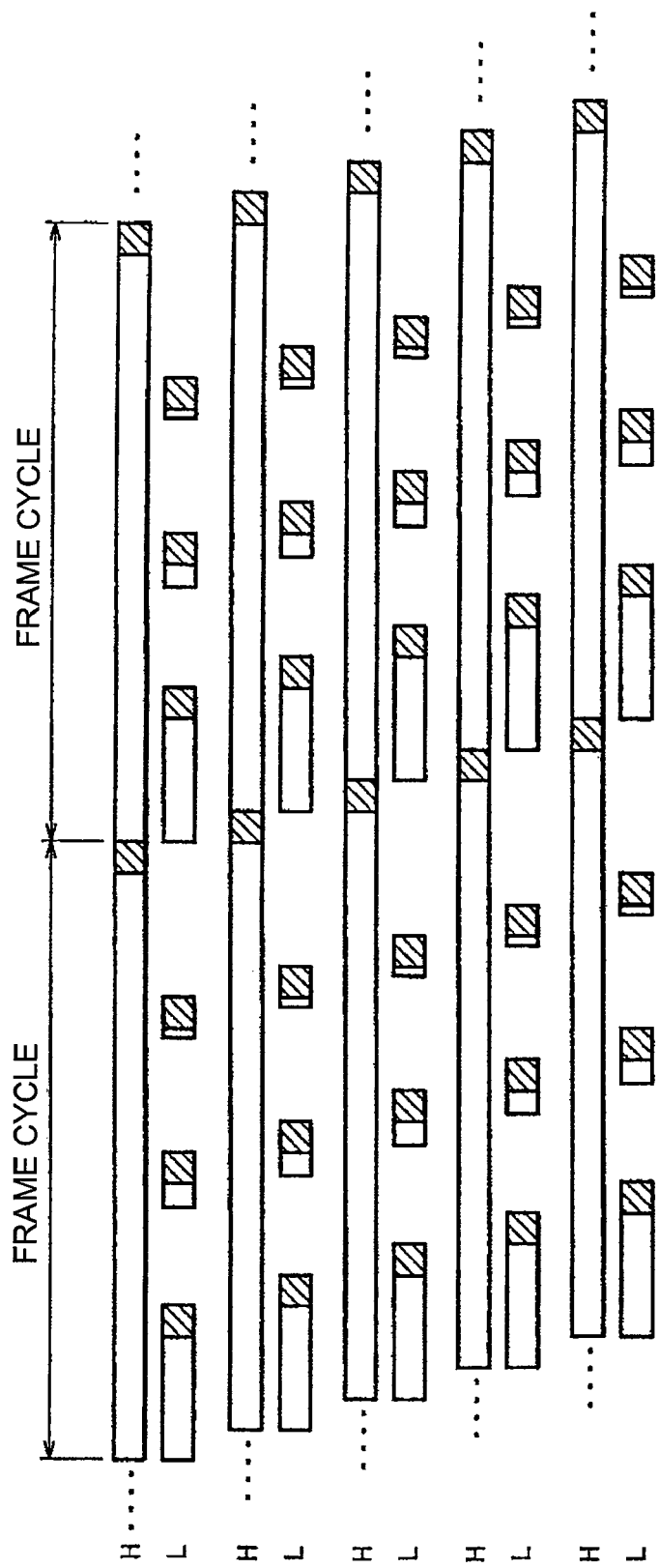
FIG. 16 is a timing diagram illustrating a readout method (eighth readout method) for the solid-state image pick-up device in accordance with the first embodiment of the present invention.

The timing diagram of FIG. 16 shows a readout method which includes preventing the reading of the high- and low-sensitivity signals in the same horizontal readout cycle period, and this readout method differs in the readout method in which the signals are read out through the different storing times shown in the timing diagram of FIG. 14.

The timing diagram of FIG. 16 shows the readout method that does not read the low-sensitivity signal at the timing of reading out the high-sensitivity signal and uses the different storing times for the low-sensitivity signals and does read out either the high- or low-sensitivity signal in one horizontal cycle period. Accordingly, the solid-state image pick-up device supplies the readout signal to an external device through the single output. The readout circuit can also be simplified compared with those of FIGS. 5 and 7, so that a readout circuit of a general MOS type solid-state image pick-up device can be used. At this readout method, charges are transferred from the photodiode PD by operation of the first and second transfer signals $TX1_i$ and $TX2_i$ applied to the first and second transfer gate electrodes 31 and 32 to read the high- and low-sensitivity signals, respectively.

Second Embodiment

Referring to FIG. 1 used for the description of the device in accordance with the first embodiment, a solid-state image pick-up device in accordance with a second embodiment of the present invention includes a pixel array 1 having a number of pixels $X_{ij}$ (i=1 to m; j=1 to n; where m and n are integers) arranged in a two-dimensional matrix; a vertical shift register (vertical scanning circuit) 3 connected through a timing generating circuit 4 to the pixel array on the right side of which the vertical shift register 3 is located; and a bias generating circuit 7 on the lower right side, although its overall structure is omitted in the drawings. A horizontal shift register (horizontal scanning circuit) 2 and a signal processor 5 are provided on the lower side of the pixel array 1, and includes a plurality of column processing circuits $Q_1, Q_2, \ldots, Q_j, \ldots, Q_m$. However, the structure of the pixel $X_{ij}$ in the pixel array 1 is different from that of the solid-state image pick-up device in accordance with the first embodiment.

Figure 17:
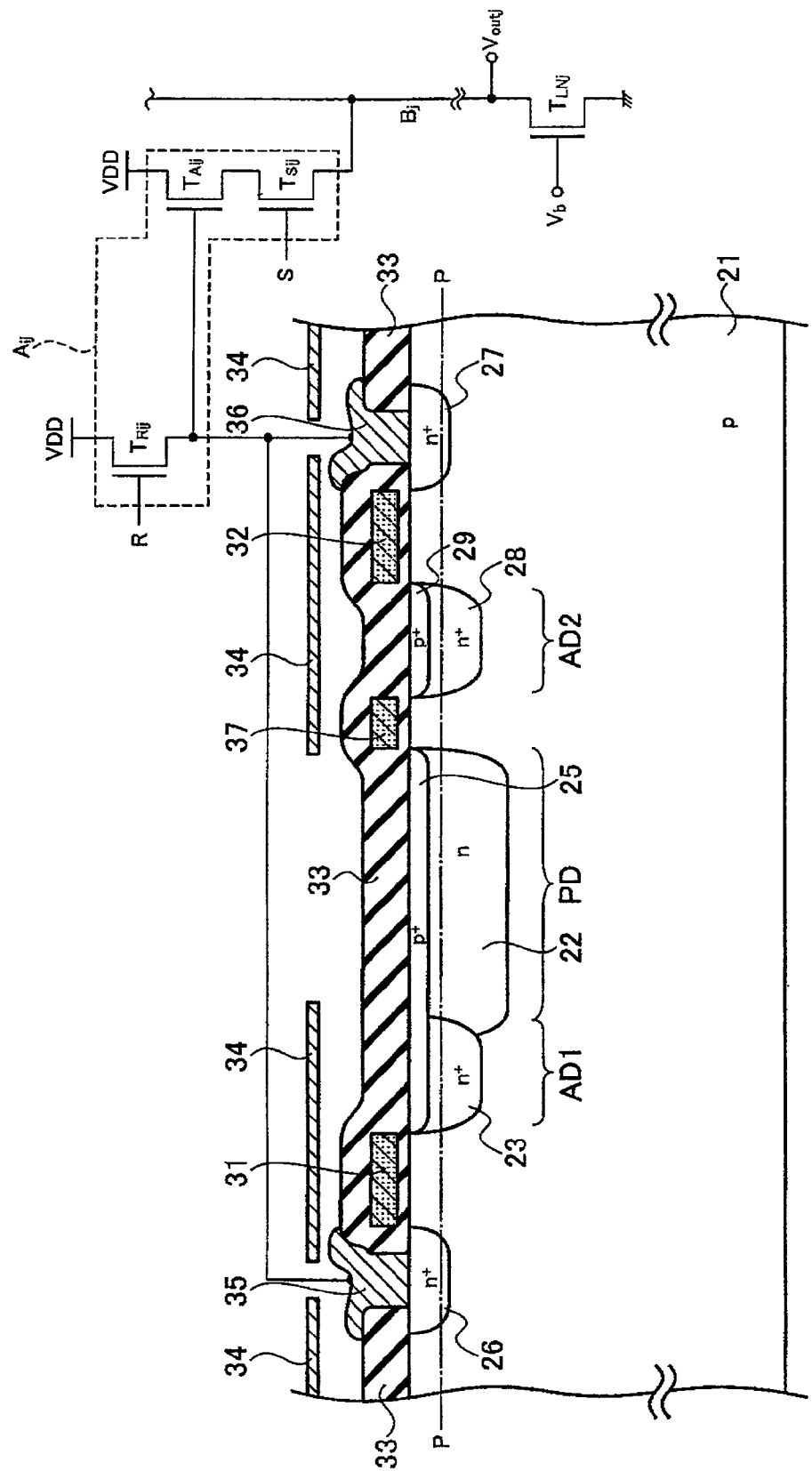
FIG. 17 is a schematic cross-sectional view (taken along the line A-A in FIG. 18) illustrating the structure of a pixel of a solid-state image pick-up device in accordance with a second embodiment of the present invention.
Figure 18:
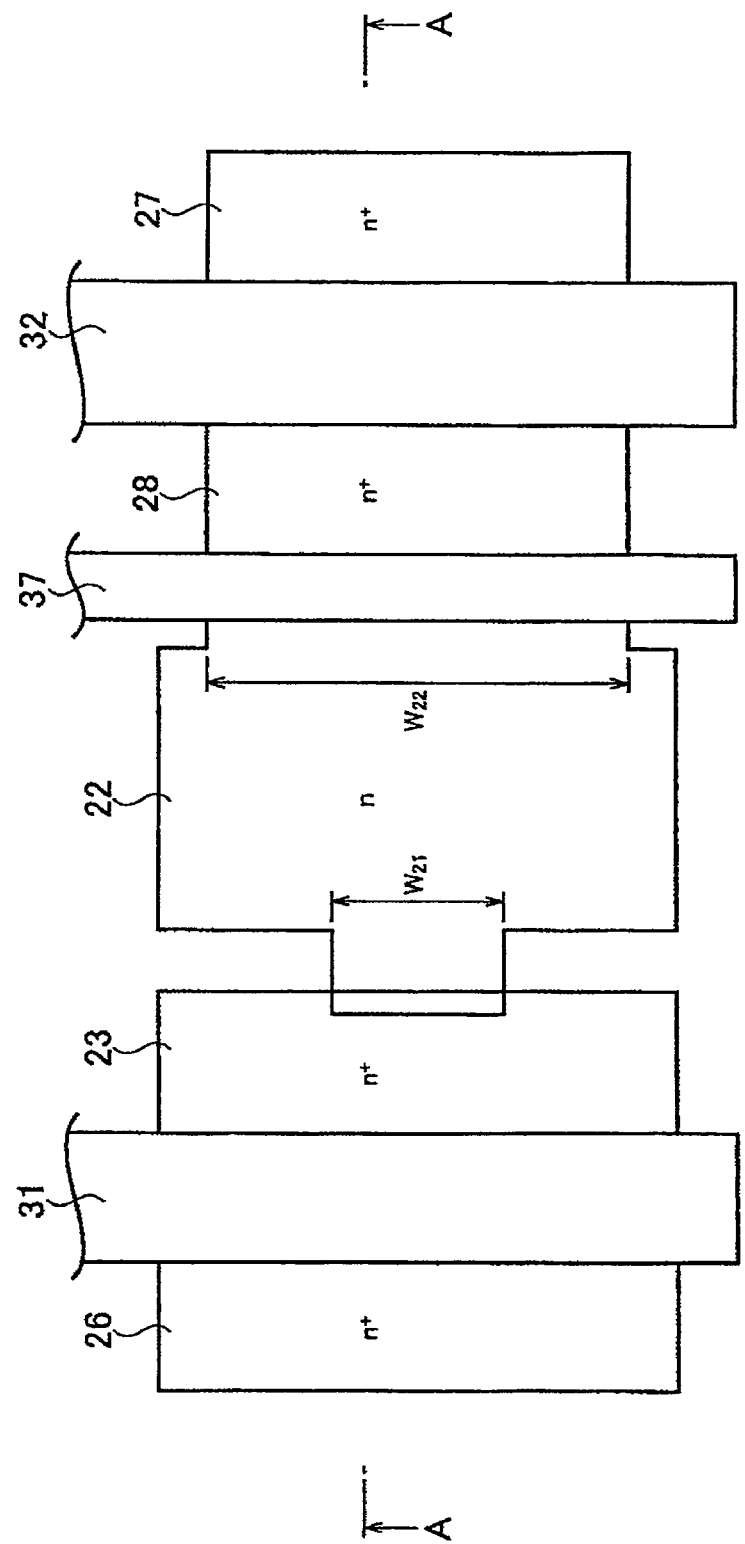
FIG. 18 is a schematic plan view illustrating the structure of a pixel of the solid-state image pick-up device in accordance with the second embodiment of the present invention.

Accordingly, FIGS. 17 and 18 show the cross-sectional structure and planar structure, respectively, and the structure of the solid-state image pick-up device in accordance with the second embodiment corresponds to a structure which is provided with a charge flow-in control gate 37, such as a MOS gate, which controls charges flowing into the second charge-storage diode AD2 in the pixel $X_{ij}$ of the solid-state image pick-up device in accordance with the first embodiment shown in FIG. 2 and Part (a) of FIG. 3.

Specifically, as shown in FIGS. 17 and 18, a first charge-storage diode AD1 is provided on the left of a photodiode PD. At the right side, a second charge-storage diode AD2 is disposed away from the photodiode PD. The first charge-storage diode AD1 includes a second n-type surface-embedded region 23 in contact with the left side of a first n-type surface-embedded region 22 in the photodiode PD, and an anode region composed of a part of the p-type semiconductor substrate (the semiconductor region of the first conductivity type) 21 provided below the second n-type surface-embedded region 23. The second charge-storage diode AD2 includes a third n-type surface-embedded region 28 provided the p-type semiconductor substrate (the semiconductor region of the first conductivity type) 21 which has a part which is sandwiched by the third n-type surface-embedded region 28 and the right side of the first n-type surface-embedded region 22 in the photodiode PD, and an anode region composed of a part of the p-type semiconductor substrate (the semiconductor region of the first conductivity type) 21 provided below the third n-type surface-embedded region 28. The second and third n-type surface-embedded regions 23 and 28 may be n-type semiconductor regions having a relatively high impurity density between about $5 \times 10^{16}$ and about $1 \times 10^{19}$ cm$^{-3}$. Above the second n-type surface-embedded region 23, a p-type pinning layer 25 extends from the upper portion of the photodiode PD to the left. Above the third n-type surface-embedded region 28, a p-type pinning layer 29 is provided. The p-type pinning layers 25 and 29 suppress the generation of carriers on the surface. However, in applications in which dark current is not of interest in use, the p-type pinning layers 25 and 29 may be omitted.

A part of the p-type semiconductor substrate (the semiconductor region of the first conductivity type) 21 is provided between the first and third n-type surface-embedded regions 22 and 28, and above the part of the p-type semiconductor substrate, the charge flow-in control gate 37 is formed. Therefore, a MOS transistor for controlling charge flow-in includes the first n-type surface-embedded region 22 for a source region, the third n-type surface-embedded region 28 for a drain region, the surface of the p-type semiconductor substrate (the semiconductor region of the first conductivity type) 21 provided for a channel between the first and third n-type surface-embedded regions 22 and 28 region, and the charge flow-in control gate 37 for a MOS gate.

Figure 19:
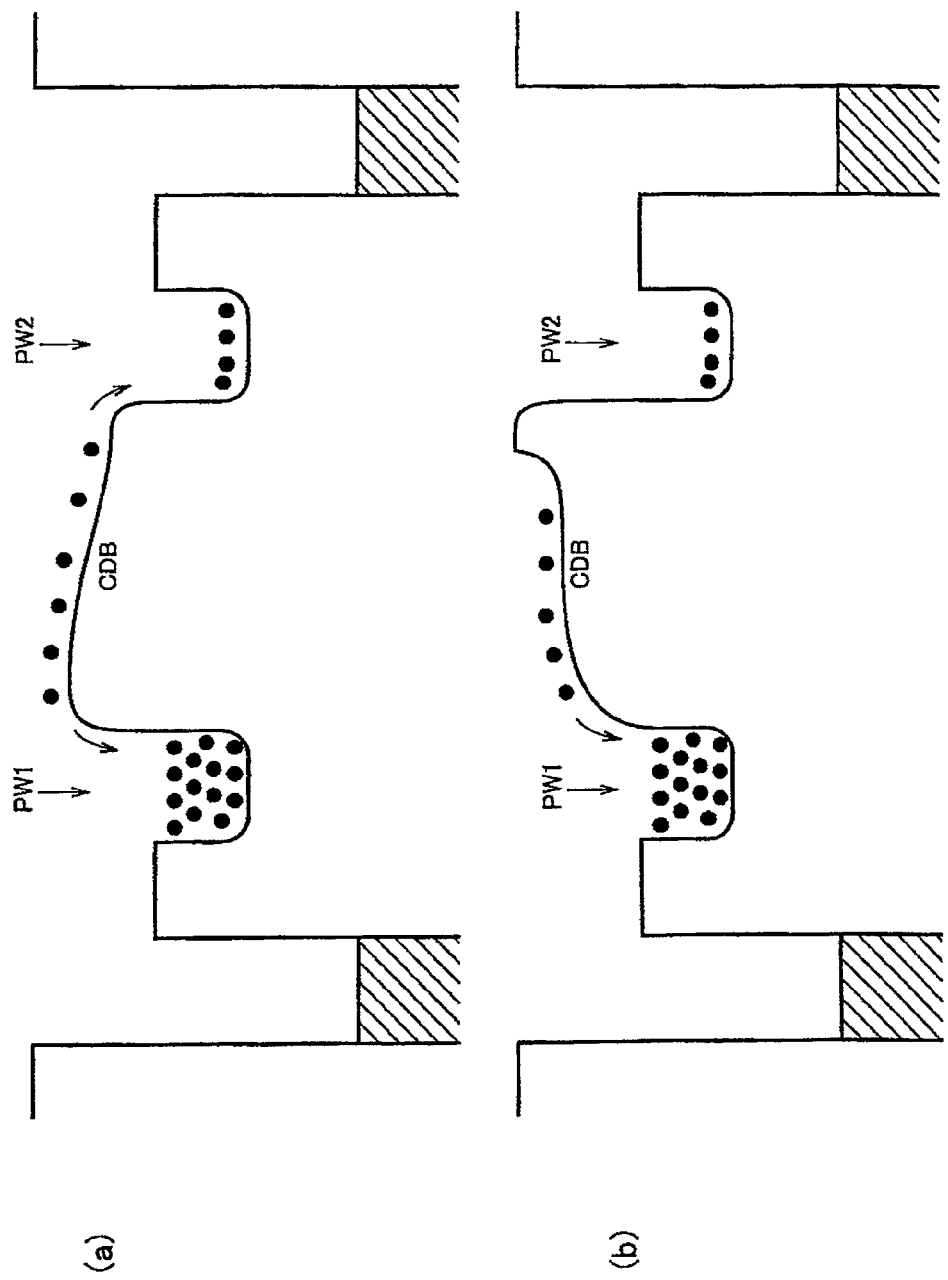
FIG. 19 is a potential diagram of the cross section, taken along a P-P plane indicated by a dashed line shown in FIG. 17, in which a first floating-diffusion region, a second n-type surface-embedded regions, a first n-type surface-embedded region, a third n-type surface-embedded regions, and a second floating-diffusion region are shown.

FIG. 19 is a potential diagram in the cross section, taken along a P-P plane indicated by a chain line in FIG. 17, showing a first floating-diffusion region 26, the second n-type surface-embedded regions 23, the first n-type surface-embedded region 22, the third n-type surface-embedded regions 28, and a second floating-diffusion region 27. Filled circles indicates charges (electrons). The middle of FIG. 19 denotes a potential distribution of conduction band edge of the first n-type surface-embedded region 22 of a charge-distributing-potential barrier CDB. A first potential well PW1 resides on the left. Furthermore, a potential well of the first floating-diffusion region 26, indicated by hatching sloping upward to the right, resides on the left of the first potential well PW1. A rectangular potential barrier between the first potential well PW1 and the potential well of the first floating-diffusion region 26 corresponds to a potential distribution of conduction band edge of the p-type semiconductor substrate (the semiconductor region of the first conductivity type) 21 just below the first transfer gate electrode 31. Similarly, a second potential well PW2 resides on the right of the charge-distributing-potential barrier CDB. Furthermore, a potential well of the second floating-diffusion region 27, indicated by hatching sloping upward to the right, resides on the right of the second potential well PW2. A rectangular potential barrier between the second potential well PW2 and the potential well of the second floating-diffusion region 27 corresponds to a potential distribution of conduction band edge of the p-type semiconductor substrate (the semiconductor region of the first conductivity type) 21 just below the second transfer gate electrode 32.

The height of the potential between the right of the charge-distributing-potential barrier CDB and the second potential well PW2 is controlled by a charge flow-in control signal SP applied to the charge flow-in control gate 37. Accordingly, in order to lower the potential barrier from the photodiode PD to the second charge-storage diode AD2, the potential at the shoulder of the charge-distributing-potential barrier CDB on the second potential well is electrostatically controlled by the charge flow-in control signal SP applied through a gate-insulating layer. A high voltage for the charge flow-in control signal SP is applied to the charge flow-in control gate 37, as shown in Part (a) of FIG. 19, so that a part of the photoelectric current flows into the third n-type surface-embedded region 28.

On the other hand, in order to raise the potential barrier on the surface of the p-type semiconductor substrate (the semiconductor region of the first conductivity type) 21 just below the charge flow-in control gate 37 between the right side of the charge-distributing-potential barrier CDB and the second potential well PW2, a low voltage for the charge flow-in control signal SP is applied to the charge flow-in control gate 37, as shown in Part (b) of FIG. 19, so that the photoelectric current flows into only the first charge-storage diode AD1.

In the first charge-storage diode AD1 having the potential well filled with charges, the voltage of the first transfer signal $TX1_i$ is applied to the first transfer gate electrode 31 such that charges flow into the first floating-diffusion region 26. This application of the voltage can prevent overflow of the charges toward the second charge-storage diode AD2 even if the first charge-storage diode AD1 is filled with charges. In the second charge-storage diode AD2 filled with charges, the voltage of the second transfer signal $TX2_i$ is applied to the second transfer gate electrode 32 such that the charges flow into the second floating-diffusion region 27.

In the solid-state image pick-up device in accordance with the second embodiment, the channel region just below the charge flow-in control gate 37 may generate a dark current. In order to reduce this dark current, for example, a positive voltage of about 1 volt for the charge flow-in control signal SP may be applied to the charge flow-in control gate 37 to enable the charges to flow into the second charge-storage diode AD2. Further, in order to close the charge flow-in control gate 37, a negative voltage of about −1 volt for the charge flow-in control signal SP may be applied to the charge flow-in control gate 37 to enable the charges to flow into the first charge-storage diode AD1. The charge flow-in control signal SP of −1 volt is applied to accumulate high-density holes in the channel region just below the charge flow-in control gate 37, which can reduce the occurrence of the dark current. Therefore, in the solid-state image pick-up device in accordance with the second embodiment, the dark current can be reduced, particularly to a high-sensitivity signal (used for a low illumination intensity range).

Meanwhile, a negative voltage of about −1 volt can be applied to the first and second transfer signals $TX1_i$ and $TX2_i$ during a charge-storing time to operate the first and second transfer gate electrodes 31 and 32, respectively, which reduces the dark current effectively. However, in the application of a voltage of −1 volts to the first and second transfer signal $TX1_i$ and $TX2_i$ and to the charge flow-in control gate 37 during the storing, there is no difference in potential barrier between both sides of the first potential well PW1 and between both sides of the second potential well PW2. It is therefore preferred that a voltage of, for example, about −0.5 volts is applied to the first and second transfer signals $TX1_i$ and $TX2_i$ while a voltage of −1 volts that is somewhat lower than this voltage is applied to the charge flow-in control gate 37.

The ratio of the sensitivity of charges stored in the first charge-storage diode AD1 for light to those in the second charge-storage diode AD2 can be changed by the channel widths of the MOS transistors that control charges flowing out to the second charge-storage diode AD2. However, this ratio can also be changed by a period in which the charge flow-in control signal SP is applied to the charge flow-in control gate 37.

The ratio of a time $T_{sp}$ to an overall storing time $T_F$ is referred to as $T_{sp}/T_F$, and in the time $T_{sp}$, charges flow out to the second charge-storage diode AD2 by applying a high voltage for the charge flow-in control signal SP to the charge flow-in control gate 37 to vanish the potential barrier. The ratio of charges $Q_{D2}$ to charges $Q_{D1}$ is referred to as R, charges $Q_{D2}$ are stored in the second charge-storage diode AD2, and the sum ($=Q_{D1}+Q_{D2}$) of charges $Q_{D1}$ are stored in the first charge-storage diode AD1 and the charge $Q_{D2}$ stored in the second charge-storage diode AD2. The photoelectric current is referred to as $I_{ph}$. The charges $Q_{D1}$ and $Q_{D2}$ stored respectively in the first and second charge-storage diode AD1 and AD2 are derived from the following Formulas (1) and (2):

$$Q_{D1}=T_F I_{ph} - R T_{SP} I_{ph} \quad (1)$$

$$Q_{D2}=R T_{SP} I_{ph} \quad (2)$$

The ratio R is defined in the application of a high voltage for the charge flow-in control signal SP to the charge flow-in control gate 37, and represents "a distribution ratio" of charges flowing out at the above voltage with respect to the overall charges stored for the storing time $T_F$. The distribution ratio R and the time $T_{SP}$ for a charge flowing out to the second charge-storage diode AD2 can be adjusted, as shown in Part (b) of FIG. 4, to enable the charge $Q_{D2}$ in the second charge-storage diode AD2 to be a significant signal in a high illumination.

FIG. 18 is a plane view, shown as the planar structure of the pixel $X_{ij}$ of the solid-state image pick-up device in accordance with the second embodiment, of the first n-type surface-embedded region 22 drawn in a polygon (dodecagon) with projections. The width $W_{22}$ of the right projection of the first n-type surface-embedded region 22 is narrower than the width $W_{21}$ of the left projection of the first n-type surface-embedded region 22. In the plane pattern of the first n-type surface-embedded region 22, the right projection of the first n-type surface-embedded region 22 faces the third n-type surface-embedded region 28, and the left projection of the first n-type surface-embedded region 22 is in the crossover of plane patterns of the first and second n-type surface-embedded regions 22 and 23. Accordingly, in the plan view of FIG. 18, charges flow into the first charge-storage diode AD1 through a flow-in path having the width $W_{21}$, which is narrower than the gate width $W_{22}$ of the charge flow-in control gate 37. The structure of the plane pattern shown in FIG. 18 can be employed to apply a high voltage of the charge flow-in control signal SP to the charge flow-in control gate 37 to eliminate the potential barrier just below the charge flow-in control gate 37, which produces a potential distribution such that most of the charges (electrons) generated in the photodiode PD can flow into the second charge-storage diode AD2 efficiently.

Accordingly, the structure of the pixel in the solid-state image pick-up device in accordance with the second embodiment can increase the distribution ratio R from the photodiode PD to the first and second charge-storage diodes AD1 and AD2, which results in the reduction of the effect of variations in the distribution ratios R of the pixels.

Figure 20:
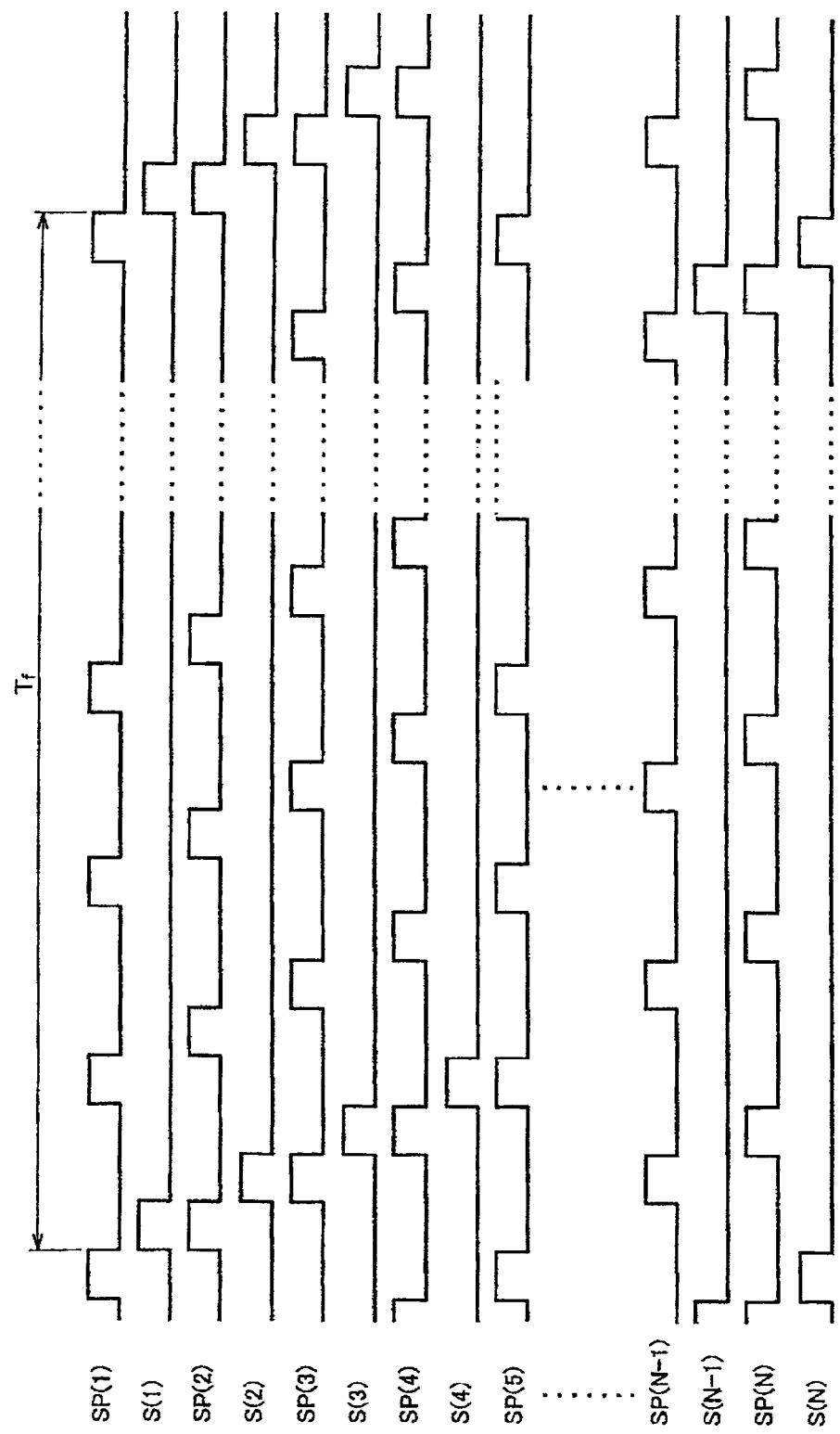
FIG. 20 is a timing diagram illustrating the operation of the column processing circuit in the j-th column of the solid-state image pick-up device in accordance with the second embodiment of the present invention.

The method of reading a signal in the solid-state image pick-up device in accordance with the second embodiment will be described with reference to a timing diagram in FIG. 20. In the timing diagram in FIG. 20, the voltage of the charge flow-in control signal SP is switched to a high voltage repeatedly every certain period such that $T_{SP}/T_F = 1/4$ is satisfied. In FIG. 20, a charge flow-in control signal SP(i) is shown as a signal waveform of the charge flow-in control signal SP applied to the i-th row in the solid-state image pick-up device. The vertical selection signal S(i) is supplied for the readout of the i-th row (i=1, 2, 3, . . . , N−1, N). In this way, the same charge flow-in control signal SP may be applied to pixels in the same row. In the timing diagram of FIG. 20, the relatively shorter storing time for storing the low-sensitivity signal can keep the almost correct simultaneity and the storing the high-sensitivity signal without using the fast signal-readout operations shown in FIGS. 11 to 16. In FIG. 20, the pulse widths of the charge flow-in control signal SP(i) and vertical selection signal S(i) correspond to one horizontal readout cycle. The method shown in the timing diagram of FIG. 20 can eliminate the effect of switching noise caused by the repeated application of the charge flow-in control signal SP.

Third Embodiment

Referring to FIG. 1 used for the description of the device in accordance with the first and second embodiments, a solid-state image pick-up device in accordance with a third embodiment of the present invention includes a pixel array 1 having a number of pixels $X_{ij}$ (i=1 to m; j=1 to n; where m and n are integers) arranged in a two-dimensional matrix; a vertical shift register (vertical scanning circuit) 3 through a timing generating circuit 4 on the left of the pixel array 1; and a bias generating circuit 7 on the lower right side. On the lower side of the pixel array 1, a horizontal shift register (horizontal scanning circuit) 2 and a signal processor 5 are provided, and the signal processor 5 includes a plurality of column processing circuits $Q_1, Q_2, \ldots, Q_j, \ldots, Q_m$.

Figure 21:
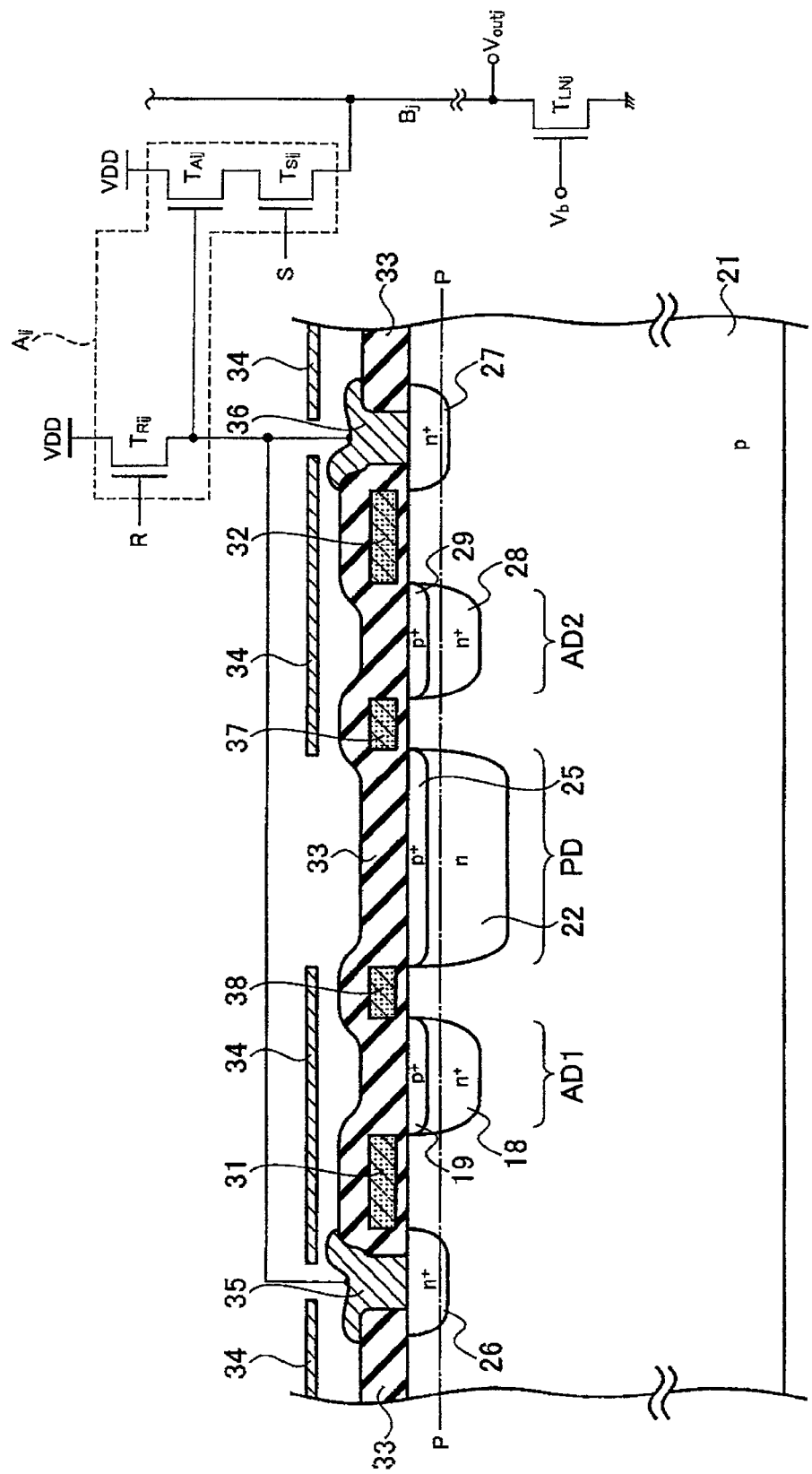
FIG. 21 is a schematic cross-sectional view (taken along the line A-A in FIG. 22) illustrating the structure of a pixel of a solid-state image pick-up device in accordance with a third embodiment of the present invention.
Figure 22:
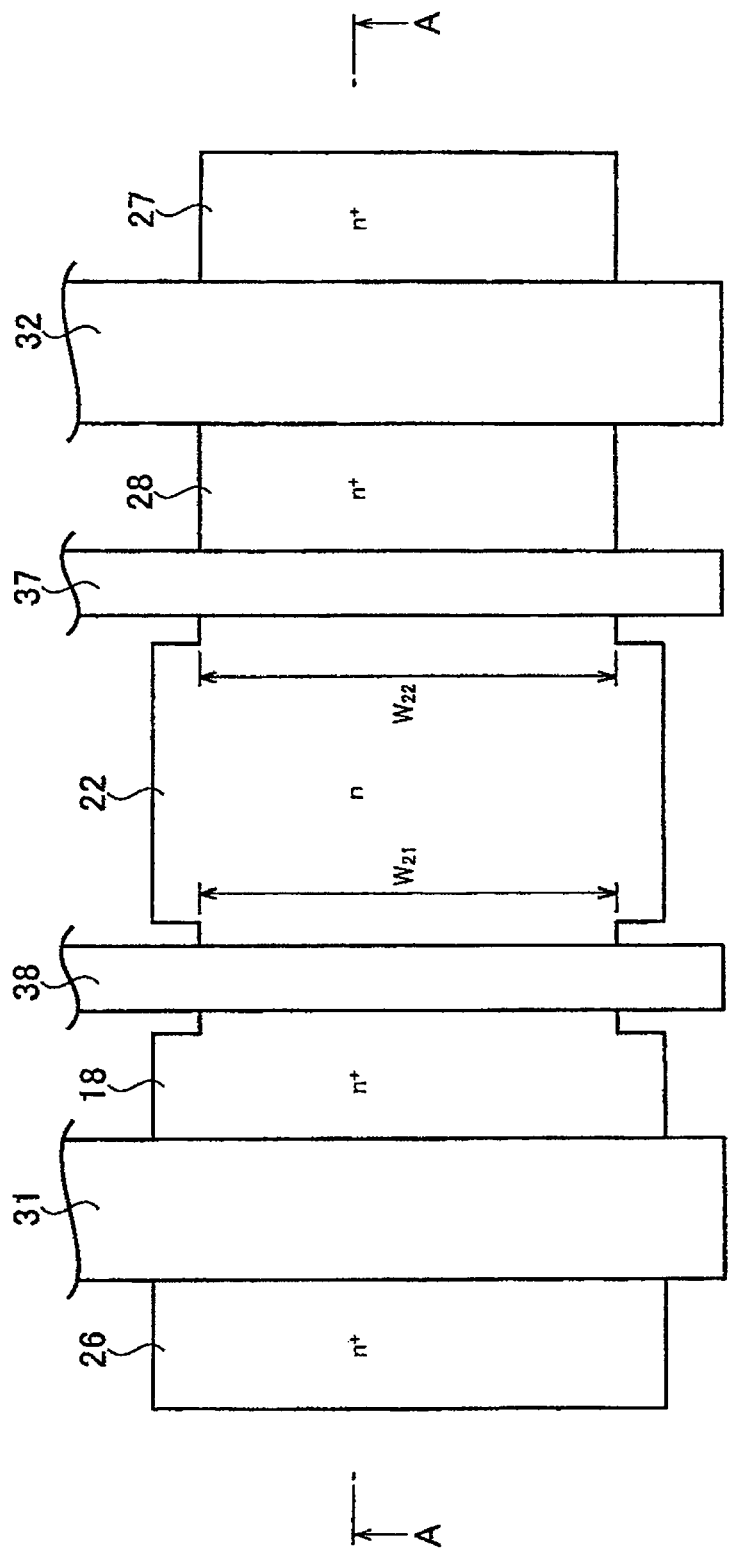
FIG. 22 is a schematic plan view illustrating the structure of a pixel of the solid-state image pick-up device in accordance with the third embodiment of the present invention.

However, in the solid-state image pick-up device in accordance with the third embodiment, as shown in FIGS. 21 and 22, the structure of the pixel $X_{ij}$ in the pixel array 1 further includes a high-sensitivity charge flow-in control gate (second charge flow-in control gate) 38 for controlling the charges flowing into a first charge-storage diode AD1 in addition to the charge flow-in control gate for controlling the charges flowing into the second charge-storage diode AD2 described in the second embodiment (the charge flow-in control gate for controlling the charges flowing into the second charge-storage diode AD2 in the device in accordance with the third embodiment is referred to as "a low-sensitivity charge flow-in control gate (first charge flow-in control gate) 37" in order to distinguish the high-sensitivity charge flow-in control gate (second charge flow-in control gate) 38).

Accordingly, in the pixel $X_{ij}$ of the device in accordance with the third embodiment, as shown in FIGS. 21 and 22, the first charge-storage diode AD1 is located away from a photodiode PD at the left of the photodiode PD, and the second charge-storage diode AD2 is located away from a photodiode PD at the right of the photodiode PD. The first charge-storage diode AD1 includes a second n-type surface-embedded region 18 provided on a p-type semiconductor substrate (a semiconductor region of a first conductivity type) 21 a part of which is sandwiched by the second n-type surface-embedded region 18 and the left side of a first n-type surface-embedded region 22, and an anode region of a part of the p-type semiconductor substrate (the semiconductor region of the first conductivity type) 21 provided below the second n-type surface-embedded region 18.

The second charge-storage diode AD2 includes a third n-type surface-embedded region 28 provided on the p-type semiconductor substrate (the semiconductor region of the first conductivity type) 21 a part of which is sandwiched by third n-type surface-embedded region 28 and the right side of the first n-type surface-embedded region 22 in the photodiode PD, and an anode region composed of a part of the p-type semiconductor substrate (the semiconductor region of the first conductivity type) 21 provided below the third n-type surface-embedded region 28. The second and third n-type surface-embedded regions 18 and 28 are made of n-type semiconductor having a relatively high impurity density between about $5 \times 10^{16}$ and about $1 \times 10^{19}$ cm$^{-3}$. P-type pinning layers 19 and 29 are provided above the second and third n-type surface-embedded regions 18 and 28, respectively. In applications in which the dark current is not of interest in use, the p-type pinning layers 19, 25 and 29 may be omitted from the structure of the pixels.

Above the part of the p-type semiconductor substrate (the semiconductor region of the first conductivity type) 21 between the first and second n-type surface-embedded regions 22 and 18, the high-sensitivity charge flow-in control gate (second charge flow-in control gate) 38 is formed. Therefore, a MOS transistor for controlling a high-sensitivity charge flow includes the first n-type surface-embedded region 22 of a source region, the second n-type surface-embedded region 18 of a drain region, the surface of the p-type semiconductor substrate (the semiconductor region of the first conductivity type) 21 of a channel region between the first and second n-type surface-embedded regions 22 and 18, and the high-sensitivity charge flow-in control gate (second charge flow-in control gate) 38 of a MOS gate. On the other hand, above the part of the p-type semiconductor substrate (the semiconductor region of the first conductivity type) 21 between the first and third n-type surface-embedded regions 22 and 28, the low-sensitivity charge flow-in control gate (first charge flow-in control gate) 37 is formed. Therefore, a MOS transistor for controlling a low-sensitivity charge flown includes the first n-type surface-embedded region 22 of a source region, the third n-type surface-embedded region 28 of a drain region, the surface of the p-type semiconductor substrate (the semiconductor region of the first conductivity type) 21 of a channel region between the first and third n-type surface-embedded regions 22 and 28, and the low-sensitivity charge flow-in control gate (first charge flow-in control gate) 37 of a MOS gate.

Figure 23:
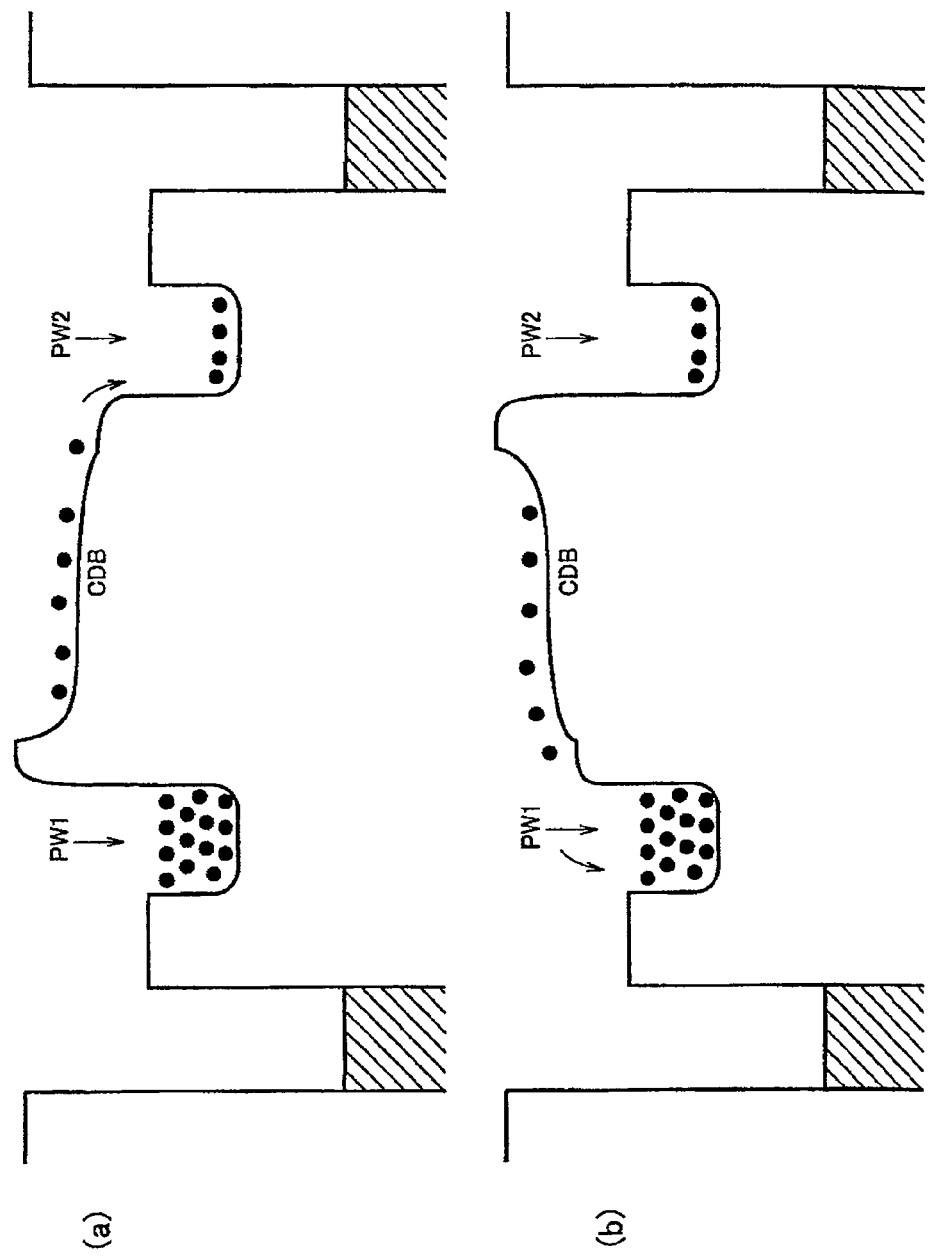
FIG. 23 is a potential diagram of the cross section, taken along a P-P plane indicated by a chain line in FIG. 21, a first floating-diffusion region, a second n-type surface-embedded regions, a first n-type surface-embedded region, a third n-type surface-embedded regions, and a second floating-diffusion region are shown.

FIG. 23 is a potential diagram in the cross section, taken along a P-P plane indicated by a chain line in FIG. 21, showing a first floating-diffusion region 26, the second n-type surface-embedded regions 18, the first n-type surface-embedded region 22, the third n-type surface-embedded regions 28, and a second floating-diffusion region 27. Filled circles indicate charges (electrons). The middle in FIG. 23 denotes a potential distribution of conduction band edge of the first n-type surface-embedded region 22 of a charge-distributing-potential barrier CDB. A first potential well PW1 resides at the left. Further, a potential well of the first floating-diffusion region 26, indicated by hatching sloping upward to the right, resides on the left of the first potential well PW1. A rectangular potential barrier between the first potential well PW1 and the potential well of the first floating-diffusion region 26 corresponds to a potential distribution of conduction band edge of the p-type semiconductor substrate (the semiconductor region of the first conductivity type) 21 just below the first transfer gate electrode 31. Similarly, a second potential well PW2 resides at the right of the charge-distributing-potential barrier CDB. Further, a potential well of the second floating-diffusion region 27, indicated by hatching sloping upward to the right, resides on the right of the second potential well PW2. A rectangular potential barrier between the second potential well PW2 and the potential well of the second floating-diffusion region 27 corresponds to a potential distribution of conduction band edge of the p-type semiconductor substrate (the semiconductor region of the first conductivity type) 21 just below the second transfer gate electrode 32.

The height of the potential between the left side of the charge-distributing-potential barrier CDB and the first potential well PW1 is controlled by a high-sensitivity charge flow-in control signal SP1 applied to the high-sensitivity charge flow-in control gate (second charge flow-in control gate) 38. Accordingly, as shown in FIG. 23, the potential at the shoulder of the charge-distributing-potential barrier CDB on the first potential well is electrostatically controlled by the high-sensitivity charge flow-in control signal SP1 applied through a gate-insulating layer.

On the other hand, the height of the potential between the right side of the charge-distributing-potential barrier CDB and the second potential well PW2 is controlled by a low-sensitivity charge flow-in control signal SP2 applied to the low-sensitivity charge flow-in control gate (first charge flow-in control gate) 37. Accordingly, the potential at the shoulder of the charge-distributing-potential barrier CDB on the second potential well is electrostatically controlled by the low-sensitivity charge flow-in control signal SP2 applied through a gate-insulating layer.

Therefore, when a low positive voltage or a negative voltage of high-sensitivity charge flow-in control signal SP1 is applied to the high-sensitivity charge flow-in control gate (second and first charge flow-in control gate) 38 and a high positive voltage of low-sensitivity charge flow-in control signal SP2 is applied to the low-sensitivity charge flow-in control gate (second and first charge flow-in control gate) 37, as shown in Part (a) of FIG. 23, this voltage application raises the potential barrier on the surface of the p-type semiconductor substrate (the semiconductor region of the first conductivity type) 21 just below the high-sensitivity charge flow-in control gate (second charge flow-in control gate) 38, whereas the potential barrier to carriers from the photodiode PD to the second charge-storage diode AD2 is reduced so that a part of the photoelectric current flows into the third n-type surface-embedded region 28. As is described in the solid-state image pick-up device in accordance with the second embodiment, the high-sensitivity charge flow-in control signal SP1 of about −1 volt is applied to accumulate high-density holes in the channel region just below the high-sensitivity charge flow-in control gate (second charge flow-in control gate) 38, which can reduce the occurrence of the dark current.

Conversely, when a high positive voltage of high-sensitivity charge flow-in control signal SP1 is applied to the high-sensitivity charge flow-in control gate (second and first charge flow-in control gate) 38 and a low or a negative voltage of low-sensitivity charge flow-in control signal SP2 is applied to the low-sensitivity charge flow-in control gates (second and first charge flow-in control gates) 38 and 37, as shown in Part (b) of FIG. 23, this voltage application raises the potential barrier on the surface of the p-type semiconductor substrate (the semiconductor region of the first conductivity type) 21 just below the high-sensitivity charge flow-in control gate (second charge flow-in control gate) 38 to reduce the potential barrier on the surface of the p-type semiconductor substrate (the semiconductor region of the first conductivity type) 21 just below the low-sensitivity charge flow-in control gate (first charge flow-in control gate) 37, whereby the photoelectric current flows into only the first charge-storage diode AD1. The low-sensitivity charge flow-in control signal SP2 of about −1 volts is applied to accumulate high-density holes in the channel region just below the low-sensitivity charge flow-in control gate (first charge flow-in control gate) 37, which can reduce the occurrence of the dark current. Thereby, in the solid-state image pick-up device in accordance with the third embodiment, the dark current can be reduced, particularly for a high-sensitivity signal (used for a low intensity range).

In the case of the first charge-storage diode AD1 having the potential well filled with charges, the voltage of the first transfer signal TX1$_i$ is applied to the first transfer gate electrode 31 such that the charges flow into the first floating-diffusion region 26. This voltage setting can prevent overflow of the charges toward the second charge-storage diode AD2 even if the first charge-storage diode AD1 is filled with charges. In addition, in the case of the second charge-storage diode AD2 having the potential well filled with charges, the voltage of the second transfer signal TX2$_i$ is applied to the second transfer gate electrode 32 such that the charges flow into the second floating-diffusion region 27.

In this way, the high- and low-sensitivity charge flow-in control signals SP1 and SP2 are applied in opposite phase. That is, the application of the high-sensitivity charge flow-in control signal SP1 having a high voltage is used in that of the low voltage of the low-sensitivity charge flow-in control signal SP2, and the application of the low-sensitivity charge flow-in control signal SP2 having a high voltage is used in the application of the low voltage of the high-sensitivity charge flow-in control signal SP1. This voltage application in opposite phase enables the perfect control of the flow of photoelectrons generated in the photodiode PD into the first and second charge-storage diodes AD1 and AD2. Thereby, the distribution ratio R in Formulas (1) and (2) can be substantially equal to one.

FIG. 22 is a plan view of the first n-type surface-embedded region 22 having a shape of a polygon (dodecagon) having projections in order to show the planar structure of the pixel X$_{ij}$ of the solid-state image pick-up device in accordance with the third embodiment. The first n-type surface-embedded region 22 has the right-sided and left-sided portions, the left-sided portion is in the crossover of two-dimensional patterns of the first and second n-type surface-embedded regions 22 and 23, and the right-sided portion faces the third n-type surface-embedded region 28. Even if the width of the right-sided portion of the first n-type surface-embedded region 22 is equal to the width of the left-sided portions, the voltages of the high- and low-sensitivity charge flow-in control signals SP1 and SP2 are applied to the high- and low-sensitivity charge flow-in control gates (second and first charge flow-in control gates) 38 and 37, respectively, and can be controlled such that the distribution ratio R from the photodiode PD to the first and second charge-storage diodes AD1 and AD2 can be a large value of substantially equal to one, resulting in a reduction in the effect of the variation in the distribution ratio R in the pixels.

Fourth Embodiment

The solid-state image pick-up device in accordance with the first, second, and third embodiments shown in FIGS. 2, 17, and 21 include the first and second floating-diffusion regions 26 and 27 which detect charges, and the first and second floating-diffusion regions 26 and 27 work as floating-diffusion regions for high- and low-sensitivity signals. The source electrode of the reset transistor T$_{Rij}$ in the common voltage readout buffer amplifier A$_{ij}$ is connected to the first and second floating-diffusion regions 26 and 27 through the contact plugs 35 and 35, respectively.

Furthermore, as shown in FIGS. 2, 17, and 21, the first and second floating-diffusion regions 26 and 27 are connected to the gate electrode of the common signal readout transistor (amplifier transistor) T$_{Aij}$ through the contact plugs 35 and 35, respectively. The drain electrode of the signal readout transistor (amplifier transistor) T$_{Aij}$ is connected to the power supply V$_{DD}$, and the source electrode thereof is connected to the drain electrode of the common switching transistor T$_{Sij}$ for the pixel selection. The source electrode of the common switching transistor T$_{Sij}$ for the pixel selection is connected to the vertical signal line B$_j$ in the j-th column. The vertical selection signal S$_i$ for the horizontal line in the i-th row is supplied by the timing generating circuit 4 driven by the vertical shift register (vertical scanning circuit) 3, and is applied to the gate electrode of the switching transistor T$_{Sij}$.

Figure 24:
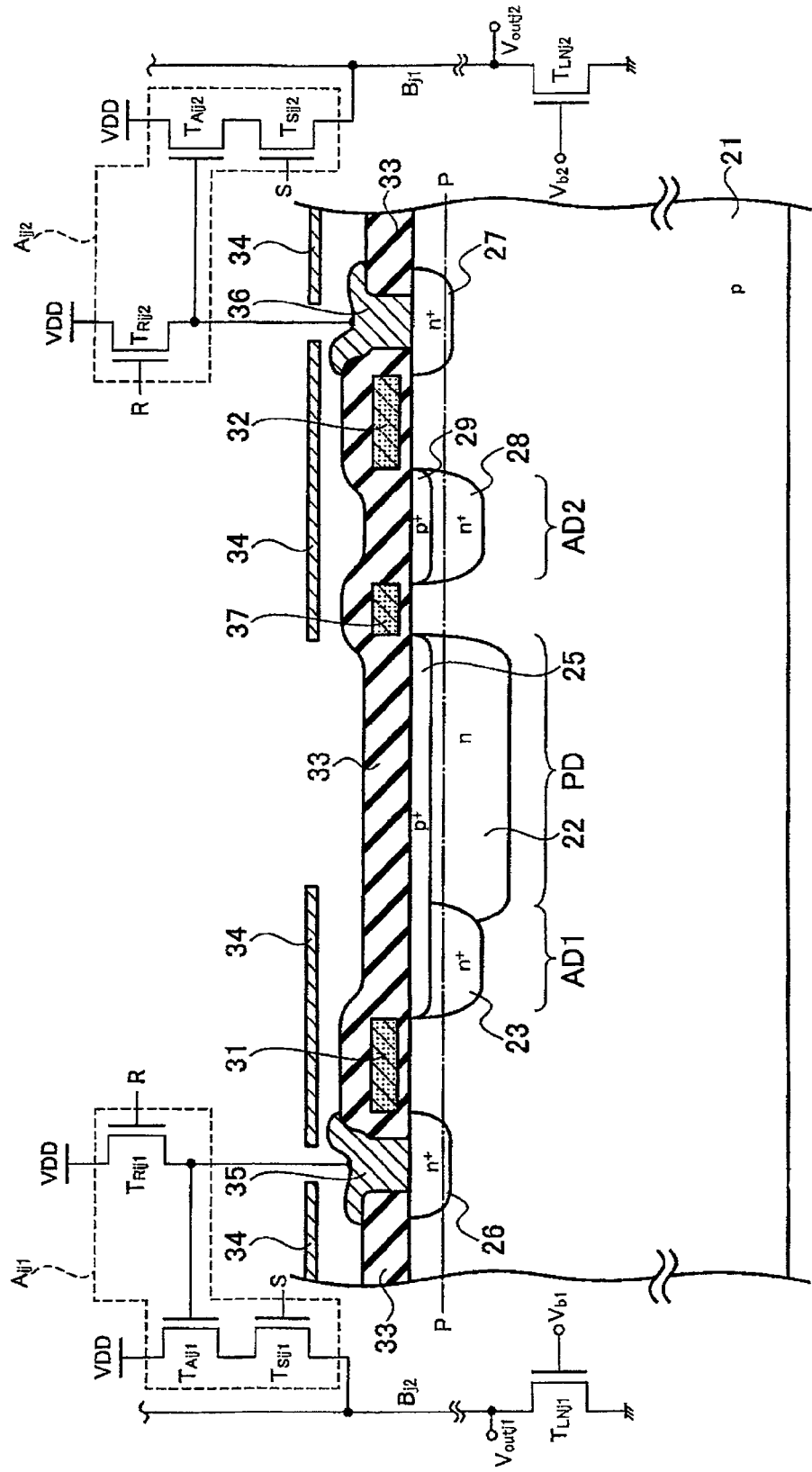
FIG. 24 is a schematic cross-sectional view illustrating the structure of a pixel of a solid-state image pick-up device in accordance with a fourth embodiment of the present invention.

The structure of a pixel X$_{ij}$ of a solid-state image pick-up device in accordance with a fourth embodiment of the present invention is similar to that of the device in accordance with the third embodiment shown in FIG. 17. However, as shown in FIG. 24, a first floating-diffusion region 26 is connected to a source electrode of a first reset transistor T$_{Rij1}$ of a first voltage readout buffer amplifier A$_{ij1}$ through a contact plug 35. Further, the first floating-diffusion region 26 is connected to a gate electrode of a first signal readout transistor (amplifier transistor) T$_{Aij1}$ in the first voltage readout buffer amplifier A$_{ij1}$ through the contact plug 35. The drain electrode of the first signal readout transistor T$_{Aij1}$ is connected to the power supply V$_{DD}$, and the source electrode thereof is connected to a drain electrode of a first switching transistor T$_{Sij1}$ for the pixel selection. The source electrode of the first switching transistor T$_{Sij1}$ is connected to a first vertical signal line B$_{j1}$ in the j-th column. A vertical selection signal S$_i$ for a horizontal line in the i-th row is supplied to a timing generating circuit 4 driven by a vertical shift register (vertical scanning circuit) 3, and is applied to the gate electrode of the first switching transistor T$_{Sij1}$. The first vertical signal line B$_{j1}$ is connected to a first constant-current transistor T$_{LNj1}$ working as a common load. A first source follower circuit includes the first voltage readout buffer amplifier A$_{ij1}$ and the first constant-current transistor T$_{LNj1}$. Furthermore, an output V$_{outj1}$ from the first source follower circuit is read by the column processing circuit $Q_j$. The first switching transistor $T_{Sij1}$ is turned on by applying High level ($S_i$="1") signal of the vertical selection signal $S_i$ in the i-th row to the gate electrode of the first switching transistor $T_{Sij1}$ for the pixel selection of the first voltage readout buffer amplifier $A_{ij1}$, while a constant voltage $Vb_1$ from a bias generating circuit 7 (see FIG. 1) is applied to a gate electrode of the first constant-current transistor $T_{LNj1}$. Thereby, charges (signals of the first charge-storage diode AD1) in the first floating-diffusion region 26 is amplified by the first signal readout transistor (amplifier transistor) $T_{Aij1}$ to generate an amplified signal, and the amplified signal is read out as the output $V_{outj1}$ of the first source follower circuit to an external device outside the pixel array 1.

On the other hand, as shown in FIG. 24, a second floating-diffusion region 27 is connected to a source electrode of a second reset transistor $T_{Rij2}$ of a second voltage readout buffer amplifier $A_{ij2}$ through a contact plug 36, which is a separate circuit independent of the first voltage readout buffer amplifier $A_{ij1}$. Furthermore, the second floating-diffusion region 27 is connected to a gate electrode of a second signal readout transistor $T_{Aij2}$ of the second voltage readout buffer amplifier $A_{ij2}$ through the contact plug 36. A drain electrode of the second signal readout transistor $T_{Aij2}$ is connected to the power supply $V_{DD}$, and a source electrode thereof is connected to a drain electrode of a second switching transistor $T_{Sij2}$. A source electrode of the second switching transistor $T_{Sij2}$ is connected to a second vertical signal line $B_{j2}$ in the j-th column. A vertical selection signal $S_i$ for a horizontal line in the i-th row is applied to a gate electrode of the second switching transistor $T_{Sij2}$ from a vertical shift register 3. The second vertical signal line $B_{j2}$ is connected to a second constant-current transistor $T_{LNj2}$ working as a common load. A second source follower circuit includes the second voltage readout buffer amplifier $A_{ij2}$ and the second constant-current transistor $T_{LNj2}$. Furthermore, an output $V_{outj2}$ from the second source follower circuit is read out by the column processing circuit Q. High level ($S_i$="1") of the vertical selection signal $S_i$ in the i-th row is applied to the gate electrode of the second switching transistor $T_{Sij2}$ for pixel selection in the second voltage readout buffer amplifier $A_{ij2}$ to turn on the second switching transistor $T_{Sij2}$, while a constant voltage $Vb_2$ from the bias generating circuit 7 (see FIG. 1) is applied to a gate electrode of the second constant-current transistor $T_{LNj2}$, so that charges (signals of the second charge-storage diode AD2) in the second floating-diffusion region 27 is amplified by the second signal readout transistor (amplifier transistor) $T_{Aij2}$ to supply the output $V_{outj2}$ of the second source follower circuit to an external device outside the pixel array 1. The constant voltage $Vb_2$ applied to the gate electrode of the second constant-current transistor $T_{LN2}$ may be the same voltage as the constant voltage $Vb_1$ applied to the gate electrode of the first constant-current transistor $T_{LNj1}$.

In the solid-state image pick-up device in accordance with the fourth embodiment of the present invention, since the first floating-diffusion region 26 is separated from the second floating-diffusion region 27 so as to form a separate circuit, a low-sensitivity charge flow-in control signal SP2 can prevent the photoelectric current from flowing from a photodiode PD in the reading of a low-sensitivity signal. This effectively prevents black-inversion in the reading of a signal having an extremely high intensity.

In the solid-state image pick-up device in accordance with the fourth embodiment of the present invention, the number of transistors in one pixel is increased. However, for example, in pixels $X_{(i-1)j}$ in the (i−1)-th row and $X_{ij}$ in the i-th row adjacent to the (i−1)-th row vertically, the first floating-diffusion region 26 in the pixels $X_{ij}$, the first reset transistor $T_{Rij1}$, the first signal readout transistor $T_{Aij1}$, and the first switching transistor $T_{Sij1}$ correspond to the first floating-diffusion region 26 in the pixels $X_{(i-1)j}$, the first reset transistor $T_{R(i-1)j1}$, the first signal readout transistor $T_{A(i-1)j1}$, and the first switching transistor $T_{S(i-1)j1}$, respectively, for the high-sensitivity signal, and the pixel $X_{(i-1)j}$ and the pixel $X_{ij}$ shares these corresponding components with each other. Furthermore, the second floating-diffusion region 27 in the pixel $X_{ij}$, the second reset transistor $T_{Rij2}$, the second signal readout transistor (amplifier transistor) $T_{Aij2}$, and the second switching transistor $T_{Sij2}$ correspond to the second floating-diffusion region 27 in the pixel $X_{(i-1)j}$, the second reset transistor $T_{A(i-1)j2}$, the second signal readout transistor $T_{A(i-1)j2}$, and the second switching transistor $T_{S(i-1)j2}$, respectively, for the low-sensitivity signal, and the pixel $X_{(i-1)j}$ and the pixel $X_{ij}$ share these corresponding components with each other. This can suppress an increase in the number of transistors per pixel.

Referring to FIG. 1 used for the description of the device in accordance with the first to third embodiments, the solid-state image pick-up device in accordance with the fourth embodiment of the present invention includes a pixel array 1 having a number of pixels $X_{ij}$ (i=1 to m; j=1 to n; where m and n are integers) arranged in a two-dimensional matrix; a vertical shift register (vertical scanning circuit) 3 on the left side of the pixel array 1, and a timing generating circuit 4 being provided between the pixel array 1 and the vertical shift register 3; and a bias generating circuit 7 on the lower right side. On the lower side of the pixel array 1, a horizontal shift register (horizontal scanning circuit) 2 and a signal processor 5 are provided, and the signal processor 5 includes a plurality of column processing circuits $Q_1, Q_2, \ldots, Q_j, \ldots, Q_m$.

Fifth Embodiment

Referring to FIG. 1 used for the description of the device in accordance with the first to fourth embodiments, the solid-state image pick-up device in accordance with a fifth embodiment of the present invention includes a pixel array 1 having a number of pixels $X_{ij}$ (i=1 to m; j=1 to n; where m and n are integers) arranged in a two-dimensional matrix; a vertical shift register (vertical scanning circuit) 3 on the left side of the pixel array 1, and a timing generating circuit 4 being provided between the pixel array 1 and the vertical shift register 3; and a bias generating circuit 7 on the lower right side. On the lower side of the pixel array 1, a horizontal shift register (horizontal scanning circuit) 2 and a signal processor 5 are provided, and the signal processor 5 includes a plurality of column processing circuits $Q_1, Q_2, \ldots, Q_j, \ldots, Q_m$.

Figure 25:
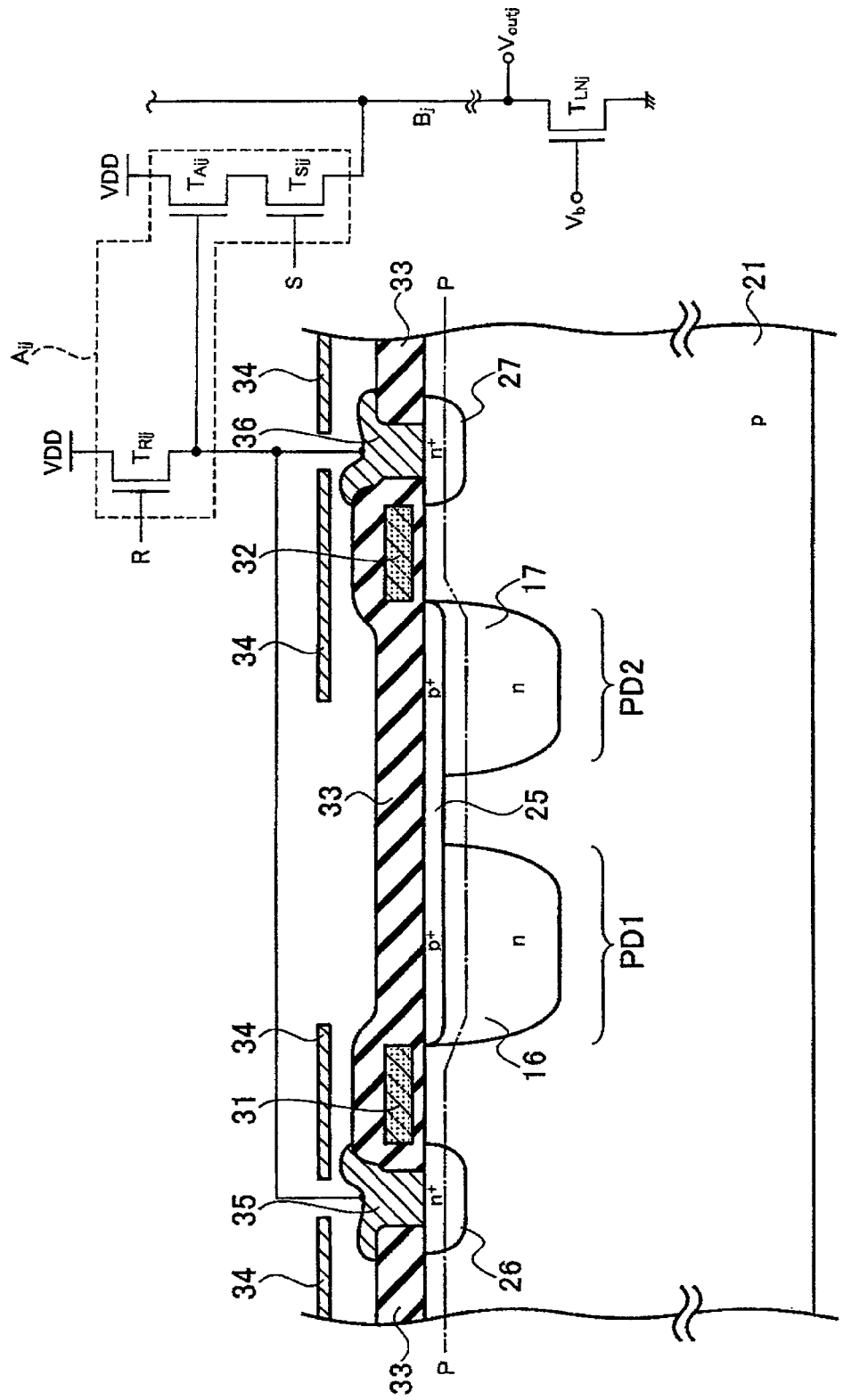
FIG. 25 is a schematic cross-sectional view illustrating the structure of a pixel of a solid-state image pick-up device in accordance with a fifth embodiment of the present invention.

However, as shown in FIG. 25, the solid-state image pick-up device in accordance with the fifth embodiment includes the pixel array 1 formed by the pixels $X_{ij}$ each having the structure different from that of the device in accordance with the first to fourth embodiments. A high-sensitivity first photodiode PD1 and a low-sensitivity second photodiode PD2 are provided in one pixel near the top surface of a p-type semiconductor substrate (a semiconductor region of a first conductivity type) 21.

Accordingly, as shown in FIG. 25, in the pixel $X_{ij}$ of the device in accordance with the fifth embodiment, the second photodiode PD2 is located at the right of the first photodiode PD1 away therefrom. The second photodiode PD2 includes a second n-type surface-embedded region 17 on the right side of a first n-type surface-embedded region 16 of the first photodiode PD1, and an anode region composed of a part of the p-type semiconductor substrate (the semiconductor region of the first conductivity type) 21. The second n-type surface-embedded region 17 and first n-type surface-embedded region 16 sandwich a part of the p-type semiconductor substrate, and the anode region is disposed below the second n-type surface-embedded region 17. The first and second n-type surface-embedded regions 16 and 17 may have an impurity density between about $5 \times 10^{14}$ and about $5 \times 10^{16}$ cm$^{-3}$, and typically, for example, this impurity density can be about $1 \times 10^{15}$ cm$^{-1}$. The first and second n-type surface-embedded regions 16 and 17 may have a thickness between about 0.1 and about 3 µm, preferably between about 0.5 and about 1.5 µm. Above the second n-type surface-embedded region 17, a p-type pinning layer 25 extends from the top of the first n-type surface-embedded region 16 for the first photodiode PD1. Accordingly, the first and second n-type surface-embedded regions 16 and 17 are formed below the single p-type pinning layer 25. In applications in which the dark current is not of interest in use, the p-type pinning layer 25 can be omitted from the structure of the pixels.

In the device in accordance with the fifth embodiment, as shown in FIG. 25, the shape of a light-shielding layer 34 is defined such that the opening ratio for light incident on the second photodiode PD2 is smaller than that incident on the first photodiode PD1, so that the second and first photodiodes PD2 and PD1 function as "a low-sensitivity photodiode" and "a high-sensitivity photodiode," respectively. However, this is one of examples, and another approach, such as, a pixel in which the area of the junction in the first photodiode PD1 is smaller than that of the first photodiode PD1 may be used so that the first and second photodiodes PD1 and PD2 can function as "a high-sensitivity photodiode" and "a low-sensitivity photodiode", respectively.

In this way, the device in accordance with the fifth embodiment includes the high-sensitivity first photodiode PD1 and the low-sensitivity second photodiode PD2 in one pixel. Furthermore, as shown in FIG. 25, the pixel of the device in accordance with the fifth embodiment is provided with first and second transfer gate electrodes 31 and 32 at the left and right sides of the first and second n-type surface-embedded regions 16 and 17, respectively. Therefore, the first and second transfer gate electrodes 31 and 32 are used to transfer charges from the first and second n-type surface-embedded regions 16 and 17 to first and second floating-diffusion regions 26 and 27, respectively.

Figure 26:
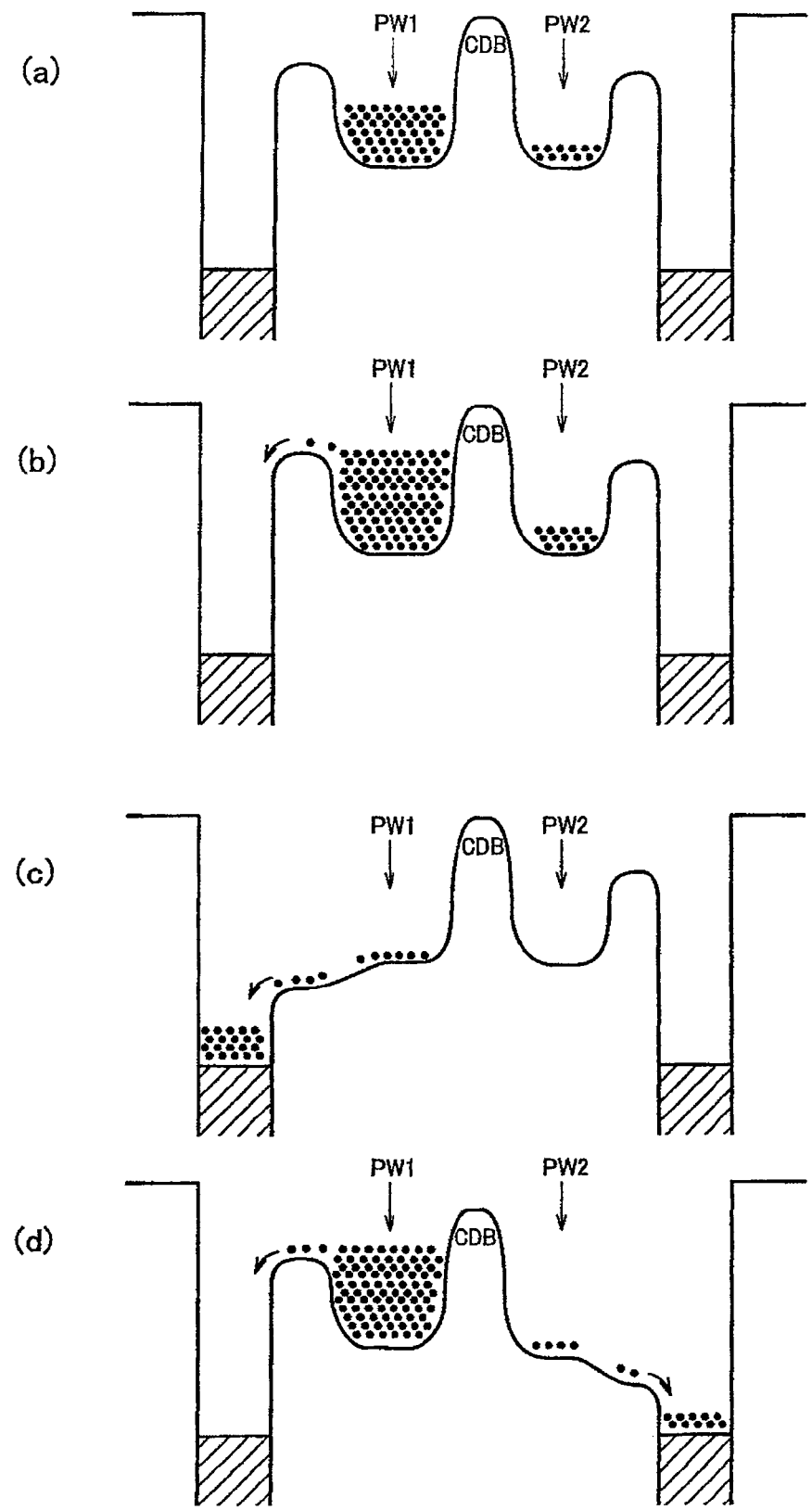
FIG. 26 is a potential diagram of the cross section, taken along a P-P plane indicated by a chain line shown in FIG. 25, a first floating-diffusion region, a first n-type surface-embedded region, a second n-type surface-embedded region, and a second floating-diffusion region are shown.

FIG. 26 is a potential diagram in the cross section, taken along a P-P plane indicated by a chain line in FIG. 25, showing the first floating-diffusion region 26, the first n-type surface-embedded regions 16, the second n-type surface-embedded region 17, and the second floating-diffusion region 27. Filled circles indicate charges (electrons). A first potential well PW1 of the first n-type surface-embedded region 16 in the first photodiode PD1 resides on the left side of a charge-distributing-potential barrier CDB at the middle in FIG. 26. Furthermore, a potential well of the first floating-diffusion region 26 indicated by hatching sloping upward to the right resides on the left of the first potential well PW1. A potential barrier between the first potential well PW1 and the potential well of the first floating-diffusion region 26 corresponds to a potential distribution of conduction band edge of the p-type semiconductor substrate (the semiconductor region of the first conductivity type) 21 just below the first transfer gate electrode 31. Similarly, a second potential well PW2 of the second n-type surface-embedded region 17 in the second photodiode PD2 resides on the right of the charge-distributing-potential barrier CDB. Furthermore, a potential well of the second floating-diffusion region 27 indicated by hatching sloping upward to the right resides on the right of the second potential well PW2. A potential barrier between the second potential well PW2 and the potential well of the second floating-diffusion region 27 corresponds to a potential distribution of conduction band edge of the p-type semiconductor substrate (the semiconductor region of the first conductivity type) 21 just below the second transfer gate electrode 32. It can be understood from FIG. 26 that an adequately high potential barrier is formed between the first and second photodiodes PD1 and PD2. The charges in the first and second photodiodes PD1 and PD2 can be stored and read out independently as shown in FIG. 26. All the reading methods in the device in accordance with the first embodiment shown in the timing diagrams of FIGS. 9 to 16 can be applied to the low-sensitivity signal.

Part (a) of FIG. 26 shows a potential diagram in a stored state. Part (b) of FIG. 26 shows a overflowing of charges from the first photodiode PD1 working as a high-sensitivity photodiode. The adequately high potential barrier is provided between the first and second photodiodes PD1 and PD2 because a part of the p-type semiconductor substrate (the semiconductor region of the first conductivity type) 21 is located between the first and second photodiodes PD1 and PD2. Therefore, the charges do not overflow from the first photodiode PD1 into the second photodiode PD2 working as a low-sensitivity photodiode.

Parts (c) and (d) of FIG. 26 show potential distributions in a pixel in the reading of the high- and low-sensitivity signals from the first and second photodiodes PD1 and PD2, respectively.

Sixth Embodiment

Referring to FIG. 1 used for the description of the device in accordance with the first to fifth embodiments, a solid-state image pick-up device in accordance with a sixth embodiment of the present invention includes a pixel array 1 having a number of pixels $X_{ij}$ (i=1 to m; j=1 to n; where m and n are integers) arranged in a two-dimensional matrix; a vertical shift register (vertical scanning circuit) 3 on the left side of the pixel array 1, a timing generating circuit 4 being provided between the pixel array 1 and the vertical shift register 3; and a bias generating circuit 7 on the lower right side. On the lower side of the pixel array 1, a horizontal shift register (horizontal scanning circuit) 2 and a signal processor 5 are disposed, and the signal processor 5 includes a plurality of column processing circuits $Q_1, Q_2, \ldots, Q_j \ldots, Q_m$.

Figure 27:
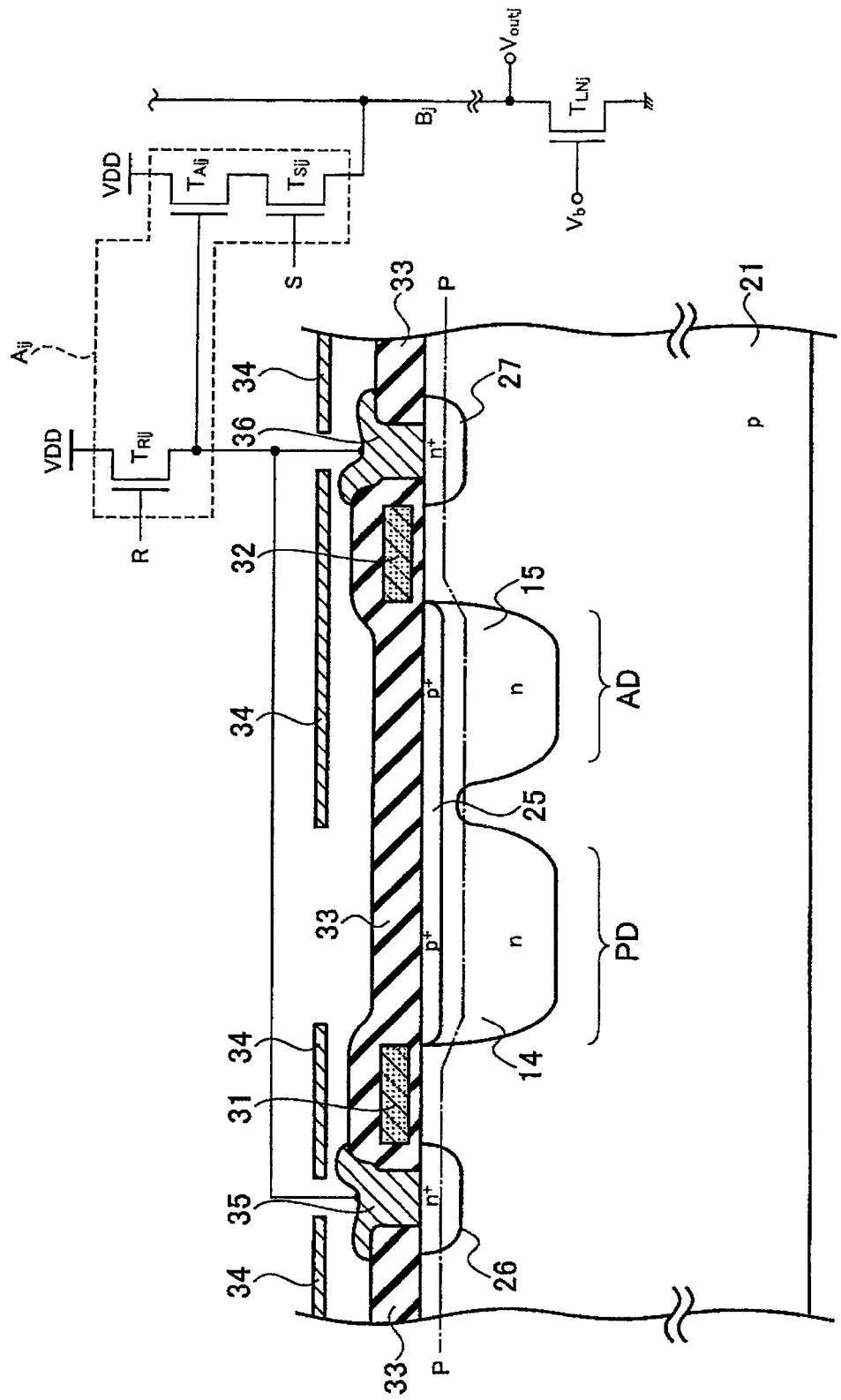
FIG. 27 is a schematic cross-sectional view illustrating the structure of a pixel of a solid-state image pick-up device in accordance with a sixth embodiment of the present invention.

However, as shown in FIG. 27, the solid-state image pick-up device in accordance with the sixth embodiment includes the pixel array 1 formed by the pixels and the each pixel $X_{ij}$ has a structure different from those of the devices in accordance with the first to fifth embodiments. A single photodiode PD and a charge-storage diode AD are provided in one pixel near the top surface of a p-type semiconductor substrate (a semiconductor region of a first conductivity type) 21, and the charge-storage diode AD stores charges overflowing from the photodiode PD.

Figure 28:
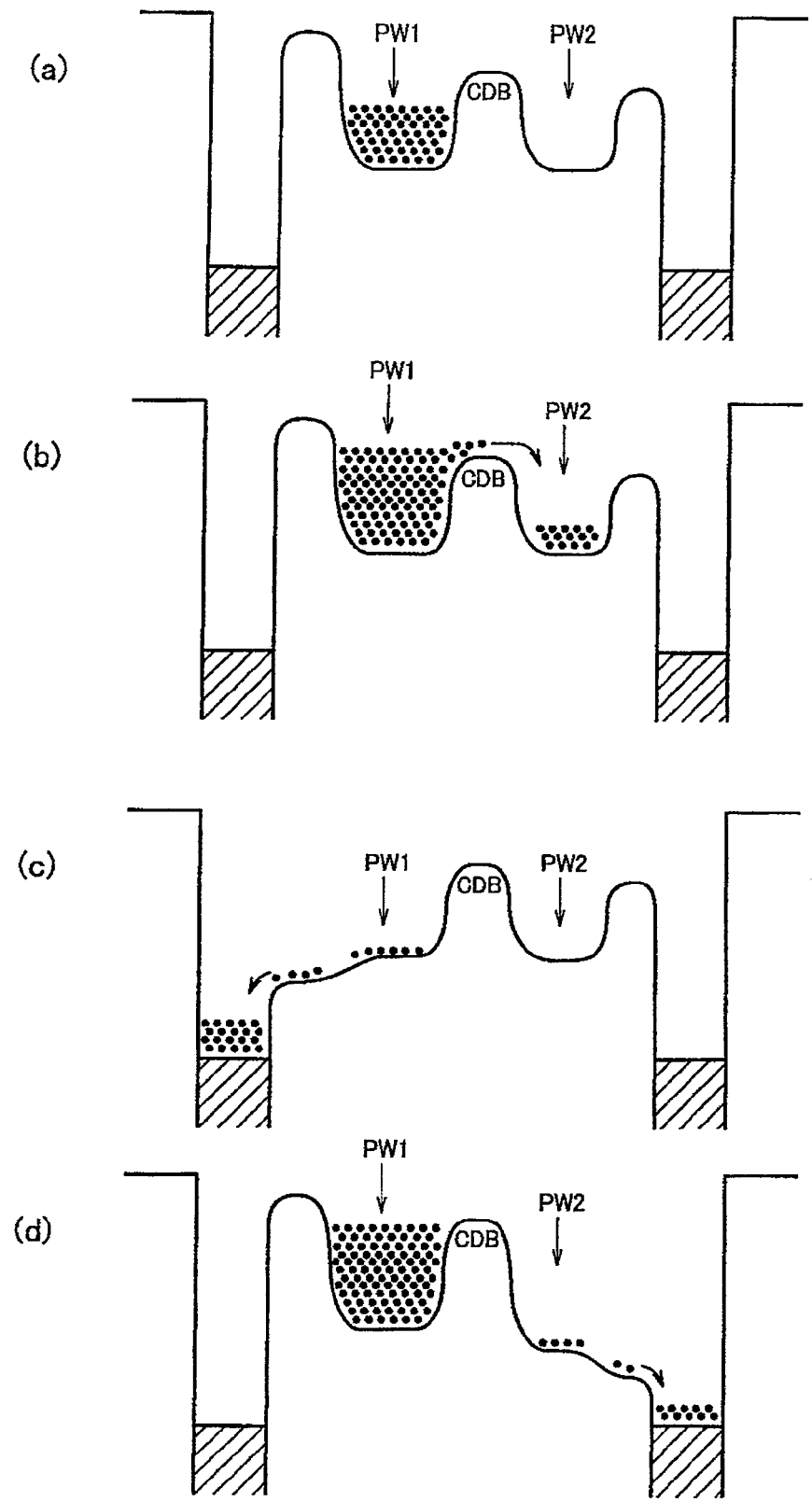
FIG. 28 is a potential diagram of the cross section, taken along a P-P plane indicated by a chain line in FIG. 25, in which a first floating-diffusion region, a first n-type surface-embedded region, a second n-type surface-embedded region, and a second floating-diffusion region are shown.

Accordingly, as shown in FIG. 27, in the pixel $X_{ij}$ of the device in accordance with the sixth embodiment, the charge-storage diode AD is located on the right of the photodiode PD, and the charge-storage diode AD in contact with the top of the photodiode PD. The charge-storage diode AD includes a second n-type surface-embedded region 15 disposed on the right side of a first n-type surface-embedded region 14 in the photodiode PD, and an anode region of a part of the p-type semiconductor substrate (the semiconductor region of the first conductivity type) 21. The anode region is provided below the second n-type surface-embedded region 15, and the bottom portions of the first and second n-type surface-embedded regions 14 and 15 sandwich a part of a p-type semiconductor substrate (a semiconductor region of a first conductivity type) 21. The first and second n-type surface-embedded regions 14 and 15 may have an impurity density between about $5\times10^{16}$ and about $5\times10^{17}$ cm$^{-3}$, typically, the impurity density is, for example, about $4\times10^{16}$ cm$^{-3}$. The first and second n-type surface-embedded regions 14 and 15 may have a thickness between about 0.1 and about 3 μm, preferably between about 0.5 and about 1.5 μm. Above the second n-type surface-embedded region 15, a p-type pinning layer 25 extends from the top of the first n-type surface-embedded region 14 in the photodiode PD. Accordingly, as shown in FIG. 28, in the pixel $X_{ij}$ of the solid-state image pick-up device in accordance with the sixth embodiment, the first and second n-type surface-embedded regions 14 and 15 are formed below the single p-type pinning layer 25. In applications in which the dark current is not of interest in use, the p-type pinning layer 25 may be omitted from the pixel.

Furthermore, as shown in FIG. 27, the pixel $X_{ij}$ of the device in accordance with the sixth embodiment is provided with first and second transfer gate electrodes 31 and 32 at the left and right sides of the first and second n-type surface-embedded regions 16 and 17, respectively. Therefore, the first and second transfer gate electrodes 31 and 32 are used to transfer charges from the first and second n-type surface-embedded regions 16 and 17 to first and second floating-diffusion regions 26 and 27, respectively. In this pixel, the distance between the first and second n-type surface-embedded regions 14 and 15 is adjusted to form the proper height of a potential barrier such that charges can overflow from the photodiode PD into the charge-storage diode AD in the turn-off state of the first transfer gate electrode 31 by applying a low voltage of a first transfer signal $TX1_i$ to the first transfer gate electrode 31. Alternatively, a shallow n-type layer having a relatively low impurity density can also be formed between the first and second n-type surface-embedded regions 14 and 15 to adjust the proper height of the potential barrier such that charges can overflow from the photodiode PD into the charge-storage diode AD. Alternatively, a MOS transistor structure may be used as well by forming an overflow control gate electrode between the first and second n-type surface-embedded regions 14 and 15 to form the potential barrier to the charge-storage diode AD.

As shown in FIG. 27, the solid-state image pick-up device in accordance with the sixth embodiment is designed such that a light-shielding layer 34 shields the charge-storage diode AD from light, so that only the photodiode PD is exposed to light.

FIG. 28 is a potential diagram of the cross section, taken along a P-P plane indicated by a chain line in FIG. 27, showing the first floating-diffusion region 26, the first n-type surface-embedded regions 14, the second n-type surface-embedded region 15, and the second floating-diffusion region 27. Filled circles indicate charges (electrons). A first potential well PW1 provided by the first n-type surface-embedded region 16 of the photodiode PD resides at the left of a charge-distributing-potential barrier CDB depicted at the middle in FIG. 28. Furthermore, a potential well of the first floating-diffusion region 26 indicated by hatching sloping upward to the right resides on the left of the first potential well PW1. A potential barrier between the first potential well PW1 and the potential well of the first floating-diffusion region 26 corresponds to a potential distribution of conduction band edge of the p-type semiconductor substrate (the semiconductor region of the first conductivity type) 21 just below the first transfer gate electrode 31. Similarly, a second potential well PW2 provided by the second n-type surface-embedded region 15 of the charge-storage diode AD resides on the right of the charge-distributing-potential barrier CDB. Furthermore, a potential well of the second floating-diffusion region 27, indicated by hatching sloping upward to the right, resides on the right of the second potential well PW2. A potential barrier between the second potential well PW2 and the potential well of the second floating-diffusion region 27 corresponds to a potential distribution of conduction band edge of the p-type semiconductor substrate (the semiconductor region of the first conductivity type) 21 just below the second transfer gate electrode 32.

In FIG. 26, an adequately high potential barrier is formed between first and second photodiodes PD1 and PD2. However, in the potential diagram of FIG. 28, a relatively low potential barrier is formed between the photodiode PD and the charge-storage diode AD so that charges can easily overflow from the photodiode PD into the charge-storage diode AD. As shown in FIG. 28, charges stored in the first potential well PW1 and charges stored in the second potential well PW2 by overflowing can be read out independently.

Part (a) of FIG. 28 shows a potential diagram in a stored state. Part (b) of FIG. 28 shows the overflowing of charges from the photodiode PD working as a high-sensitivity photodiode. Part (c) of FIG. 28 shows a potential distribution in a pixel during the readout from the photodiode PD for the high-sensitivity signals, whereas Part (d) of FIG. 28 shows a potential distribution during the readout from the charge-storage diode AD for the low-sensitivity signals.

The reading methods in the device in accordance with the first embodiment shown in the timing diagrams of FIGS. 9 to 16 can also be applied to that in accordance with the sixth embodiment. Plural fast reading operations are applied to a signal generated by charges stored in the charge-storage diode AD by overflowing from the photodiode PD. In the solid-state image pick-up device in accordance with the sixth embodiment, since signals that are read out from the charge-storage diode AD is generated from charges overflowing from the photodiode PD, the combination of these signals requires special consideration. For example, a high-sensitivity signal ($X_L$) is read out from the photodiode PD first. Thereafter, it is determined whether it exceeds a certain threshold value. If it does not exceed, the signal of the photodiode PD is outputted. If it exceeds, the sum of an overflow storage signal ($X_S$) from the charge-storage diode AD and the high-sensitivity signal from the photodiode PD is outputted.

Meanwhile, in the structure of the pixel $X_{ij}$ of the device in accordance with the sixth embodiment, in order to store charges, a charge-storage capacitor may be formed on the surface of or inside a semiconductor chip instead of the charge-storage diode AD. A MOS or MIM capacitor may be used to form the charge-storage capacitor on the surface of the semiconductor chip, whereas, for example, a p-n junction capacitor may be used to form the charge-storage capacitor inside the semiconductor chip.

Seventh Embodiment

Referring to FIG. 1 used for the description of the device in accordance with the first embodiment, a solid-state image pick-up device in accordance with a seventh embodiment of the present invention includes a pixel array 1 having a number of pixels $X_{ij}$ (i=1 to m; j=1 to n; where m and n are integers) arranged in a two-dimensional matrix; a vertical shift register (vertical scanning circuit) 3 on the left side of the pixel array 1, the vertical shift register (vertical scanning circuit) 3 and the pixel array 1 sandwiching a timing generating circuit 4; and a bias generating circuit 7 on the lower right side. On the lower side of the pixel array 1, a horizontal shift register (horizontal scanning circuit) 2 and a signal processor 5 are disposed, and the signal processor 5 includes a plurality of column processing circuits $Q_1, Q_2, \ldots, Q_j, \ldots, Q_m$. However, the structure of the pixel $X_{ij}$ in the pixel array 1 differs from that of the solid-state image pick-up device in accordance with the first embodiment.

Figure 29:
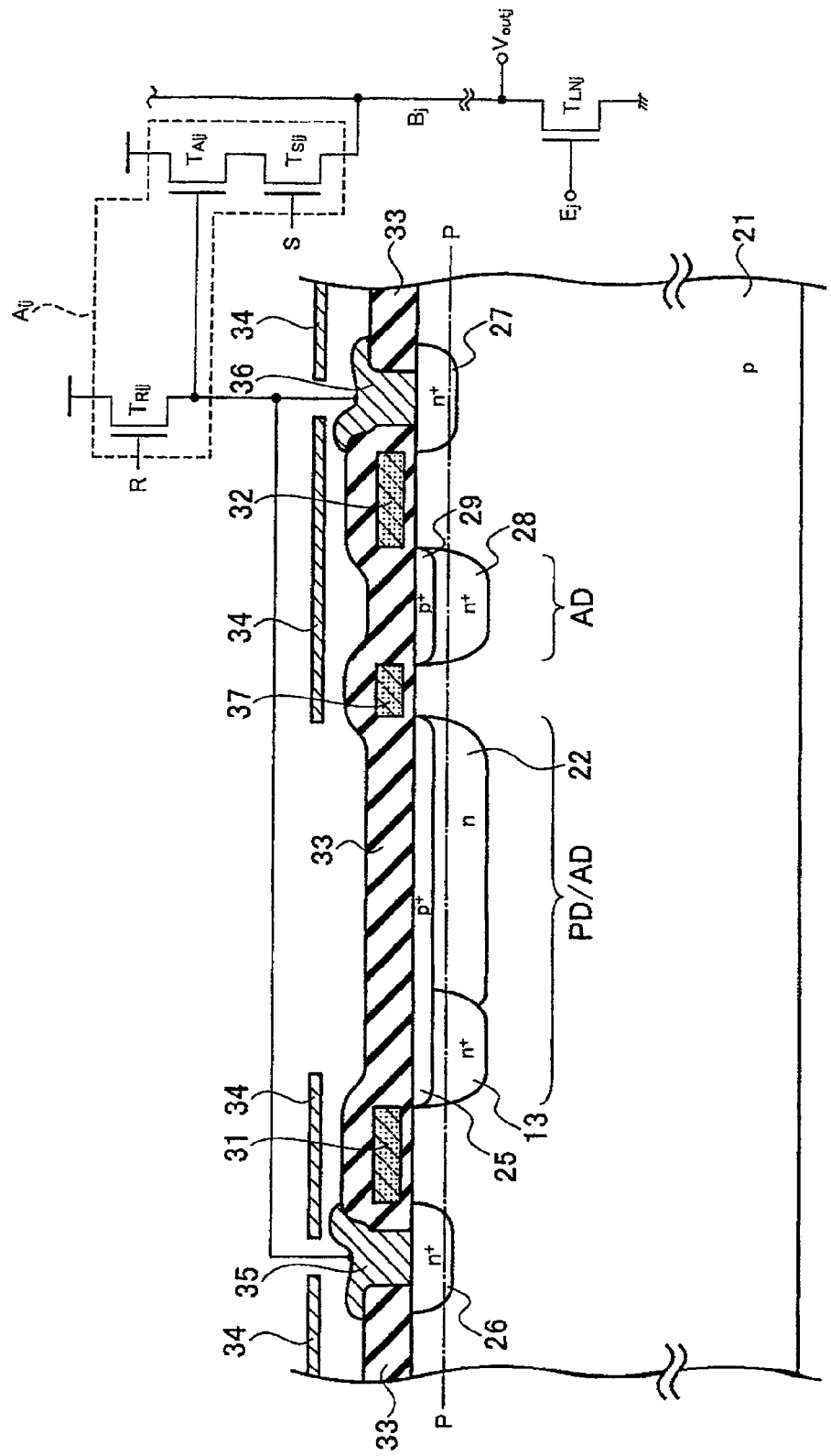
FIG. 29 is a schematic cross-sectional view (taken along the line A-A in FIG. 28) illustrating the structure of a pixel of a solid-state image pick-up device in accordance with a seventh embodiment of the present invention.
Figure 30:
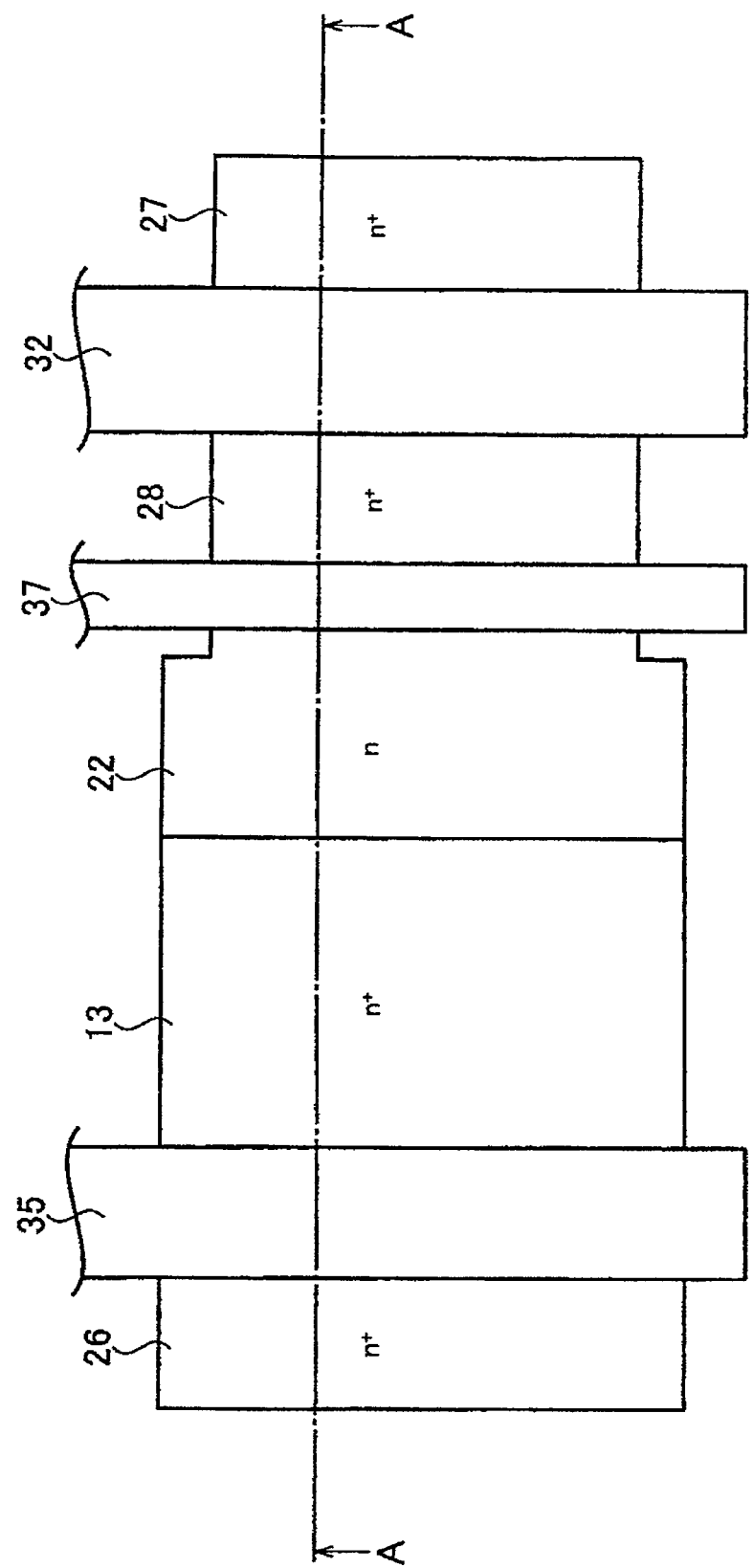
FIG. 30 is a schematic plan view illustrating the structure of a pixel of the solid-state image pick-up device in accordance with the seventh embodiment of the present invention.

Accordingly, as the cross-sectional structure and planar structure are shown in FIGS. 29 and 30, respectively, the solid-state image pick-up device in accordance with the seventh embodiment includes a two way diode working as a photodiode and charge-storage diode PD/AD, and a charge-storage diode AD disposed at the right of the photodiode or charge-storage diode PD/AD away therefrom in the pixel $X_{ij}$. The two way diode working as the photodiode or charge-storage diode PD/AD includes a first n-type surface-embedded region 22, a second n-type surface-embedded region 13 in contact with the left side of the first n-type surface-embedded region 22, and an anode region composed of a part of a p-type semiconductor substrate (a semiconductor region of a first conductivity type) 21 provided below the first and second n-type surface-embedded regions 22 and 13. The charge-storage diode AD includes a third n-type surface-embedded region 28 provided on the p-type semiconductor substrate (the semiconductor region of the first conductivity type) 21 having a part provided between third n-type surface-embedded region 28 and the right side of the first n-type surface-embedded region 22 of the two way diode working as the photodiode and charge-storage diode PD/AD, and an anode region composed of a part of the p-type semiconductor substrate (the semiconductor region of the first conductivity type) 21 disposed below the third n-type surface-embedded region 28.

The second and third n-type surface-embedded regions 13 and 28 have a relatively high impurity density between about $5 \times 10^{16}$ and about $1 \times 10^{19}$ cm$^{-3}$. Above the second n-type surface-embedded region 13, a p-type pinning layer 25 extends from the top of the first n-type surface-embedded region 22 to the left. A p-type pinning layer 29 is disposed above the third n-type surface-embedded region 28. In applications in which the dark current is not of interest in use, the p-type pinning layers 25 and 29 may be omitted from the device.

In the solid-state image pick-up device in accordance with the seventh embodiment, as shown in FIG. 29, an opening of a light-shielding layer 34 is provided such that light can be applied to not only the first n-type surface-embedded region 22 having a low impurity density but also the second n-type surface-embedded region 13 having a high impurity density. In the device in accordance with the seventh embodiment, a first charge-storage diode AD1 of the device in accordance with the second embodiment also functions as a photodiode. A low-sensitivity signal is stored in the third n-type surface-embedded region 28, which is covered thereabove with the light-shielding layer 34 so as not to be exposed to light.

Above a part of the p-type semiconductor substrate (the semiconductor region of the first conductivity type) 21 between the first and third n-type surface-embedded regions 22 and 28, the charge flow-in control gate 37 is formed. Therefore, a MOS transistor for a charge flow-in control includes the first n-type surface-embedded region 22 for a source region, the third n-type surface-embedded region 28 dor a drain region, the surface of the p-type semiconductor substrate (the semiconductor region of the first conductivity type) 21 for a channel region between the first and third n-type surface-embedded regions 22 and 28, and the charge flow-in control gate 37 for a MOS gate.

Figure 31:
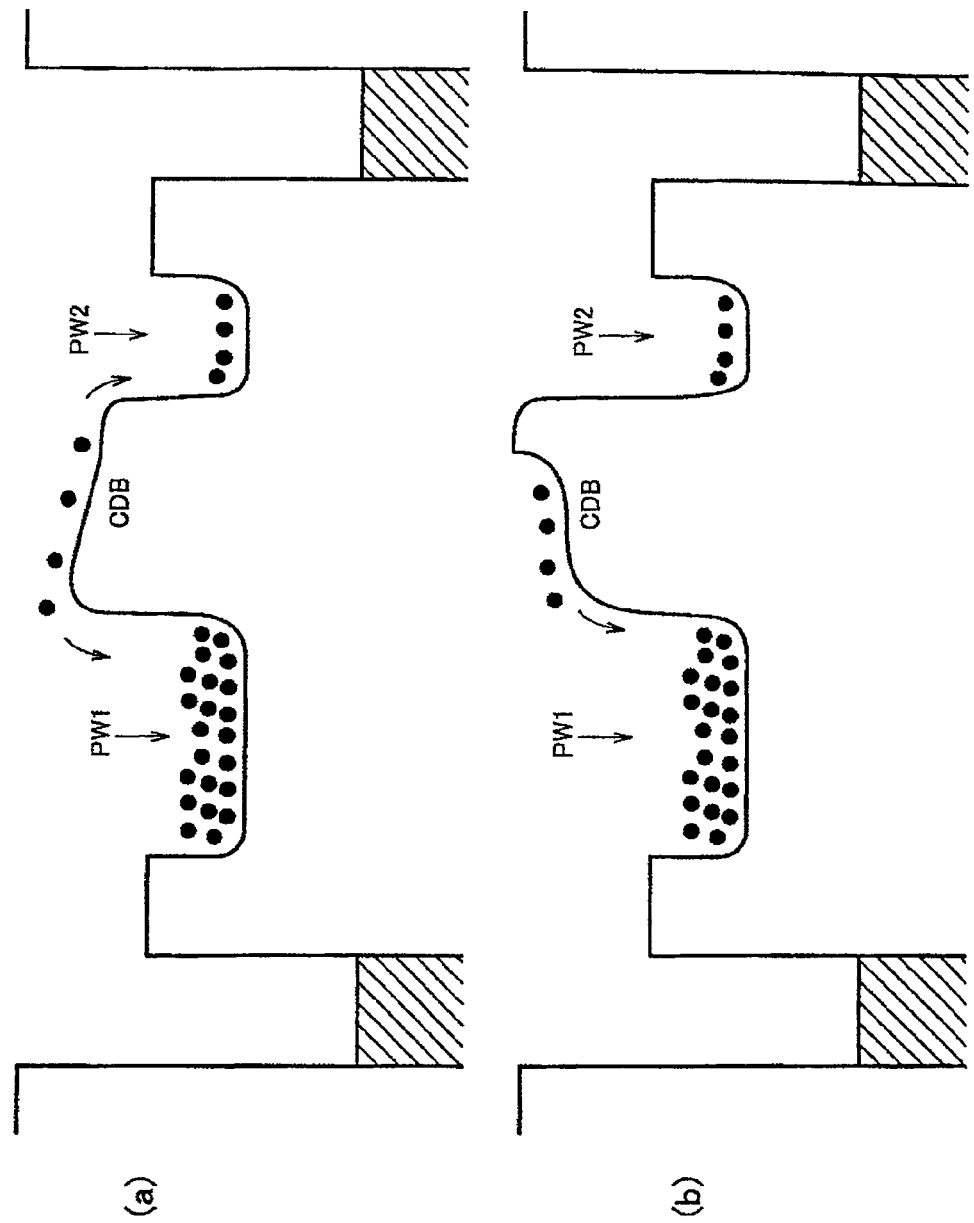
FIG. 31 is a potential diagram of the cross section, taken along a P-P plane indicated by a chain line in FIG. 29, in which a first floating-diffusion region, a second n-type surface-embedded regions, a first n-type surface-embedded region, a third n-type surface-embedded regions, and a second floating-diffusion region are shown.

FIG. 31 is a potential diagram in the cross section, taken along a P-P plane indicated by a chain line in FIG. 29, showing a first floating-diffusion region 26, the second n-type surface-embedded regions 13, the first n-type surface-embedded region 22, the third n-type surface-embedded region 28, and a second floating-diffusion region 27. Filled circles indicate charges (electrons). The center in FIG. 31 denotes a potential distribution of conduction band edge of the first n-type surface-embedded region 22 for a charge-distributing-potential barrier CDB. On the left thereof, a first potential well PW1 of the second n-type surface-embedded region 13 resides. Furthermore, a potential well of the first floating-diffusion region 26, indicated by hatching sloping upward to the right, resides on the left of the first potential well PW1. A rectangular potential barrier between the first potential well PW1 and the potential well of the first floating-diffusion region 26 corresponds to a potential distribution of conduction band edge of the p-type semiconductor substrate (the semiconductor region of the first conductivity type) 21 just below a first transfer gate electrode 31. Similarly, a second potential well PW2 resides on the right of the charge-distributing-potential barrier CDB. Furthermore, a potential well of the second floating-diffusion region 27 indicated by hatching sloping upward to the right resides on the right of the second potential well PW2. A rectangular potential barrier between the second potential well PW2 and the potential well of the second floating-diffusion region 27 corresponds to a potential distribution of conduction band edge of the p-type semiconductor substrate (the semiconductor region of the first conductivity type) 21 just below a second transfer gate electrode 32.

The height of the potential between the right side of the charge-distributing-potential barrier CDB and the second potential well PW2 is controlled by a charge flow-in control signal SP applied to the charge flow-in control gate 37. A high voltage of the charge flow-in control signal SP is applied to the charge flow-in control gate 37, as shown in Part (a) of FIG. 31, to reduce the potential barrier between the charge-storage diode AD and the two way diode working as the photodiode and charge-storage diode PD/AD, so that a part of the photoelectric current flows into the third n-type surface-embedded region 28.

On the other hand, a low voltage of the charge flow-in control signal SP is applied to the charge flow-in control gate 37, as shown in Part (b) of FIG. 31, to raise the potential barrier on the surface of the p-type semiconductor substrate (the semiconductor region of the first conductivity type) 21 just below the charge flow-in control gate 37 between the right side of the charge-distributing-potential barrier CDB and the second potential well PW2, so that the photoelectric current flows into only the second n-type surface-embedded regions 13 of the two way diode working as the photodiode or charge-storage diode PD/AD.

The voltage of the first transfer signal $TX1_i$ applied to the first transfer gate electrode 31 is set such that the charges flow into the first floating-diffusion region 26 in the case of the second n-type surface-embedded regions 13 of the two way diode, working as the photodiode or charge-storage diode PD/AD, having the potential well filled with charges. This voltage setting can prevent overflow of the charges toward the charge-storage diode AD even if the second n-type surface-embedded regions 13 of the two way diode working as the photodiode and charge-storage diode PD/AD is filled with charges. In addition, the voltage of the second transfer signal $TX2_i$ applied to the second transfer gate electrode 32 is set such that the charges flow into the second floating-diffusion region 27 in the case of the charge-storage diode AD filled with charges.

The ratio of the sensitivity of charges, stored in the second n-type surface-embedded regions 13 in the two way diode working as the photodiode and charge-storage diode PD/AD, to light to the sensitivity of charges, stored in the charge-storage diode AD, to light can be changed by the channel width of the MOS transistor that controls charges flowing out to the charge-storage diode AD. However, this ratio can also be changed by a period in which the charge flow-in control signal SP is applied to the charge flow-in control gate 37.

The structure including the charge flow-in control gate 37 is described in the solid-state image pick-up device in accordance with the seventh embodiment. However, in the structure without the charge flow-in control gate 37 like the device in accordance with the first embodiment, the opening of the light-shielding layer 34 may also be set such that light can be applied to not only the first n-type surface-embedded region 22 having a low impurity density but also the second n-type surface-embedded region 13 having a high impurity density to enable the first charge-storage diode AD1 of that in accordance with the first embodiment to function as a photodiode as well. In this case, the low-sensitivity signal is stored in the third n-type surface-embedded region 28, which needs to be covered thereabove with the light-shielding layer 34 so as not to be exposed to light.

In the case of only the first n-type surface-embedded region 22 having a low impurity density exposed to light like the device in accordance with the second embodiment, since a signal is detected by the single photodiode to store charges in the first charge-storage diode AD1 for a high-sensitivity and the second charge-storage diode AD2 for a low-sensitivity, the characteristics such as a spectral sensitivity are equalized easily. On the other hand, when the second n-type surface-embedded region 13 having a high impurity density working as the charge-storage diode for a high-sensitivity is exposed to light like the device in accordance with the seventh embodiment, the difference in characteristics between high- and low-sensitivity signals is problematic. However, this is advantageous in terms of the sensitivity and the number of saturated electrons improved by increasing the opening ratio of the light-shielding layer 34 and the area of the second n-type surface-embedded region 13 working as the charge-storage diode for a high-sensitivity.

Other Embodiments

The first to seventh embodiments in accordance with the present invention are described above. However, it is understood that the present invention is not limited to the descriptions and drawings as part of this disclosure. This disclosure will enable those skilled in the art to find various alternative embodiments, examples, and operational techniques.

For example, in the above description of the first to fourth embodiments, second n-type surface-embedded regions 23 and 18, and third n-type surface-embedded regions 24 and 28 have a relatively high impurity density between about $5 \times 10^{16}$ and about $1 \times 10^{19}$ cm$^{-3}$. However, the second n-type surface-embedded regions 23 and 18 do not always have to have the same impurity density as the third n-type surface-embedded regions 24 and 28. Noise during dark time increases or a residual image appears if charges cannot be transferred perfectly by a first charge-storage diode AD1 for the second n-type surface-embedded regions 23 and 18. Therefore, since the perfect transferring is the absolute requirement, the second n-type surface-embedded regions 23 and 18 need to have an impurity density between about $5 \times 10^{16}$ and about $1 \times 10^{19}$ cm$^{-3}$. On the other hand, a readout method can be employed such that the third n-type surface-embedded regions 24 and 28 in a second charge-storage diode AD2 have an extremely high impurity density, for example, between about $1 \times 10^{19}$ and about $6 \times 10^{20}$ cm$^{-3}$ not to transfer charges perfectly. In this case, the third n-type surface-embedded regions 24 and 28 in the second charge-storage diode AD2 may have the same impurity density as a source/drain region of a general MOS transistor.

In the above description of the first to third and fifth to seventh embodiments, as shown in FIGS. 2, 17, 21, 25, 27 and 29, a first floating-diffusion region 26 for a low-sensitivity signal is short-circuited to the first floating-diffusion region 26 for a high-sensitivity signal in a single pixel. If wiring for this short-circuiting reduces the opening ratio of a photodiode PD of the pixel, the first floating-diffusion region 26 for a low-sensitivity signal of a pixel in a certain column (j=p) may be connected to the first floating-diffusion region 26 for a high-sensitivity signal of a pixel in the adjacent column (j=p+1 or p−1). Although depending on the layout of the pixels, the floating-diffusion region of a pixel in the certain column (j=p) can share a common semiconductor region with that of a pixel in the adjacent column (j=p+1 or p−1), resulting in a reduced area of a pixel, an increased opening ratio of the photodiode PD, and an enhanced sensitivity because of a reduced capacitor.

In the above description of the first to seventh embodiments, an exemplary two-dimensional solid-state image pick-up device (area sensor) is described. However, it is understood that the application of the solid-state image pick-up device in accordance with the present invention is not limited to two-dimensional solid-state image pick-up devices. For example, it will be obvious from the above disclosure that a two-dimensional matrix shown in FIG. 1 may be replaced with a one-dimensional solid-state image pick-up device (line sensor) such as j=m=1.

Principles of the present invention have been described with reference to the drawings of the preferred embodiments. However, it is appreciated that those skilled in the art can modify the layouts and details of the present invention without departing from these principles. As described above, the present invention certainly includes, for example, various embodiments not described herein. Therefore, the technological scope of the present invention is defined by only claimed elements of the present invention in accordance with the proper claims through the above descriptions. Therefore, all the change and modification derived from the range of the claims and spirit of the present invention are further claimed.

INDUSTRIAL APPLICABILITY

As described above, the embodiments of the present invention provides a solid-state image pick-up device having a wide dynamic range without an increase in the area of a pixel, and a method for reading out the pixel signal.

The invention claimed is:

1. A solid-state image pick-up device in which plural pixels are arranged, each comprising:
   a first potential well for storing charges generated by light;
   a charge-distributing-potential barrier adjacent to the first potential well;
   a second potential well for storing charges generated by light of an intensity equal to that of the light generating the charges stored in the first potential well, quantity of the charges stored in the second potential well being less than those stored in the first potential well, the chargedistributing-potential barrier being provided between the second potential well and the first potential well;

first and second transfer gate electrodes for separately transferring the charges stored in the first and second potential wells at different timings, respectively; and first and second floating-diffusion regions for separately storing the charges transferred by the first and second transfer gate electrodes, respectively.

2. The device according to claim 1, wherein the pixel further comprises a photodiode, the photodiode generates charges in response to light, and the charges in the first and second potential well are generated by the photodiode.

3. The device according to claim 2, wherein the photodiode includes the charge-distributing-potential barrier.

4. The device according to claim 1, wherein only pixel signals generated by charges stored in the second floating-diffusion region are read out multiple times in one frame period.

5. The device according to claim 1, wherein pixel signals generated by charges stored in the second floating-diffusion region are read out multiple times for different storing times in one frame period.

6. The device according to claim 1, wherein pixel signals generated by charges stored in the first and second floating-diffusion regions are read out at readout timings different from each other.

7. The device according to claim 1, wherein the charge-distributing-potential barrier is provided by a potential distribution in a first surface-embedded region embedded in an upper part of a semiconductor region of a first conductivity type, and the first surface-embedded region has a second conductivity type different from the first conductivity type;

the first potential well is provided by a potential distribution in a second surface-embedded region of the second conductivity type, the second surface-embedded region is adjacent to the first surface-embedded region, the second surface-embedded region is embedded in an upper part of the semiconductor region of the first conductivity type, and the second surface-embedded region has a higher impurity density than the first surface-embedded region; and the second potential well is provided by a potential distribution in a third surface-embedded region of the second conductivity type, the third surface-embedded region is adjacent to the first surface-embedded region, the first surface-embedded region is provided between the third surface-embedded region and the second surface-embedded region, the third surface-embedded region is embedded in the upper part of the semiconductor region of the first conductivity type, and the third surface-embedded region has a higher impurity density than the first surface-embedded region.

8. The device according to claim 7, further comprising a light-shielding layer, the light-shielding layer introducing incident light to only the first surface-embedded region, wherein charges from the first surface-embedded region to the third surface-embedded region pass through a first flow-in path having a first cross-sectional area, charges from the first surface-embedded region to the second surface-embedded region pass through a second flow-in path having a second cross-sectional area, and the first cross-sectional area is made smaller than the second cross-sectional area such that quantity of charges stored in the second potential well is smaller than that in the first potential well.

9. The device according to claim 7, further comprising a light-shielding layer, the light-shielding layer preventing light from being incident on the third surface-embedded region, the light-shielding layer introducing incident light to the first and second surface-embedded regions, the light-shielding layer defining quantity of the incident light such that the quantity of charges stored in the second potential well is made smaller than that in the first potential well.

10. The device according to claim 7, further comprising a first charge flow-in control gate, the first charge flow-in control gate electrostatically controlling a potential at a shoulder of the charge-distributing-potential barrier to the second potential well through a gate-insulating layer, a voltage applied to the first charge flow-in control gate being controlled such that quantity of charges stored in the second potential well is smaller than that in the first potential well.

11. The device according to claim 10, further comprising a second charge flow-in control gate for electrostatically controlling a potential at a shoulder of the charge-distributing-potential barrier to the first potential well through the gate-insulating layer.

12. The device according to claim 7, wherein a potential at a shoulder of the charge-distributing-potential barrier to the second potential well is controlled such that charges flow into the second potential well multiple times in one frame period.

13. The device according to claim 7, further comprising:

a light-shielding layer introducing light to only the first surface-embedded region, and a first charge flow-in control gate for electrostatically controlling a potential at a shoulder of the charge-distributing-potential barrier to the second potential well through the gate-insulating layer;

wherein charges from the first surface-embedded region to the second surface-embedded region pass through a first flow-in path having a first cross-sectional area, charges from the first surface-embedded region to the third surface-embedded region pass through a second flow-in path having a second cross-sectional area, and the first cross-sectional area is made smaller than the second cross-sectional area such that quantity of charges stored in the second potential well is smaller than that in the first potential well.

14. The device according to claim 1, wherein the first potential well is provided by a potential distribution in the first surface-embedded region of the second conductivity type embedded in an upper part of the semiconductor region of the first conductivity type;

the second potential well is provided by a potential distribution in the second surface-embedded region of the second conductivity type, the second surface-embedded region is embedded in the upper part of the semiconductor region of the first conductivity type, and the second surface-embedded region is away from the first surface-embedded region;

the charge-distributing-potential barrier is provided by a potential distribution in the upper part of the semiconductor region of the first conductivity type between the first and second surface-embedded regions;

the device further comprises a light-shielding layer having an opening, the opening being provided such that a first quantity of light incident on the first surface-embedded region is larger than a second quantity of light on the second surface-embedded region; and a difference between the first and second quantities is adjusted such that quantity of charges stored in the second potential well is smaller than that in the first potential well.

15. The device according to claim 1,
wherein the first potential well is provided by a potential distribution in the first surface-embedded region of the second conductivity type embedded in an upper part of the semiconductor region of the first conductivity type;
the second potential well is defined by a potential distribution in the second surface-embedded region of the second conductivity type, and the second surface-embedded region is in contact with the upper part of the first surface-embedded region and is embedded in the upper part of the semiconductor region of the first conductivity type;
the charge-distributing-potential barrier is provided by a potential distribution in a connection region between the first and second surface-embedded regions in the upper part of the semiconductor region of the first conductivity type;
the device further comprises a light-shielding layer, the light-shielding layer introducing light to only the first surface-embedded region; and
charges overflow from the first surface-embedded region to the second surface-embedded region to flow into the second potential well and the overflowing charges are stored in the second potential well.

16. The device according to claim 1,
wherein the plural pixels are arranged in a two-dimensional matrix to form a pixel array;
the device further comprising a column processing circuit provided around the pixel array, the column processing circuit further including a single comparator, the single comparator being provided for each column of the matrix, and the comparator selectively reading charges stored in one of the first and second floating-diffusion region.

17. The device according to claim 1, wherein the plural pixels are arranged in a two-dimensional matrix, and the two-dimensional matrix includes upper and lower pixel rows adjacent to each other vertically, the first floating-diffusion regions of the upper and lower pixel rows are common electrically, and the second floating-diffusion regions of the upper and lower pixel rows are shared electrically.

18. The device according to claim 1, wherein the plural pixels are arranged in a two-dimensional matrix and the two-dimensional matrix includes left and right pixel columns adjacent to each other horizontally, the first floating-diffusion region of the right pixel column and the second floating-diffusion region of the left pixel column are shared electrically.

19. A method for reading a pixel signal from a solid-state image pick-up device, the solid-state image pick-up device including a column processing circuit around a pixel array provided by arranging pixels in a two-dimensional matrix, the column processing circuit being provided in each row of the pixel array, each pixel including a first potential well for storing charges generated by light; a charge-distributing-potential barrier adjacent to the first potential well; a second potential well opposite to the first potential well with respect to the charge-distributing-potential barrier, the second potential well storing charges generated by light of an intensity equal to that of light which generates the charges stored in the first potential well, the charges stored in the second potential well being less than the charges stored in the first potential well; first and second transfer gate electrodes for separately transferring the charges stored in the first and second potential wells at different timings, respectively; and first and second floating-diffusion regions for separately storing the charges transferred by the first and second transfer gate electrodes, respectively;
the method comprising the steps of:
separately performing sample/hold of charges in the first and second floating-diffusion regions using the column processing circuit; and
combining pixel signals with each other outside the column processing circuit, the pixel signals being generated from the sampled/held charges.

20. The method according to claim 19, wherein only the pixel signal generated by the charges stored in the second floating-diffusion region is read out multiple times in one frame period.

21. The method according to claim 19, wherein the pixel signal generated by the charges stored in the second floating-diffusion region is read out multiple times for different storing times in one frame period.

22. The method according to claim 19, wherein the pixel signals generated by the charges stored in the first and second floating-diffusion regions are read out at readout timings different from each other.

23. The method according to claim 19, wherein a potential of the charge-distributing-potential barrier to the second potential well is controlled such that charges flow into the second potential well multiple times in one frame period.

24. A method for reading out a pixel signal of a solid-state image pick-up device including a column processing circuit around a pixel array provided by arranging pixels in a two-dimensional matrix, the column processing circuit being provided in each row of the pixel array, each pixel including a first potential well for storing charges generated by light; a charge-distributing-potential barrier adjacent to the first potential well; a second potential well opposite to the first potential well with respect to the charge-distributing-potential barrier, the second potential well storing charges generated by light having an intensity equal to that of light generating the charges stored in the first potential well, the charges stored in the second potential well being less than the charges stored in the first potential well; first and second transfer gate electrodes for separately transferring the charges stored in the first and second potential wells at different timings, respectively; and first and second floating-diffusion regions for separately storing the charges transferred by the first and second transfer gate electrodes, respectively;
the method comprising the steps of:
selecting one of charges stored in the first and second floating-diffusion regions using the column processing circuit; and
after the selection, generating a pixel signal from the selected charges to output the pixel signal to an external device outside the column processing circuit.

* * * * *